(12) United States Patent
Lee et al.

(10) Patent No.: US 11,916,078 B2
(45) Date of Patent: Feb. 27, 2024

(54) SEMICONDUCTOR DEVICES

(71) Applicant: Samsung Electronics Co., Ltd., Suwon-si (KR)

(72) Inventors: Sohyeon Lee, Suwon-si (KR); Sungsu Moon, Hwaseong-si (KR); Jaeduk Lee, Seongnam-si (KR); Ikhyung Joo, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 17/854,128

(22) Filed: Jun. 30, 2022

(65) Prior Publication Data
US 2022/0336501 A1 Oct. 20, 2022

Related U.S. Application Data

(63) Continuation of application No. 17/154,583, filed on Jan. 21, 2021, now Pat. No. 11,380,711.

(30) Foreign Application Priority Data

Apr. 29, 2020 (KR) ........................ 10-2020-0052692

(51) Int. Cl.
*H01L 27/12* (2006.01)
*H01L 21/8234* (2006.01)
(Continued)

(52) U.S. Cl.
CPC .. *H01L 27/1207* (2013.01); *H01L 21/823431* (2013.01); *H01L 21/823437* (2013.01);
(Continued)

(58) Field of Classification Search
CPC ......... H01L 27/1207; H01L 21/823431; H01L 21/823437; H01L 21/823456;
(Continued)

(56) References Cited

U.S. PATENT DOCUMENTS 8,878,299 B2 11/2014 Lee et al.
9,437,696 B2 9/2016 Kim et al.
(Continued)

FOREIGN PATENT DOCUMENTS

KR 20090110170 A 10/2009
KR 20130127206 A 11/2013

OTHER PUBLICATIONS

Thanh Hoa Phung, , et al., "Low Temperature (375° C.) Metal Induced Lateral Crystallization (MILC) of Si1-xGex (0≤x≤1) using Silicide/Germanide Forming Metals (Ni, Pd and Co)", Extended Abstracts of the 2009 International Conference on Solid State Devices and Materials, Sendai, 2009.

*Primary Examiner* — Ahmed N Sefer
(74) *Attorney, Agent, or Firm* — Myers Bigel, P.A.

(57) ABSTRACT

A semiconductor device includes a substrate having an active region defined by a device isolation film and providing a first channel region; a first source/drain region in the active region on first and second sides of the first channel region; a gate structure having a first gate insulating film, a shared gate electrode, and a second gate insulating film, sequentially arranged on the active region; a cover semiconductor layer on the second gate insulating film and electrically separated from the active region to provide a second channel region; a second source/drain region in the cover semiconductor layer on first and second sides of the second channel region; first and second source/drain contacts respectively connected to the first and second source/drain regions; and a shared gate contact connected to the shared gate electrode.

20 Claims, 87 Drawing Sheets

(51) Int. Cl.
*H01L 21/84* (2006.01)
*H01L 27/088* (2006.01)
*H01L 29/08* (2006.01)
*H01L 29/417* (2006.01)
*H01L 29/423* (2006.01)
*H01L 29/78* (2006.01)
*H01L 29/786* (2006.01)

(52) U.S. Cl.
CPC ........... *H01L 21/823456* (2013.01); *H01L 21/823487* (2013.01); *H01L 21/84* (2013.01); *H01L 27/0886* (2013.01); *H01L 29/0843* (2013.01); *H01L 29/41733* (2013.01); *H01L 29/41791* (2013.01); *H01L 29/4236* (2013.01); *H01L 29/42392* (2013.01); *H01L 29/7831* (2013.01); *H01L 29/785* (2013.01); *H01L 29/78642* (2013.01); *H01L 29/78696* (2013.01)

(58) Field of Classification Search
CPC ........... H01L 21/823487; H01L 21/84; H01L 27/0886; H01L 29/0843; H01L 29/41733; H01L 29/41791; H01L 29/4236; H01L 29/42392; H01L 29/7831; H01L 29/785; H01L 29/78642; H01L 29/78696; H01L 27/0203; H01L 29/0603; H01L 29/0684
See application file for complete search history.

(56) References Cited

U.S. PATENT DOCUMENTS

| | | | |
|---|---|---|---|
| 9,478,551 | B2 | 10/2016 | Kim et al. |
| 9,997,413 | B1 | 6/2018 | Leobandung |
| 10,276,673 | B2 | 4/2019 | Park et al. |
| 10,439,057 | B2 | 10/2019 | Jun et al. |
| 10,461,189 | B2 | 10/2019 | Sung et al. |
| 2009/0261420 | A1 | 10/2009 | Ryu et al. |
| 2016/0155857 | A1 | 6/2016 | Masuoka et al. |
| 2016/0163694 | A1* | 6/2016 | Baek ............... H01L 27/0922 257/300 |
| 2017/0212545 | A1* | 7/2017 | Lin ............... H01L 27/0886 |
| 2018/0166443 | A1 | 6/2018 | Kim et al. |
| 2018/0331220 | A1* | 11/2018 | Sung ............... H01L 21/823878 |
| 2019/0348527 | A1 | 11/2019 | Liaw |
| 2020/0058739 | A1* | 2/2020 | Liaw ............... H01L 21/823828 |
| 2020/0118886 | A1* | 4/2020 | Miao ............... H01L 21/823821 |
| 2020/0273755 | A1 | 8/2020 | Wu et al. |
| 2020/0343241 | A1 | 10/2020 | Wu et al. |
| 2021/0367036 | A1 | 11/2021 | Kim et al. |

* cited by examiner

US 11,916,078 B2

SEMICONDUCTOR DEVICES

CROSS-REFERENCE TO RELATED APPLICATIONS

This patent application is a continuation of U.S. patent application Ser. No. 17/154,583 filed Jan. 21, 2021, which claims the benefit under 35 USC § 119(a) of Korean Patent Application No. 10-2020-0052692 filed on Apr. 29, 2020, in the Korean Intellectual Property Office, and the disclosure of each above-identified application is incorporated by reference herein in its entirety.

BACKGROUND

The present disclosure relates to semiconductor devices.

Semiconductor devices have been recognized as important devices in the electronics industry due to various characteristics thereof, such as increasing miniaturization, multifunctionality, and/or low manufacturing costs. Semiconductor devices may be divided into various groups, such as semiconductor memory devices for storing logic data, semiconductor logic devices for operating and processing logic data, and hybrid semiconductor devices including memory elements and logic elements. Some semiconductor devices may be configured to include a transistor. As the electronics industry continues to develop, not only does demand for various characteristics of semiconductor devices (increased reliability, increased speed and/or multifunctionality) continue to increase, but so does demand for increased integration.

SUMMARY

Aspects of the present disclosure may provide semiconductor devices having improved integration.

According to some aspects of the present inventive concepts, a semiconductor device includes a substrate having an active region defined by a device isolation film and providing a first channel region; a first source/drain region in the active region on first and second sides of the first channel region; a gate structure having a first gate insulating film, a shared gate electrode, and a second gate insulating film sequentially arranged on the active region; a cover semiconductor layer on the second gate insulating film and electrically separated from the active region to provide a second channel region; a second source/drain region in the cover semiconductor layer on first and second sides of the second channel region; first and second source/drain contacts respectively connected to the first and second source/drain regions; and a shared gate contact connected to the shared gate electrode.

According to some aspects of the present inventive concepts, a semiconductor device includes a first semiconductor layer having a first channel region; a first source/drain region in the first semiconductor layer on first and second sides of the first channel region; a gate structure including a first gate insulating film, a shared gate electrode, and a second gate insulating film sequentially arranged on the first channel region; a second semiconductor layer on the second gate insulating film and electrically separated from the first semiconductor layer to provide a second channel region; and a second source/drain region in the second semiconductor layer on first and second sides of the second channel region.

According to some aspects of the present inventive concepts, a semiconductor device includes a substrate having an active fin extending in a first direction and providing a first channel region; a gate structure having a first gate insulating film and a shared gate electrode that is perpendicular with the active fin to extend in a second direction, and sequentially on a portion of the active fin; a first source/drain region in the active fins on first and second sides of the gate structure; a second gate insulating film having a region that overlaps the gate structure and is on the shared gate electrode; a cover semiconductor layer on the second gate insulating film and providing a second channel region; and a second source/drain region in the cover semiconductor layer on first and second sides of the second channel region.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, various embodiments of the present inventive concepts will be described with reference to the accompanying drawings.

Figure 1:
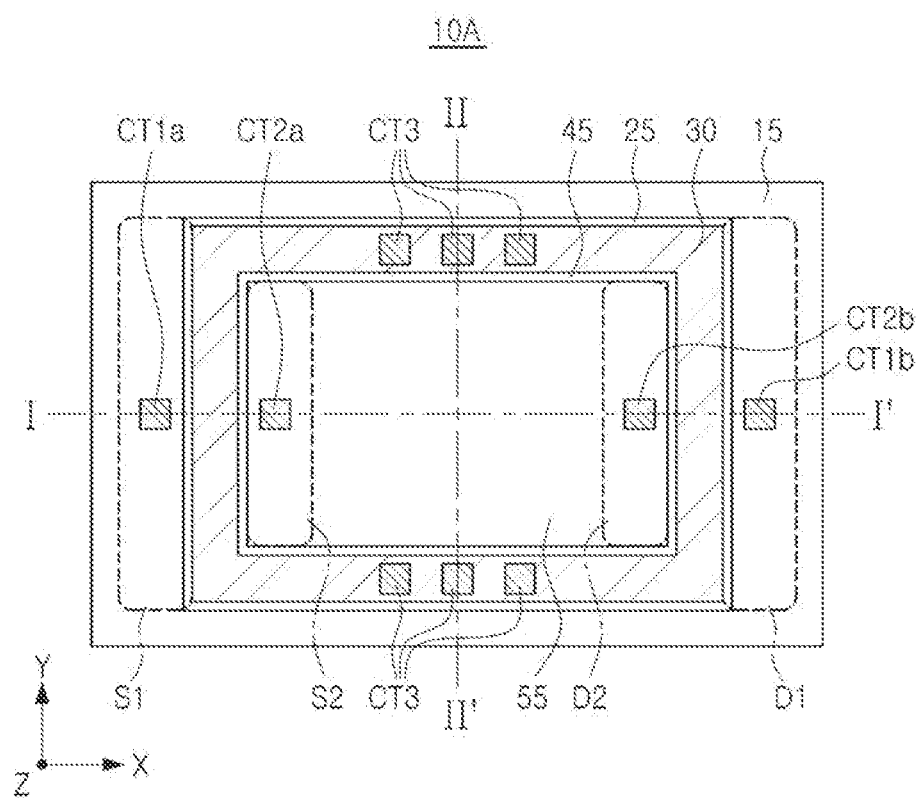
FIG. 1 is a plan view illustrating a semiconductor device according to some embodiments of the present inventive concepts.
Figure 2A:
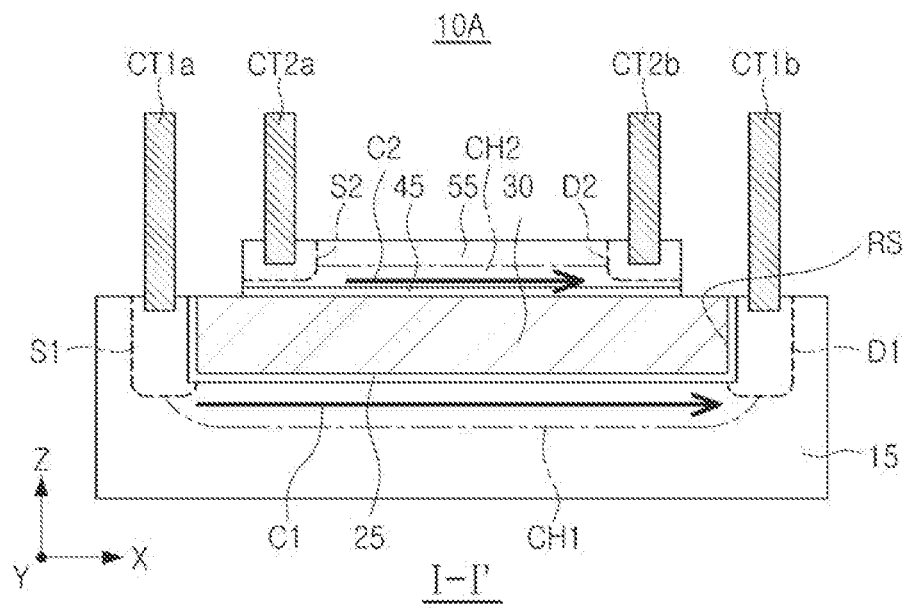
FIGS. 2A and 2B are cross-sectional side views of the semiconductor device of FIG. 1, taken along lines I-I' and II-II' respectively.
Figure 2B:
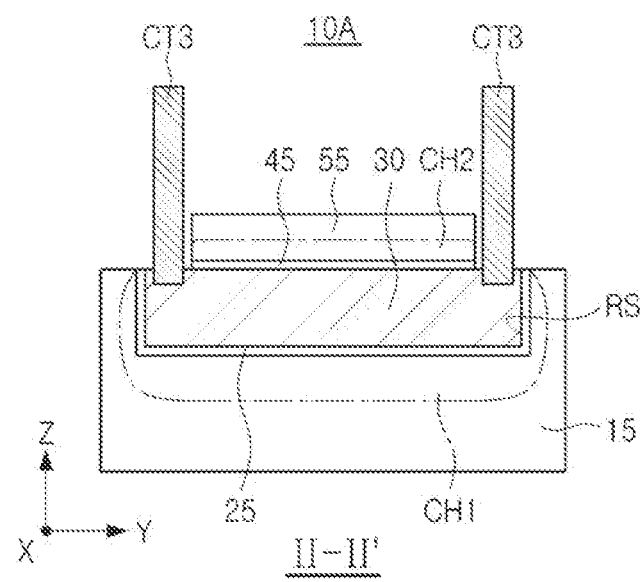

FIG. 1 is a plan view illustrating a semiconductor device according to some embodiments of the present inventive concepts, and FIGS. 2A and 2B are cross-sectional side views of the semiconductor device of FIG. 1, taken along lines I'-I' and II'-II' respectively.

Referring to FIGS. 1, 2A, and 2B, a semiconductor device 10A according to some embodiments may include a first semiconductor layer 15, a first source/drain region (S1 and D1) on first and second sides of an upper surface of the first semiconductor layer 15, a first gate insulating film 25 on the first semiconductor layer 15, a shared gate electrode 30 on the first gate insulating film 25, a second gate insulating film 45 on the shared gate electrode 30, a second semiconductor layer 55 on the second gate insulating film 45 and electrically separated from the first semiconductor layer 15, and a second source/drain region (S2 and D2) disposed on first and second sides of the upper surface of the second semiconductor layer 55.

The first and second semiconductor layers 15 and 55 may be arranged below and on the shared gate electrode 30, respectively, and when a voltage is applied to the shared gate electrode 30, a first channel region CH1 may be formed in the first semiconductor layer 15 and a second channel region CH2 may be formed in the second semiconductor layer 55. The first and second channel regions CH1 and CH2 may be formed in the respective semiconductor layers 15 and 55 in regions adjacent to the shared gate electrode 30. The first channel region CH1 may be provided as an electrical channel of or between the first source/drain region (S1 and D1), and the second channel region CH2 may be provided as an electrical channel of or between the second source/drain region (S2 and D2). The shared gate electrode 30 may be arranged between the first and second semiconductor layers 15 and 55 such that at least a portion of the second channel region CH2 overlaps the first channel region CH1 in a direction (e.g., a Z direction) that is perpendicular to the upper surface of the first semiconductor layer 15.

In some embodiments, the upper surface of the first semiconductor layer 15 may have a recess RS, and the first gate insulating film 25 and the shared gate electrode 30 may be provided in the recess RS. The upper surface of the first semiconductor layer 15 may be substantially coplanar with an upper surface of the shared gate electrode 30. Since the second semiconductor layer 55 may be arranged on the shared gate electrode 30 with the second gate insulating film 45 interposed therebetween, the second channel region CH2 may be located on a higher level than the upper surface of the first semiconductor layer 15. For example, the second channel region CH2 may be located farther from a bottom surface of the first semiconductor layer 15 than the upper surface of the first semiconductor layer 15.

The semiconductor device 10A according to some embodiments may further include first source/drain contacts CT1a and CT1b respectively connected to the first source/drain region (S1 and D1), second source/drain contacts CT2a and CT2b respectively connected to the second source/drain region (S2 and D2), and a shared gate contact CT3 connected to the shared gate electrode 30. The first and second source/drain contacts CT1a, CT1b, CT2a, and CT2b, and the shared gate contact CT3 may be formed vertically and/or in a vertical direction (e.g., the Z direction). Although not illustrated in FIGS. 2A and 2B, the semiconductor device 10A may further include an insulating layer (e.g., 160 of FIGS. 10A and 10B) covering at least some surfaces thereof. For example, the insulating layer may cover upper surfaces and/or side surfaces of the first semiconductor layer 15, the first source/drain region (S1 and D1), the first gate insulating film 25, the shared gate electrode 30, the second gate insulating film 45, and the second semiconductor layer 55. The insulating layer may cover at least portions of side surfaces of the first and second source/drain contacts CT1a, CT1b, CT2a, and CT2b, and the shared gate contact CT3.

In some embodiments, an arrangement direction of the first source/drain region (S1 and D1) and an arrangement direction of the second source/drain region (S2 and D2) may be substantially the same direction (e.g., an X direction). For example, current flow C1 in the first channel region CH1 and current flow C2 in the second channel region CH2 may be formed in substantially the same direction (e.g., the X direction). The first and second sides of the first channel region CH1, at which the first source/drain region (S1 and D1) may be located, may be opposite sides of the first channel region from each other in a first direction. The first and second sides of the second channel region CH2, at which the second source/drain region (S2 and D2) may be located, which are on opposite sides of the second channel region from each other in the first direction.

When viewed in a plan view (referring to FIG. 1), the shared gate electrode 30 may include an exposed region between the first semiconductor layer 15 and the second semiconductor layer 55, and the shared gate contact CT3 may be connected to the exposed region of the shared gate electrode 30. In some embodiments, the exposed region of the shared gate electrode 30 may be an area of the gate electrode 30 that is not overlapped by the second semiconductor layer 55.

At least one of the first and second source/drain contacts CT1a, CT1b, CT2a, and CT2b and the shared gate contact CT3 may include a plurality of contacts. In some embodiments, and as seen in FIG. 1, six (6) shared gate contacts CT3 may be arranged in the exposed region of the shared gate electrode 30, with three (3) on a first side and three (3) on a second side of the second semiconductor layer 55. The arrangement of FIG. 1 is only one example, and the present disclosure is not limited thereto.

As described above, since the second semiconductor layer 55 may be electrically separated from the first semiconductor layer 15, the first and second semiconductor layers 15 and 55, together with the shared gate electrode 30, may be operated as separate transistors.

In some embodiments, the first semiconductor layer 15 and the second semiconductor layer 55 may have regions doped with the same conductivity-type impurity. For example, when n-type impurities are doped in the first semiconductor layer 15 and the second semiconductor layer 55, the first channel region CH1 and the second channel region CH2 may be provided as an n-type channel. In some embodiments, the first semiconductor layer 15 and the second semiconductor layer 55 may have regions doped with other or different conductivity-type impurities. For example, when the first semiconductor layer 15 and the second semiconductor layer 55 are doped with p-type and n-type impurities, respectively, the first channel region CH1 and the second channel region CH2 may be provided as a p-type channel and an n-type channel, respectively.

Areas of the first and second channel regions CH1 and CH2 may be respectively defined by regions in which the first semiconductor layer 15 and the second semiconductor layer 55 overlap the shared gate electrode 30. For example, the area of the first channel region CH1 and the area of the second channel region CH2 may be controlled by adjusting a size of the first semiconductor layer 15 and a size of the second semiconductor layer 55, respectively (see FIGS. 42 to 49B).

Threshold voltages of the transistors located in the upper and lower portions may be determined by thicknesses and/or material types of the first and second gate insulating films 25 and 45. In some embodiments, the first gate insulating film 25 and the second gate insulating film 45 may have different thicknesses. In addition, the first gate insulating film 25 may include a dielectric film different from the second gate insulating film 45.

Figure 3A:
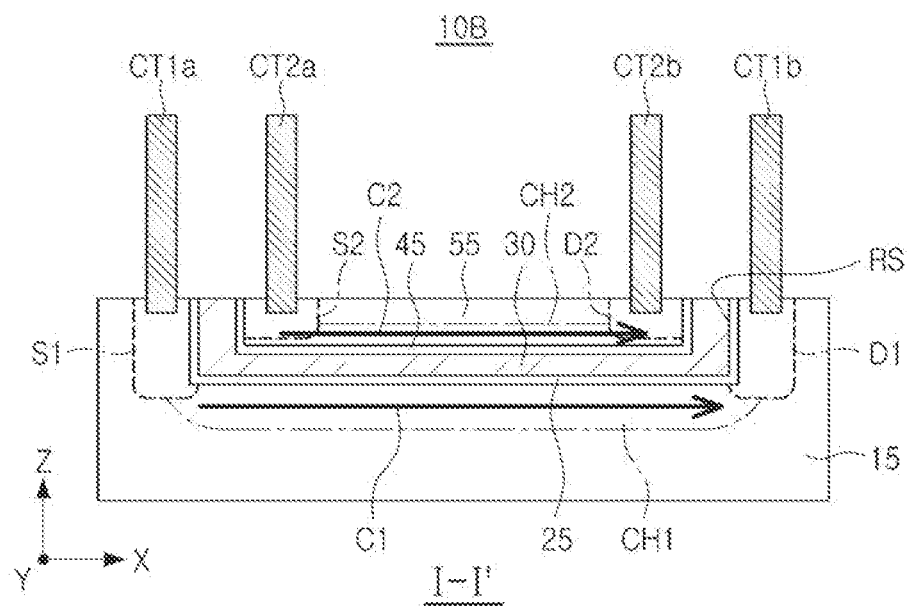
FIGS. 3A and 3B are cross-sectional side views respectively illustrating a semiconductor device according to some embodiments of the present inventive concepts.
Figure 3B:
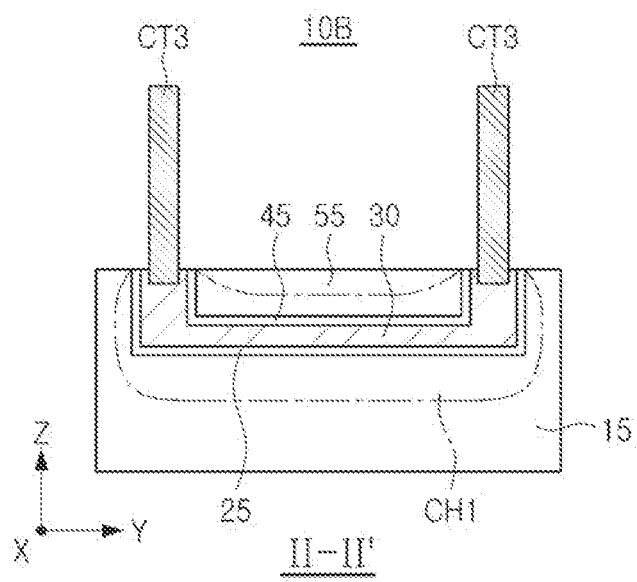

FIGS. 3A and 3B are cross-sectional side views respectively illustrating a semiconductor device according to some embodiments of the present inventive concepts.

Referring to FIGS. 3A and 3B, a semiconductor device 10B according to some embodiments can be understood as being similar to the semiconductor device 10A illustrated in FIGS. 1, 2A, and 2B, except that the second semiconductor layer 55 and the second gate insulating film 45 may be also arranged in the recess RS in addition to the first gate insulating film 25 and the shared gate electrode 30. Components described with reference to the semiconductor device 10B illustrated in FIGS. 3A and 3B can be understood as referring to the same or similar components as those which are similarly numbered and which have been previously described with reference to-the semiconductor device 10A illustrated in FIGS. 1, 2A, and 2B, unless otherwise specified.

A second semiconductor layer 55 and a second gate insulating film 45, employed in some embodiments, may be arranged in the recess RS to be embedded in a shared gate electrode 30. The second gate insulating film 45 may be between the shared gate electrode 30 and a lower surface and a side surface of the second semiconductor layer 55. As illustrated in FIGS. 3A and 3B, an upper surface of a first semiconductor layer 15 may be substantially coplanar with an upper surface of the second semiconductor layer 55. Since the second semiconductor layer 55 may be embedded in the shared gate electrode 30, a second channel region CH2 may be located on a lower level than the upper surface of the first semiconductor layer 15. For example, the second channel region CH2 may be located closer from a bottom surface of the first semiconductor layer 15 than the upper surface of the first semiconductor layer 15.

Figure 4:
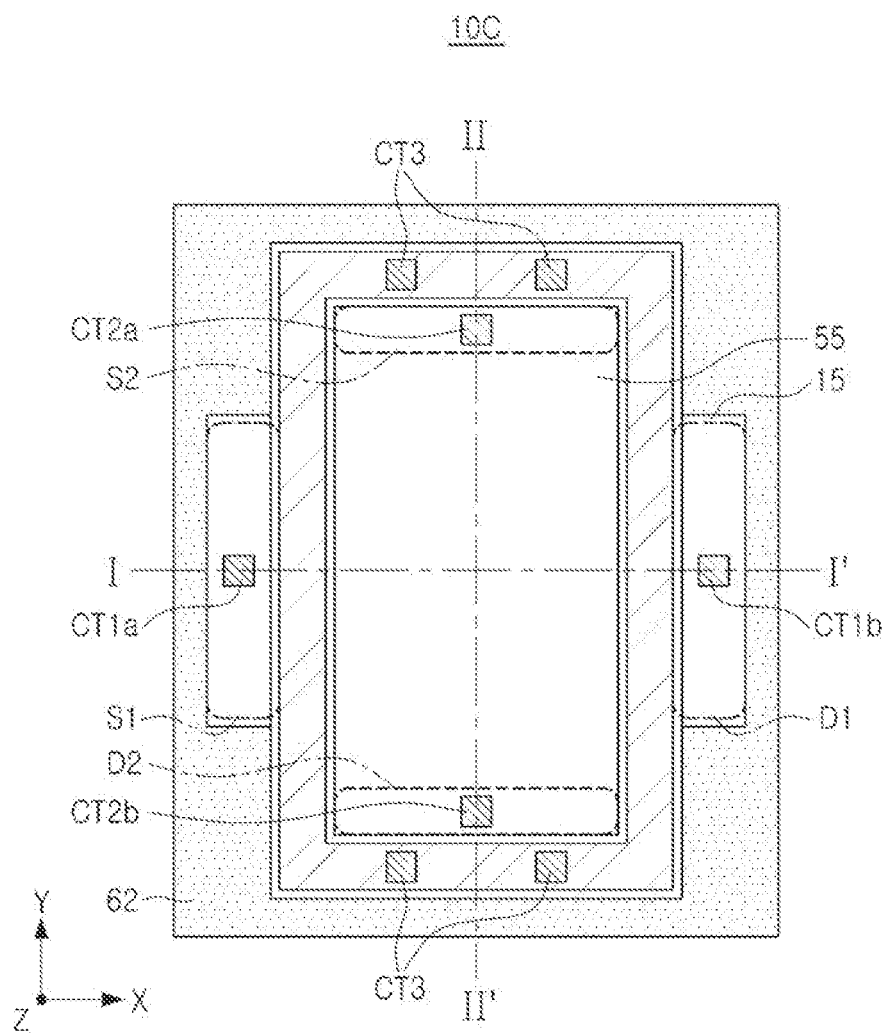
FIG. 4 is a plan view illustrating a semiconductor device according to some embodiments of the present inventive concepts.
Figure 5A:
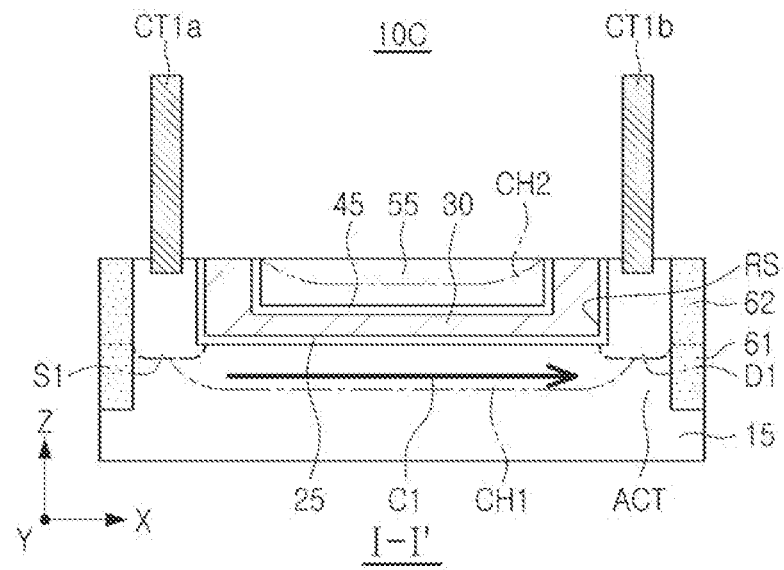
FIGS. 5A and 5B are cross-sectional side views of the semiconductor device of FIG. 4, taken along lines I-I' and II-II' respectively.
Figure 5B:
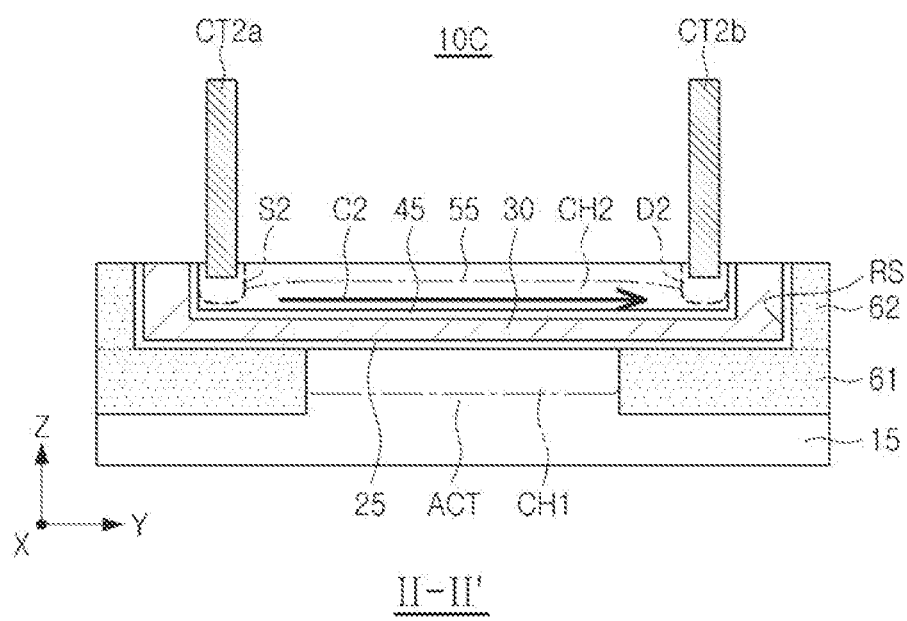

FIG. 4 is a plan view illustrating a semiconductor device according to some embodiments of the present inventive concepts, and FIGS. 5A and 5B are cross-sectional side views of the semiconductor device of FIG. 4, taken along lines I'-I' and II'-II' respectively.

Referring to FIGS. 4, 5A and 5B, a semiconductor device 10C according to some embodiments can be understood as being similar to the semiconductor devices 10A and 10B illustrated in FIGS. 1, 2A, 2B, 3A and 3B, except that the semiconductor device 10C is configured such that current paths C1 and C2 in first and second channel regions CH1 and CH2 are perpendicular or are almost perpendicular to one another, and an active region ACT may be defined by a device isolation film 61. Components described with reference to the semiconductor device 10C illustrated in FIGS. 4, 5A and 5B can be understood as referring to the same or similar components as those which are similarly numbered and which have been previously described, unless otherwise specified.

In the semiconductor device 10C according to some embodiments, current paths C1 and C2 in first and second channel regions CH1 and CH2 may be in a perpendicular or an almost perpendicular relationship, and may appear to intersect one another when viewed in a plan view (an X-Y plane). As illustrated in FIG. 4, an arrangement direction (e.g., the Y direction) of a second source/drain region (S2 and D2) and an arrangement direction (e.g., the X direction) of a first source/drain region (S1 and D1) may be in a perpendicular or an almost perpendicular relationship. The first and second sides of the first channel region CH1, at which the first source/drain region (S1 and D1) may be located, may be opposite sides of the first channel region from each other in a first direction. The first and second sides of the second channel region CH2, at which the second source/drain region (S2 and D2) may be located, which are on opposite sides of the second channel region from each other in the second direction that is perpendicular or almost perpendicular to the first direction.

The first semiconductor layer 15 of the semiconductor device 10C may have an active region ACT that is defined by a device isolation film 61. The device isolation film 61 may be formed by, for example, a shallow trench isolation (STI) process. The device isolation film 61 may be made of an insulating material. For example, the device isolation film 61 may include an oxide, a nitride, or a combination thereof.

Some regions (particularly, central regions) of the first gate insulating film 25 and the shared gate electrode 30 may be arranged in a recess RS formed in the active region ACT. An insulating film 62 may be on the device isolation film 61, and may be formed to surround the first gate insulating film 25 and peripheral portions of the shared gate electrode 30 and the active region ACT. Similar to the embodiment illustrated in FIGS. 3A and 3B, a second gate insulating film 45 and a second semiconductor layer 55 may be embedded or arranged in a recess in the shared gate electrode 30, and an upper surface of the second semiconductor layer 55 may be substantially coplanar with an upper surface of the shared gate electrode 30 and an upper surface of the first semiconductor layer 15.

The semiconductor devices 10A, 10B, and 10C as described herein may be implemented in various embodiments, and may be specifically implemented as the semiconductor devices illustrated in FIGS. 42A to 48B, which are described in greater detail herein.

FIGS. 6A to 6G are cross-sectional views of main processes of a method of manufacturing a semiconductor device according to some embodiments of the present inventive concepts. The illustrated manufacturing processes of FIGS. 6A to 6G can be understood as corresponding to processes within a method of manufacturing the semiconductor device illustrated in FIG. 2A.

Figure 6A:
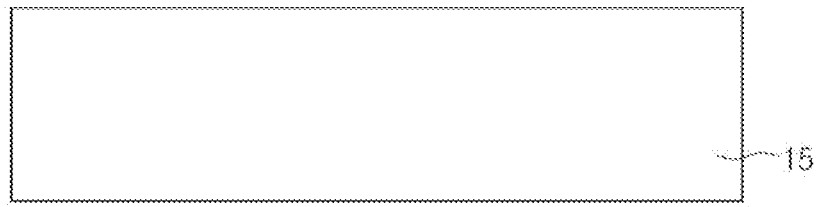
FIGS. 6A to 6G are cross-sectional views of main processes of a method of manufacturing a semiconductor device according to some embodiments of the present inventive concepts.

Referring to FIG. 6A, a first semiconductor layer 15 may be prepared to provide a first channel region for a lower transistor.

For example, the first semiconductor layer 15 may include silicon, germanium, or silicon-germanium. The first semiconductor layer 15 may be provided as a bulk wafer, an epitaxial layer, or a silicon-on-insulator (SOI) layer. The first semiconductor layer 15 may have a p-type impurity region or an n-type impurity region for the first channel region.

Figure 6B:
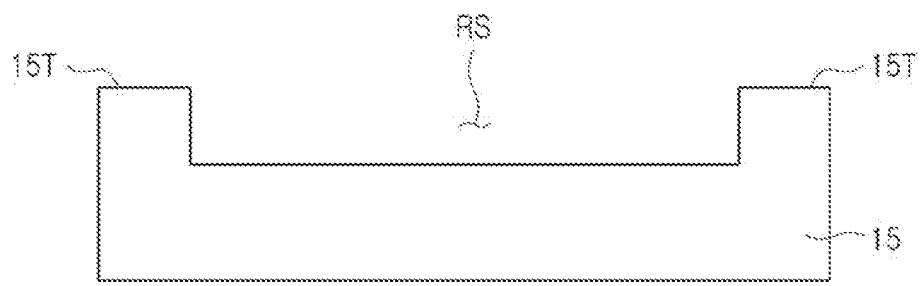
Figure 6C:
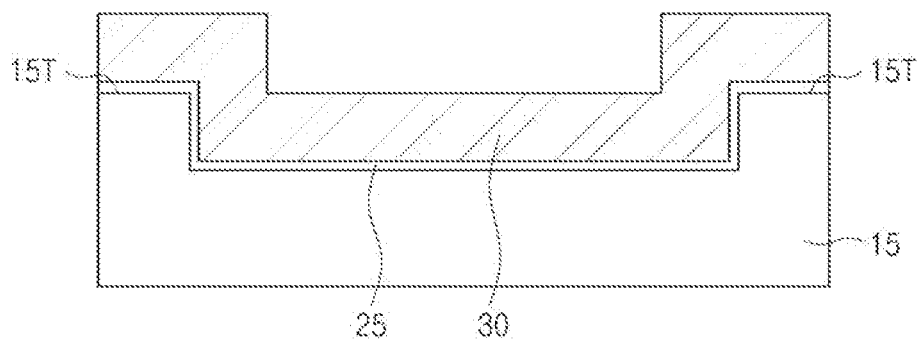

Referring to FIG. 6B, a recess RS may be formed in the first semiconductor layer 15. Referring to FIG. 6C, a first gate insulating film 25 and a shared gate electrode 30 may be formed on the first semiconductor layer 15 in which the recess RS is formed.

The recess RS may be formed by an etching process, and the recess RS may provide a space for embedding or arranging the first gate insulating film 25 and the shared gate electrode 30 therein. The first gate insulating film 25 may include a silicon oxide film or a silicon oxynitride film, or a high dielectric film having a higher dielectric constant than silicon oxide. The high dielectric film may refer to a dielectric material having a higher dielectric constant than that of the silicon oxide ($SiO_2$) film. For example, the material having a higher dielectric constant may be any one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), or praseodymium oxide ($Pr_2O_3$). The shared gate electrode 30 may include a conductive material, and may include, for example, a metal nitride such as titanium nitride (TiN), tantalum nitride (TaN), or tungsten nitride (WN), and/or a metal material such as aluminum (Al), tungsten (W), or molybdenum (Mo), or a semiconductor material such as doped polysilicon. In some embodiments, the shared gate electrode 30 may be composed of two or more multi-layer structures, and, in a case of a multilayer structure, may have a stacked structure, symmetrical in the vertical direction.

Figure 6D:
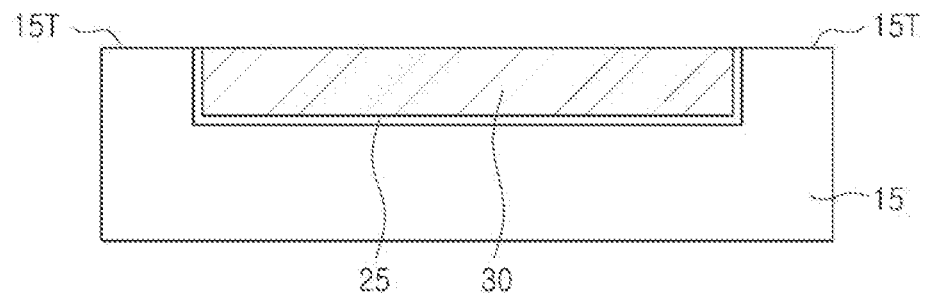
Figure 6E:
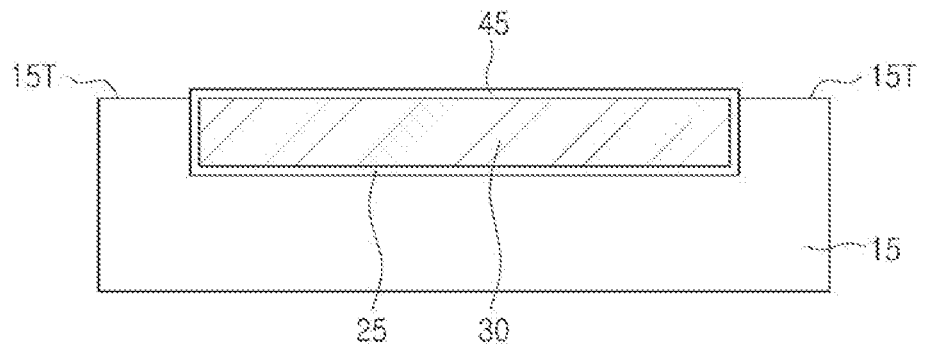

Referring to FIG. 6D, portions of the first gate insulating film 25 and the shared gate electrode 30 that are located in an upper region 15T of the first semiconductor layer 15 around the recess RS may be removed, and, as illustrated in FIG. 6E, a second gate insulating film 45 may be then formed on the shared gate electrode 30.

The removal of the portions of the first gate insulating film 25 and the shared gate electrode 30 may be performed by a chemical mechanical polishing (CMP) process using a material (e.g., Si) of the first semiconductor layer 15 as an etch stop layer. The second gate insulating film 45 may be formed of a material that is the same as or is similar to that of the first gate insulating film 25. In some embodiments, the second gate insulating film 45 may be formed of a different thickness or a different dielectric material from the first gate insulating film 25, in consideration of a threshold voltage for forming a second channel region.

Figure 6F:
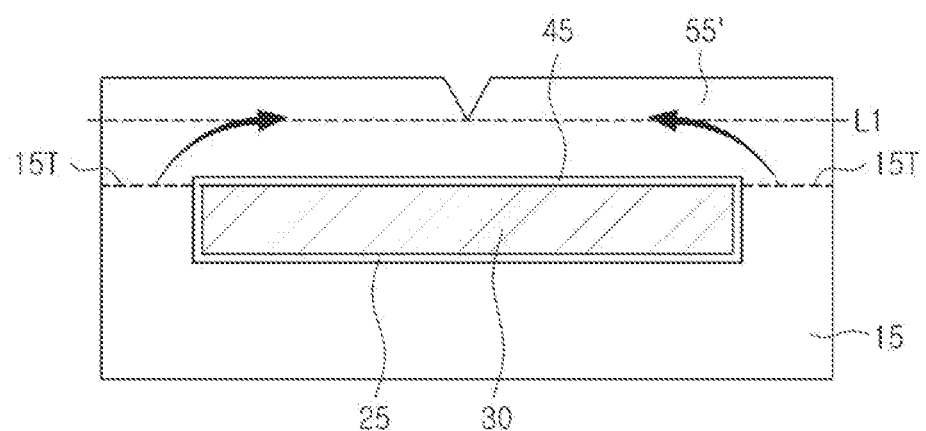
Figure 6G:
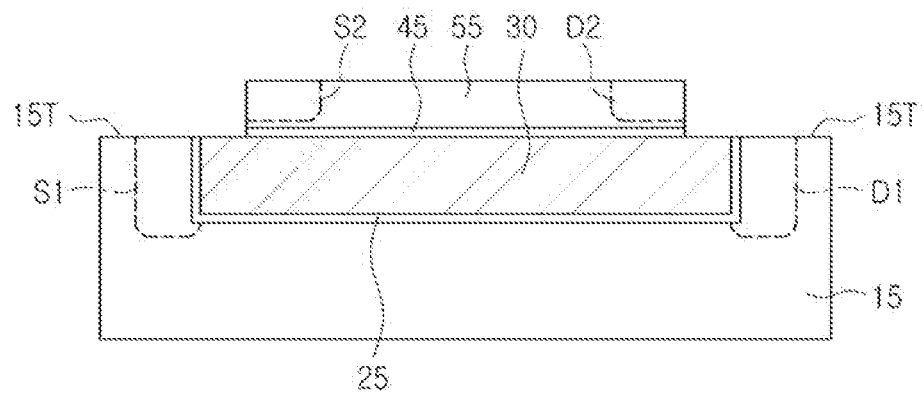

Next, referring to FIG. 6F, a second semiconductor layer 55' may be formed on the second gate insulating film 45, and then, referring to FIG. 6G, the second semiconductor layer 55' may be patterned to form a second semiconductor layer 55, electrically separated from the first semiconductor layer 15.

Growth of the second semiconductor layer 55' may be performed by an epitaxial lateral overgrowth (ELO) process. In this process, the second semiconductor layer 55' may be grown from the upper region 15T of the first semiconductor layer 15. The second semiconductor layer 55' may be polished to a constant height L1, and may be selectively etched to have a pattern separated from the first semiconductor layer 15, as illustrated in FIG. 6G. Thus, the second semiconductor layer 55 may provide a second channel region, distinct from the first channel region of the first semiconductor layer 15, and may act as an additional upper transistor.

Additionally, first and second source/drain regions (S1 and D1, and S2 and D2) may be formed on the first semiconductor layer 15 and the second semiconductor layer 55. A process of forming the first source/drain region (S1 and D1) may be performed during or subsequent to various different processes in the manufacturing of the semiconductor device. For example, the formation of the first source/drain region (S1 and D1) may be performed after the process of FIG. 6D or the process of FIG. 6E.

FIGS. 7A to 7F are cross-sectional views of main processes of a method of manufacturing a semiconductor device according to some embodiments of the present inventive concepts. The illustrated manufacturing processes of FIGS. 7A to 7F can be understood as corresponding to processes within a method of manufacturing the semiconductor device illustrated in FIG. 3A.

Figure 7A:
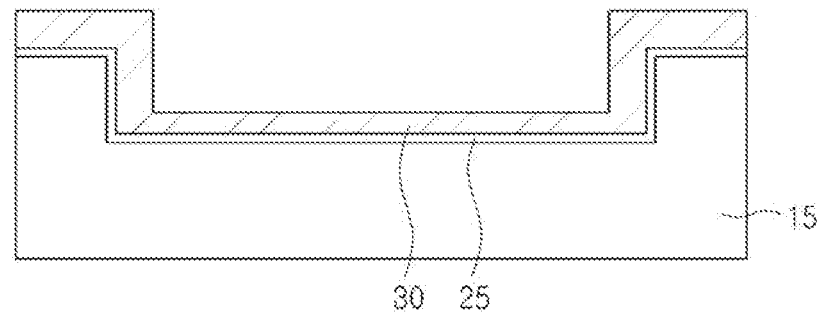
FIGS. 7A to 7F are cross-sectional views of main processes of a method of manufacturing a semiconductor device according to some embodiments of the present inventive concepts.
Figure 7B:
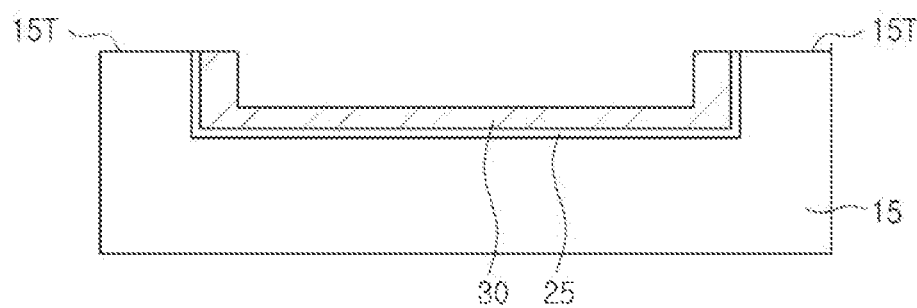

First, referring to FIG. 7A, a first gate insulating film 25 and a shared gate electrode 30 may be formed on a first semiconductor layer 15 on which a recess RS is formed, and then, as illustrated in FIG. 7B, portions of the first gate insulating film 25 and the shared gate electrode 30, located in an upper region 15T of the first semiconductor layer 15 around the recess RS, may be removed.

The first gate insulating film 25 and the shared gate electrode 30 formed in this process located in the recess RS, and more specifically the thicknesses of the first gate insulating film 25 and the shared gate electrode 30, may be formed to be less than a depth of the recess RS, unlike the processes described with reference to FIGS. 6A to 6G. A difference between a sum of the thicknesses of the first gate insulating film 25 and the shared gate electrode 30, and the depth of the recess RS may in part determine a thickness of a second semiconductor layer 55 (as seen in FIG. 7F) to be formed in a subsequent process (e.g., presence of a deviation having a thickness of a second gate insulating film 45). The removal of the portions of the first gate insulating film 25 and the shared gate electrode 30 may be performed by a CMP process using a material (e.g., Si) of the first semiconductor layer 15 as an etch stop layer, similarly to the processes described with reference to FIGS. 6A to 6G.

Figure 7C:
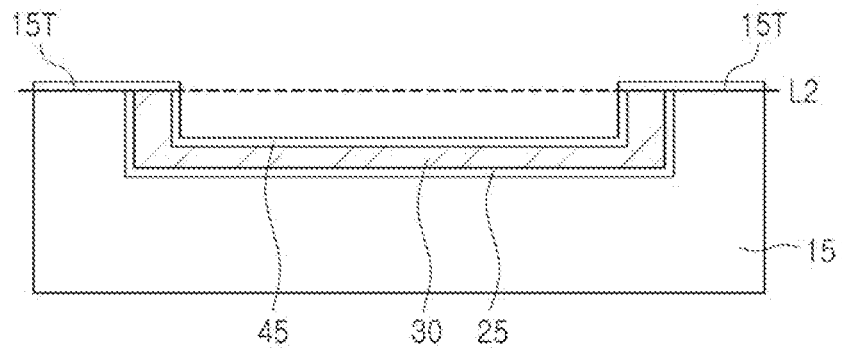
Figure 7D:
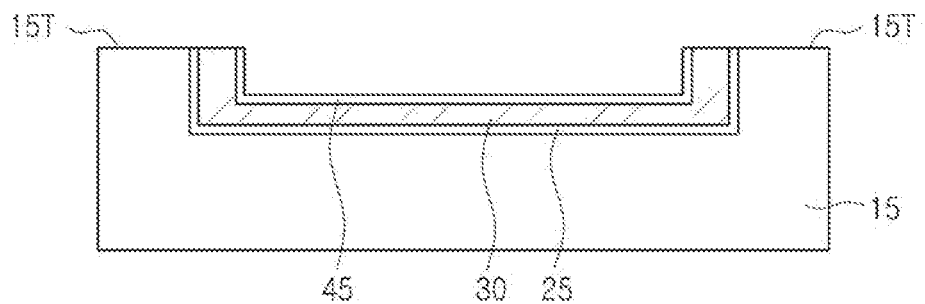

Next, referring to FIG. 7C, a second gate insulating film 45 may be formed on the shared gate electrode 30, and then, as illustrated in FIG. 7D, a portion of the second gate insulating film 45 (e.g., a portion located on a line L2) located in the upper region 15T of the first semiconductor layer 15 around the recess RS may be removed.

Figure 7E:
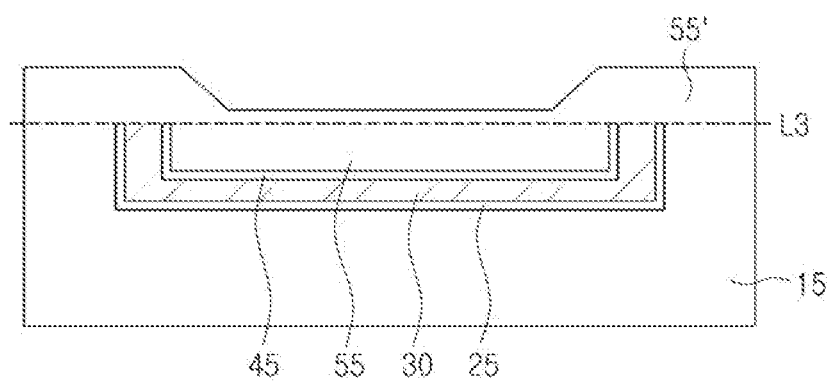
Figure 7F:
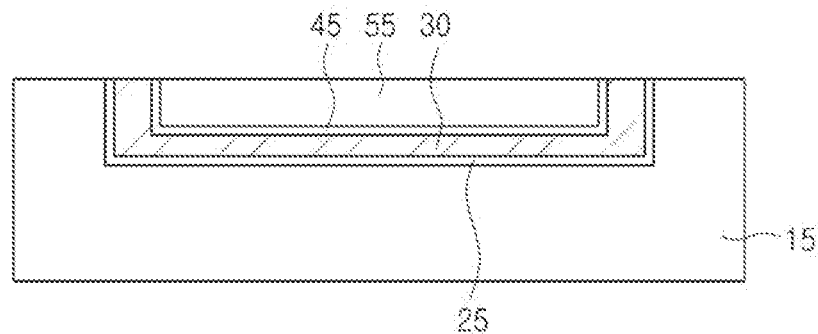

Next, referring to FIG. 7E, a second semiconductor layer 55' may be formed on the second gate insulating film 45, and then, as illustrated in FIG. 7F, the second semiconductor layer 55' may be etched to be separated from the first semiconductor layer 15 to form a second semiconductor layer 55.

Growth of the second semiconductor layer 55' may be performed by an ELO process. In this process, the second semiconductor layer 55' may be grown from the upper region 15T of the first semiconductor layer 15. The second semiconductor layer 55' may be polished to a constant height L3 to remain as the second semiconductor layer 55 in the recess RS. The second semiconductor layer 55 may have a pattern separated from the first semiconductor layer 15b as illustrated in FIG. 7F. Additionally, first and second source/drain regions (S1 and D1, and S2 and D2) may be formed on the first semiconductor layer 15 and the second semiconductor layer 55.

In the processes of a manufacturing method described with reference to FIGS. 7A to 7F, forming a second semiconductor layer using an ELO process has been illustrated, but the second semiconductor layer may be formed using another process. For example, forming the second semiconductor layer may be performed using an MILC process (see FIGS. 8A to 8E).

FIGS. 8A to 8E are cross-sectional views of main processes of a method of manufacturing a semiconductor device according to some embodiments of the present inventive concepts. The illustrated manufacturing processes of FIGS. 8A to 8E can be understood as corresponding to processes within a method of manufacturing the semiconductor device illustrated in FIG. 3A.

Figure 8A:
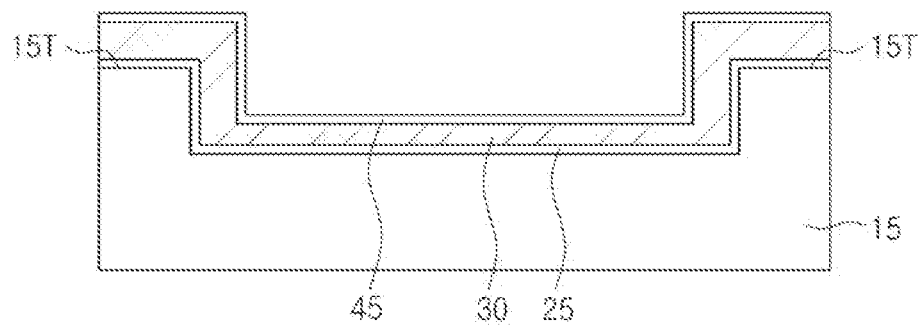
FIGS. 8A to 8E are cross-sectional views of main processes of a method of manufacturing a semiconductor device according to some embodiments of the present inventive concepts.

First, referring to FIG. 8A, a shared gate structure having a first gate insulating film 25, a shared gate electrode 30, and a second gate insulating film 45 may be formed sequentially on a first semiconductor layer 15 in which a recess RS is formed.

A thickness of the shared gate structure (25, 30, and 45) located in the recess RS, may be less than a depth (e.g., a vertical depth) of the recess RS, and a difference therefrom may determine a thickness of the second semiconductor layer 55 to be formed in a subsequent process. Removal of a portion of the first gate insulating film 25 and a portion of the shared gate electrode 30 may be performed by a CMP process using a material (e.g., Si) of the first semiconductor layer 15 as an etch stop layer, similarly to the processes described with reference to FIGS. 7A to 7F.

Figure 8B:
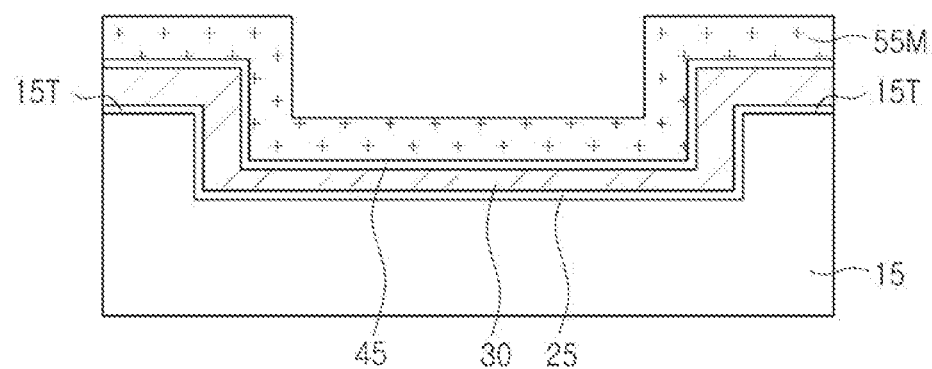

Subsequently, as illustrated in FIG. 8B, an amorphous semiconductor layer 55M may be formed on the second gate insulating film 45.

The amorphous semiconductor layer 55M may also be formed on a second gate insulating film 45, which may be a non-crystalline layer. For example, the amorphous semiconductor layer 55M may include amorphous silicon, amorphous germanium, or amorphous silicon-germanium. The amorphous semiconductor layer may be determined to be a single crystal layer forming a channel region using an MILC process.

Figure 8C:
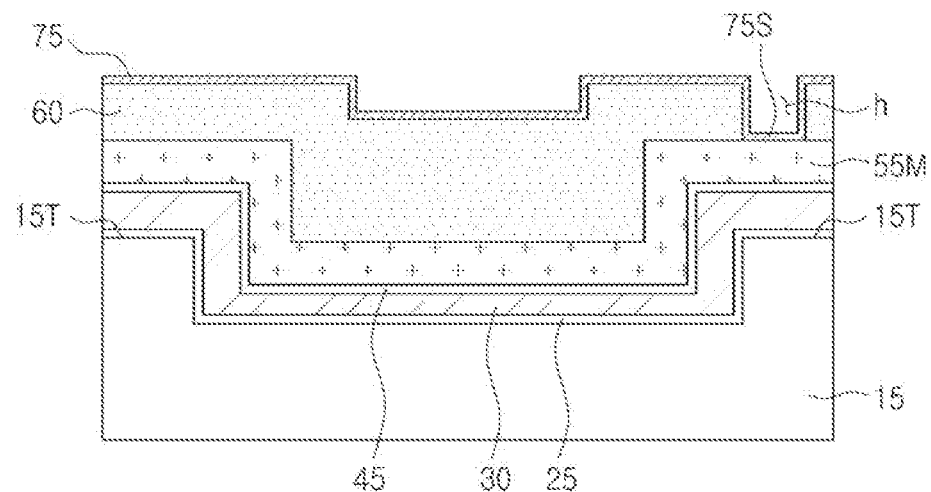

Next, referring to FIG. 8C, a mask layer 60 having an opening h to which a portion of the amorphous semiconductor layer 55M is exposed may be formed, and a metal layer 75 may be formed on the mask layer 60.

In this process, a portion of the metal layer 75 may be provided as a metal seed layer 75S, connected to the amorphous semiconductor layer 55M, through the opening of the mask layer 60. For example, the metal layer 75 and the metal seed layer 75S may include cobalt (Co), nickel (Ni), or palladium (Pd). For example, the mask layer 60 may include an insulating material such as photoresist. In some embodiments, the mask layer 60 may be removed in a subsequent process (see FIG. 8E) after an annealing process. In some embodiments, the mask layer 60 may be formed of an insulating material, such as silicon oxide, and may remain without being removed in a subsequent operation, to form an insulating portion of a final semiconductor device.

Figure 8D:
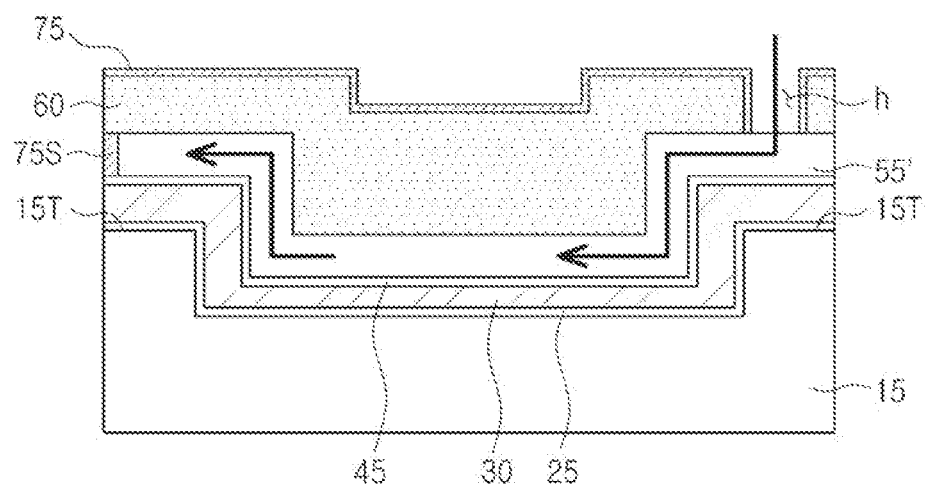

Next, referring to FIG. 8D, an annealing process using the metal seed layer 75S may be applied to crystallize the amorphous semiconductor layer 55M.

In this annealing, the metal seed layer 75S may be moved in the amorphous semiconductor layer 55M to crystallize the amorphous semiconductor layer 55M. As a result, a crystallized semiconductor layer 55' may be formed. The annealing may be performed at a relatively low temperature (400° C. or lower). For example, the annealing may be performed at a temperature in a range of 300° C. to 400° C.

Figure 8E:
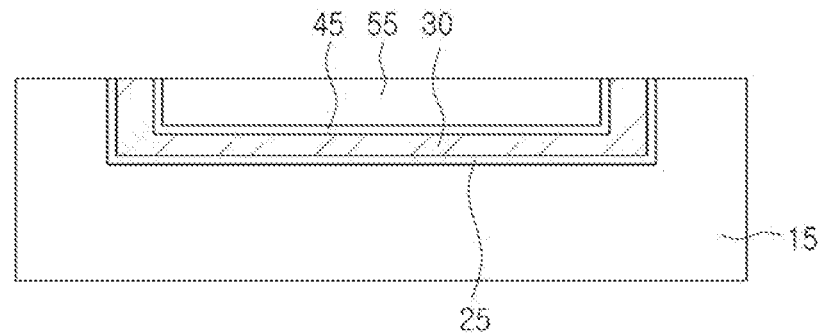

Next, referring to FIG. 8E, a second semiconductor layer 55 embedded in the shared gate electrode 30 may remain in the recess RS by performing a planarization process on the crystallized semiconductor layer 55'.

In this planarization process, a portion of the gate structure (25, 30, and 45), a portion of the second semiconductor layer 55, and a portion of the mask layer 60 which are higher than the upper region 15T of the first semiconductor layer 15 around the recess RS may be removed, and remaining portions thereof may be planarized. The second semiconductor layer 55 may have an upper surface substantially coplanar with the upper region 15T of the first semiconductor layer 15. Additionally, first and second source/drain regions (S1 and D1, and S2 and D2) may be formed on the first semiconductor layer 15 and the second semiconductor layer 55 as illustrated in FIG. 3A.

As such, the process of forming the second semiconductor layer 55 for channel formation on the second gate insulating film 45 may be performed using an MILC process in addition to an ELO process.

Semiconductor devices according to the present inventive concepts may be implemented in various forms, in consideration of reliability and process conditions for elements. For example, in some embodiments, a recess might not be used and the shared gate electrode might not be embedded (see FIGS. 9 to 12). In some embodiments, an interlayer insulation may be introduced between a second source/drain region of a second semiconductor layer (or a cover semiconductor layer) and a shared gate electrode (FIGS. 9, 10A, 10B, 15, and 16), and in some embodiments, a position of a gate contact connected to the shared gate electrode may also be varied.

Hereinafter, various semiconductor devices according to some embodiments of the present inventive concepts will be described with reference to FIGS. 9 to 16.

Figure 9:
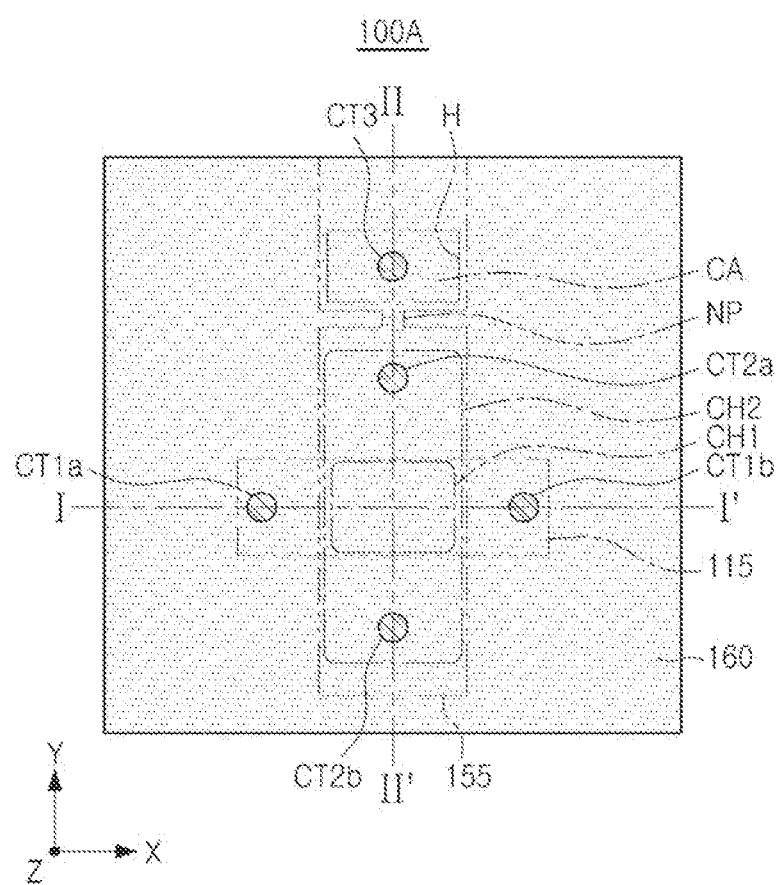
FIG. 9 is a plan view illustrating a semiconductor device according to some embodiments of the present inventive concepts.
Figure 10B:
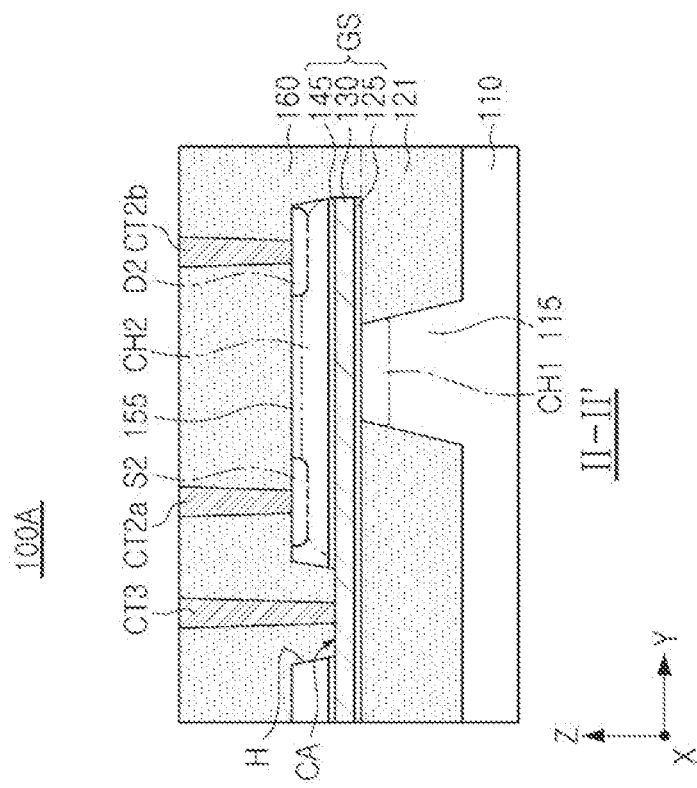
FIGS. 10A and 10B are cross-sectional side views of the semiconductor device of FIG. 9, taken along lines I'-I' and II'-II' respectively.
Figure 10A:
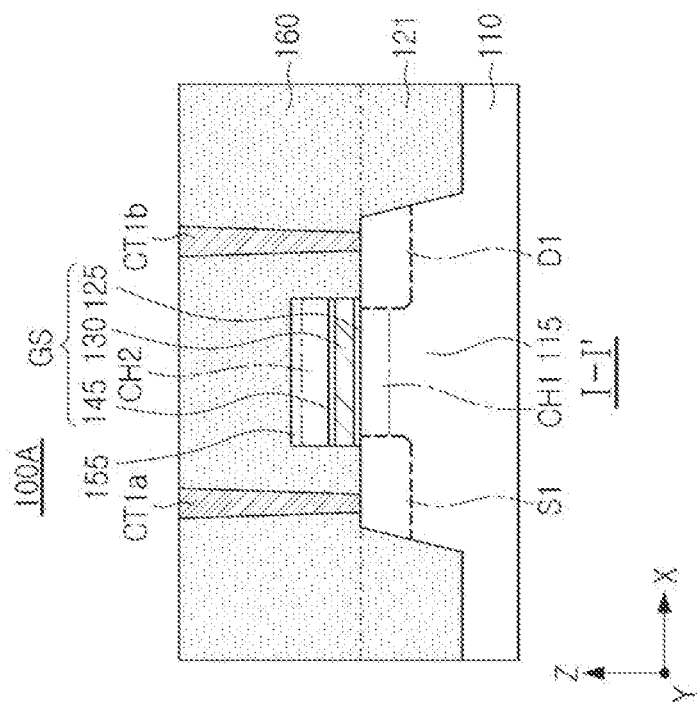

FIG. 9 is a plan view illustrating a semiconductor device according to some embodiments of the present inventive concepts, and FIGS. 10A and 10B are cross-sectional side views of the semiconductor device of FIG. 9, taken along lines I'-I' and II'-II' respectively.

Referring to FIGS. 9, 10A and 10B, a semiconductor device 100A according to some embodiments may include a substrate 110 having an active region 115 defined by an device isolation film 121; a first source/drain region (S1 and D1) on first and second sides of an upper surface of the active region 115; a shared gate structure GS having a first gate insulating film 125, a shared gate electrode 130, and a second gate insulating film 145, sequentially arranged on the active region 115; a cover semiconductor layer 155 on the second gate insulating film 145 and electrically separated from the active region 115; and a second source/drain region (S2 and D2) on first and second sides of an upper surface of the cover semiconductor layer 155.

The active region 115 and the cover semiconductor layer 155 may be arranged above and below the shared gate electrode 130, respectively, and when a voltage is applied to the shared gate electrode 130, as illustrated in FIGS. 10A and 10B, a first channel region CH1 and a second channel region CH2 may be formed in regions adjacent to the shared gate electrode 130, respectively. The first channel region CH1 may be provided as an electrical channel of the first source/drain region (S1 and D1), and the second channel region CH2 may be provided as an electrical channel of the second source/drain region (S2 and D2). At least a portion of the second channel region CH2 may have a region overlapping the first channel region CH1 in a direction (e.g., a Z direction), perpendicular to the upper surface of the active region 115.

In some embodiments, the upper surface of the active region 115 may have a substantially flat upper surface. The first gate insulating film 125, the shared gate electrode 130, and the second gate insulating film 145, e.g., the shared gate structure GS may be on the flat upper surface of the active region.

In the semiconductor device illustrated in FIGS. 10A and 10B, current flow in the first channel region CH1 and current flow in the second channel region CH2 may be perpendicular or almost perpendicular to one another and may overlap in a substantial vertical direction (e.g., the Z direction), similar to the arrangement discussed with reference to FIGS. 5A and 5B. For example, the first source/drain region may be arranged in the first direction (e.g., the X direction), and the second source/drain region may be arranged in the second direction (e.g., the Y direction), intersecting the first direction (e.g., the X direction).

A semiconductor device 100A according to some embodiments may further include first source/drain contacts CT1*a* and CT1*b* respectively connected to the first source/drain region (S1 and D1), second source/drain contacts CT2*a* and CT2*b* respectively connected to the second source/drain region (S2 and D2), and a shared gate contact CT3 connected to the shared gate electrode 130. The semiconductor device 100A may further include an insulating portion 160 on the device isolation film 121 to cover the gate structure GS, and the first and second source/drain contacts CT1*a*, CT1*b*, CT2*a*, and CT2*b*, and the shared gate contact CT3 may be formed to pass through the insulating portion 160.

The shared gate electrode 130 may have an extended portion in the second direction. The extended portion of the shared gate electrode 130 may extend to a location where the shared gate electrode 130 does not overlap with the active region 115 in a third direction (e.g., the Z direction) that is perpendicular to the upper surface of the substrate 110. As illustrated in FIG. 10B, the extended portion of the shared gate electrode 130 may extend over the device isolation film 121. The shared gate contact CT3 may be formed to be connected to the extended portion of the shared gate electrode 130.

The cover semiconductor layer 155 may have an opening H that overlaps the extended portion of the shared gate electrode 130 in the third direction (e.g., the Z direction) that is perpendicular to the upper surface of the substrate 110, and the shared gate contact CT3 may be connected to the extended portion of the shared gate electrode 130 through the opening H.

As illustrated in FIG. 9, the cover semiconductor layer 155 employed in some embodiments may have a neck portion NP adjacent to the opening H that has a width that is narrower than a width of the remaining portion of the cover semiconductor layer 155. The neck portion NP may be provided as a movement path of a metal seed layer to provide crystallization directionality in an MILC process. This will be described in greater detail with reference to some processes in the manufacturing of the semiconductor device 100A (see FIGS. 19A and 19B, and FIGS. 20A and 20B).

Figure 11:
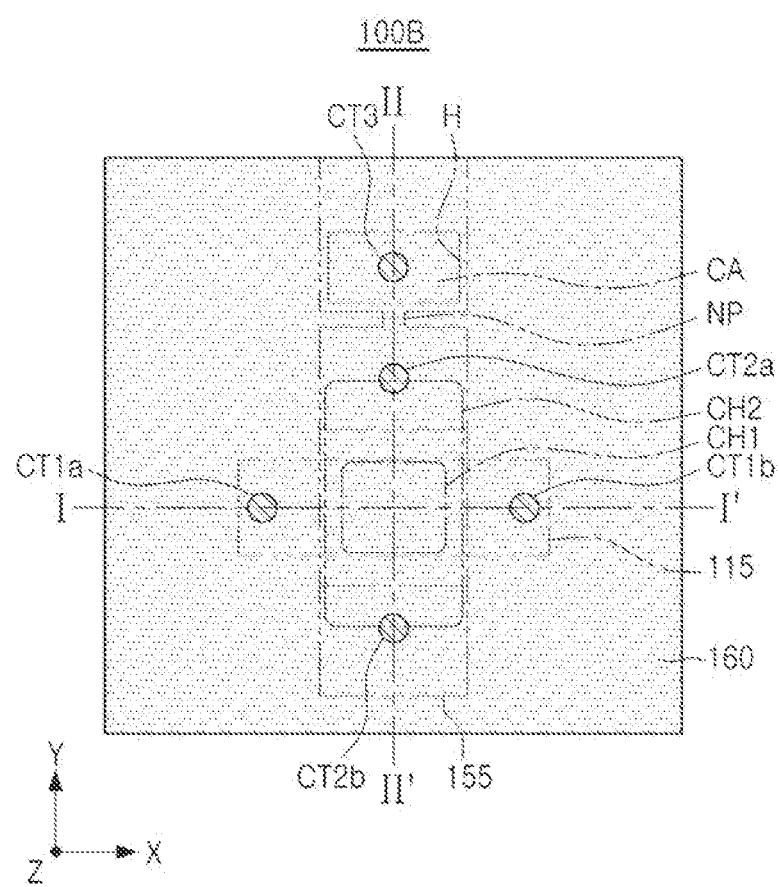
FIG. 11 is a plan view illustrating a semiconductor device according to some embodiments of the present inventive concepts.
Figure 12:
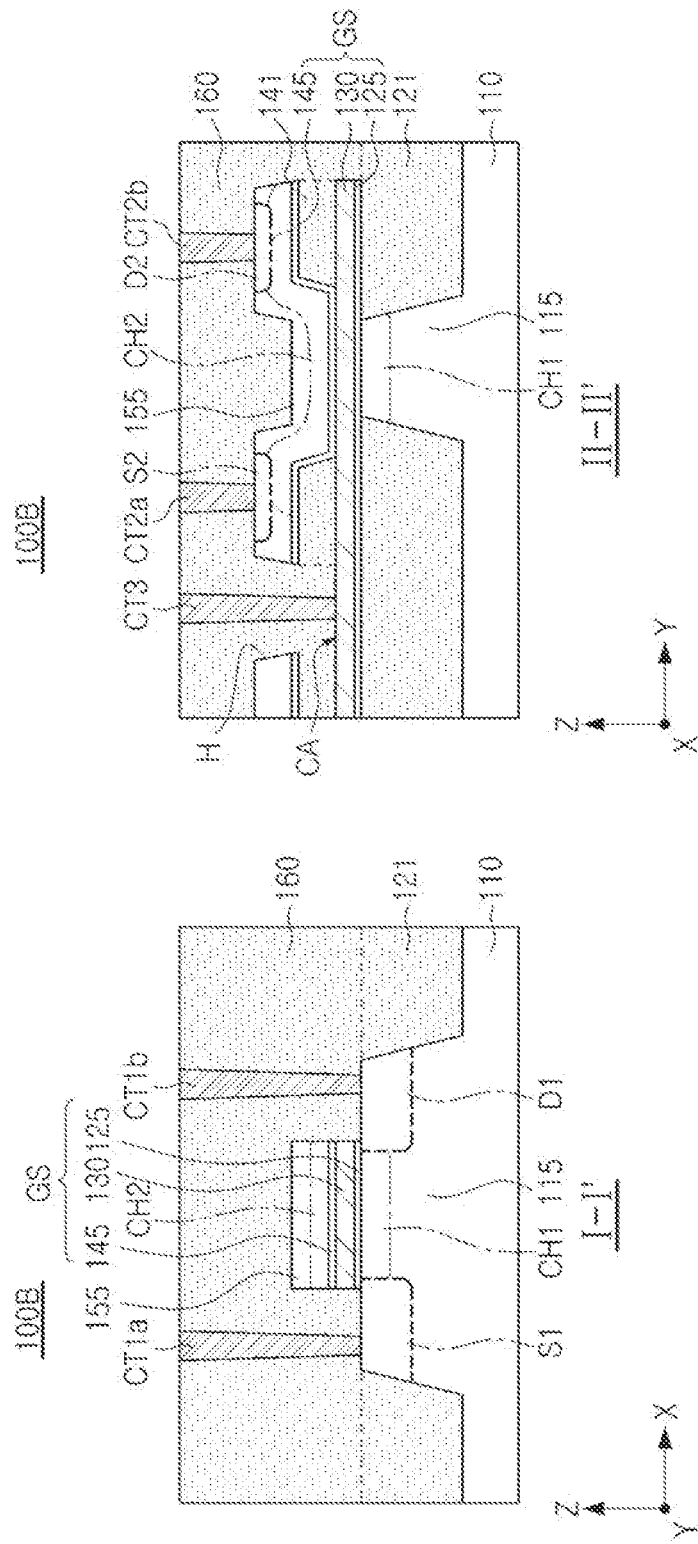
FIGS. 12A and 12B are cross-sectional side views of the semiconductor device of FIG. 11, taken along lines I'-I' and II'-II' respectively.

FIG. 11 is a plan view illustrating a semiconductor device according to some embodiments of the present inventive concepts, and FIGS. 12A and 12B are cross-sectional side views of the semiconductor device of FIG. 11, taken along lines I'-I' and II'-II' respectively.

Referring to FIGS. 11, 12A, and 12B, a semiconductor device 100B according to some embodiments can be understood as being similar to the semiconductor device 100A illustrated in FIGS. 9, 10A, and 10B, except that an interlayer insulating portion 141 between a portion of a cover semiconductor layer 155 and a shared gate electrode 130 is introduced. Components described with reference to the semiconductor device 100B illustrated in FIGS. 11, 12A, and 12B can be understood as referring to the same or similar components as those which are similarly numbered and which have been previously described, unless otherwise specified.

A semiconductor device 100B according to some embodiments may include an interlayer insulating portion 141 between a cover semiconductor layer 155 and an extended portion of a shared gate electrode 130. A second source/drain region (S2 and D2) may be located on a higher level than a second channel region CH2 by the interlayer insulating portion 141. In addition, in some embodiments, a portion of a second gate insulating film 145 may extend on the interlayer insulating portion 141.

In some embodiments, a distance between the second source/drain region (S2 and D2) and the shared gate electrode 130 may be obtained by the interlayer insulating portion 141. As a result, when the second source/drain region (S2 and D2) and second source/drain contacts CT2*a* and CT2*b* are formed (with reference to FIGS. 30B and 32B), the obtained distance may effectively prevent or reduce occurrence of and undesired connection to the shared gate electrode 130.

As described with reference to the semiconductor device 100A illustrated in FIGS. 9, 10A, and 10B, the shared gate electrode 130 of the semiconductor device 100B may have an extended portion in the second direction (e.g., the Y direction). The extended portion of the shared gate electrode 130 may extend to a location where the shared gate electrode does not overlap an active region 115 in the vertical or third direction (e.g., the Z direction) that is perpendicular to an upper surface of a substrate 110. As illustrated in FIG. 12B, the extended portion of the shared gate electrode 130 may extend over a device isolation film 121. A shared gate contact CT3 may be formed to be connected to the extended portion of the shared gate electrode 130.

The cover semiconductor layer 155 may have an opening H that overlaps the extended portion of the shared gate electrode 130 in the third direction (e.g., the Z direction) that is perpendicular to the upper surface of the substrate 110, and the shared gate contact CT3 may be connected to the extended portion of the shared gate electrode 130 through the opening H. In addition, the cover semiconductor layer 155 may have an extended portion in a region that does not overlap the shared gate electrode 130 in the third direction (e.g., the Z direction) that is perpendicular to the upper surface of the substrate 110, and the extended portion of the cover semiconductor layer 155 may have a neck portion NP having a width narrower than a width of a remaining portion of the cover semiconductor layer 155.

Figure 13:
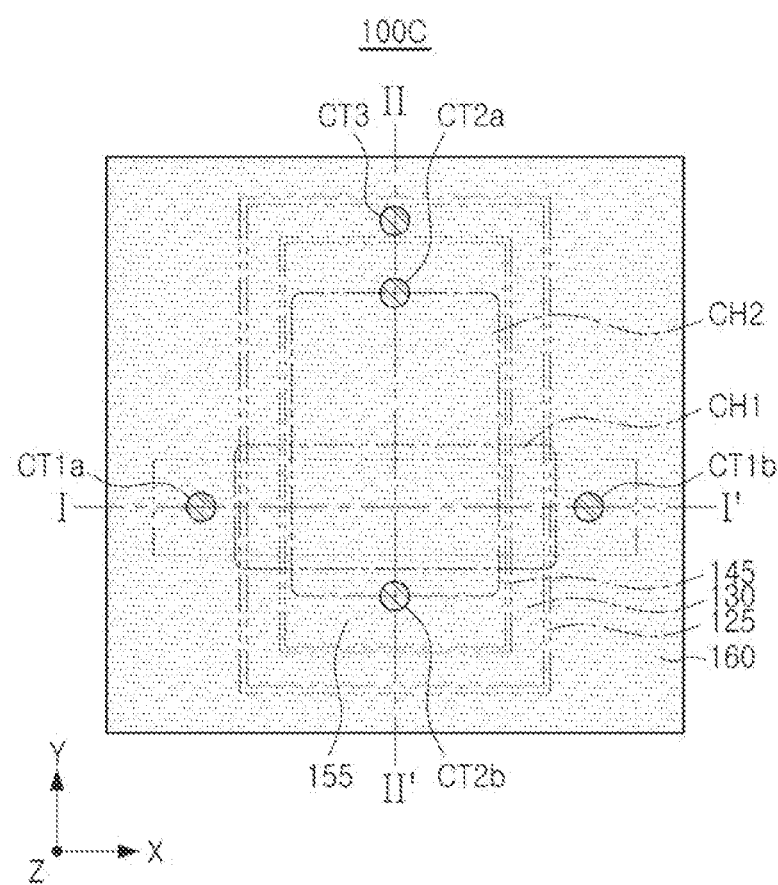
FIG. 13 is a plan view illustrating a semiconductor device according to some embodiments of the present inventive concepts.
Figure 14A:
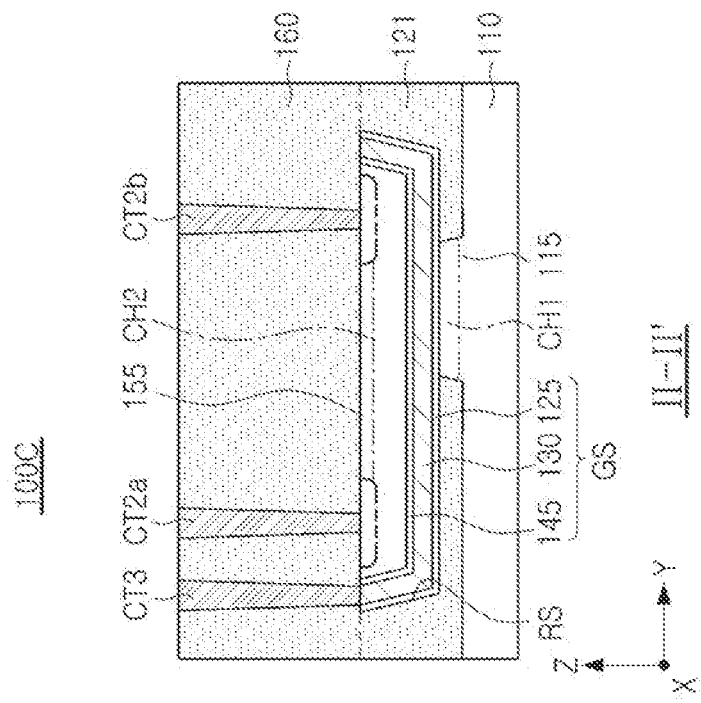
FIGS. 14A and 14B are cross-sectional side views of the semiconductor device of FIG. 13, taken along lines I'-I' and II'-II' respectively.
Figure 14B:
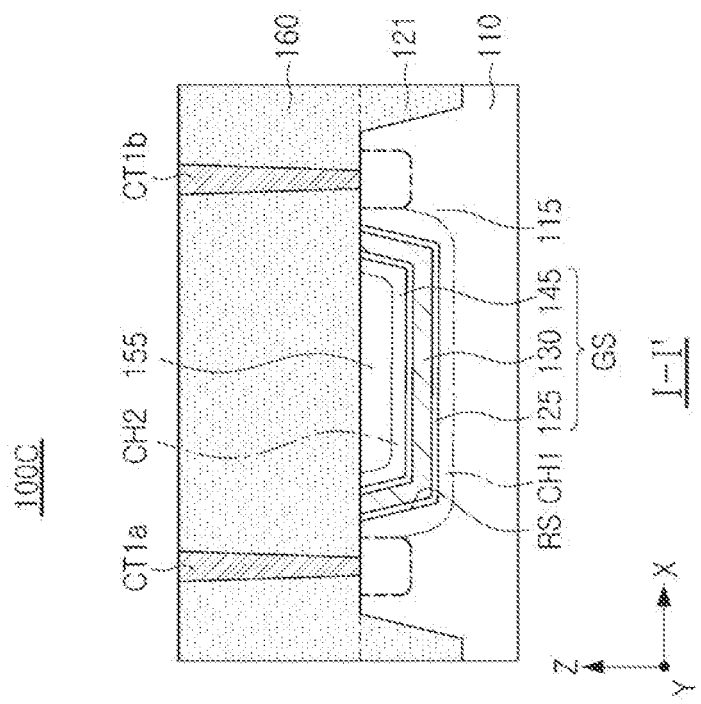

FIG. 13 is a plan view illustrating a semiconductor device according to some embodiments of the present inventive concepts, and FIGS. 14A and 14B are cross-sectional side views of the semiconductor device of FIG. 13, taken along lines I'-I' and II'-II' respectively.

Referring to FIGS. 13, 14A and 14B, a semiconductor device 100C according to some embodiments may be similar to those described with reference to and illustrated in FIGS. 4, 5A, and 5B, in view of the fact that a gate structure GS and a cover semiconductor layer 155 have a structure embedded in an active region 115.

In some embodiments, a recess RS formed in an active region 115 has opened in the second direction (e.g., the Y direction) as illustrated in FIG. 14B. A portion of the recess RS in the second direction (e.g., the Y direction) may be formed over a device isolation film 121. While maintaining an area of a second channel region (e.g., an area of a shared gate electrode 130), a width of the active region 115 may decrease in the second direction (e.g., the Y direction) to control an area of the first channel region CH1 (see FIGS. 43B, 47B, and 49B)

Referring to FIGS. 14A and 14B, a gate structure GS and a cover semiconductor layer 155 may be embedded in the recess RS. Specifically, a first gate insulating film 125 and a shared gate electrode 130 may be embedded in the recess RS, and a second gate insulating film 145 and the cover semiconductor layer 155 may be embedded in the gate electrode 130 in the recess RS. An upper surface of the cover semiconductor layer 155 may be substantially coplanar with an upper surface of the active region 115. In some embodiments, since the cover semiconductor layer 155 is embedded in the shared gate electrode 130, a second channel region CH2 may be located on a level lower than the upper surface of the active region 115.

Figure 15:
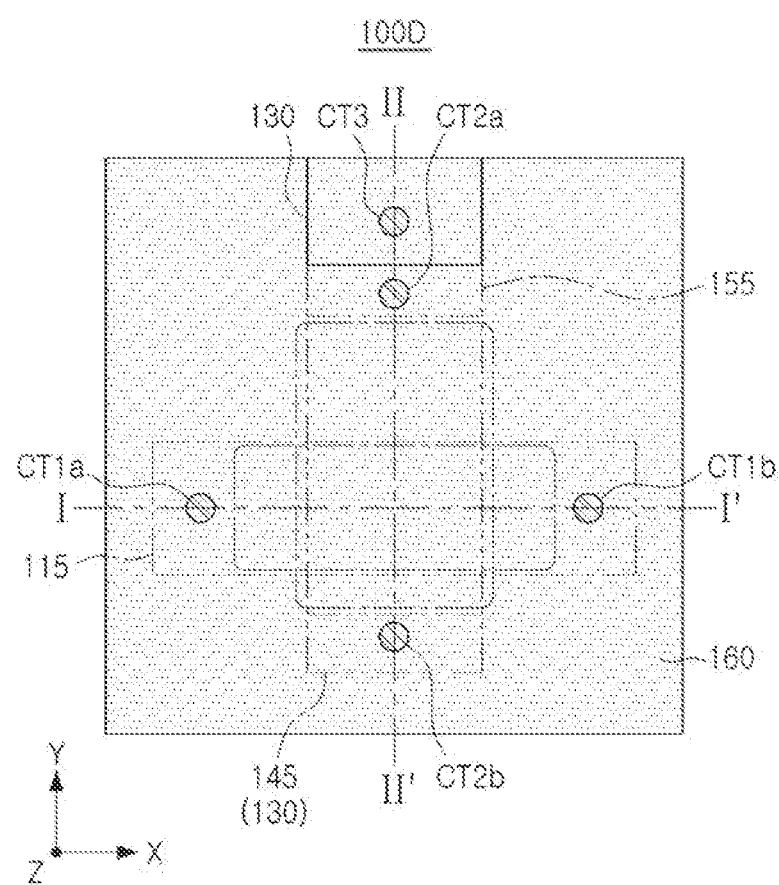
FIG. 15 is a plan view illustrating a semiconductor device according to some embodiments of the present inventive concepts.
Figure 16A:
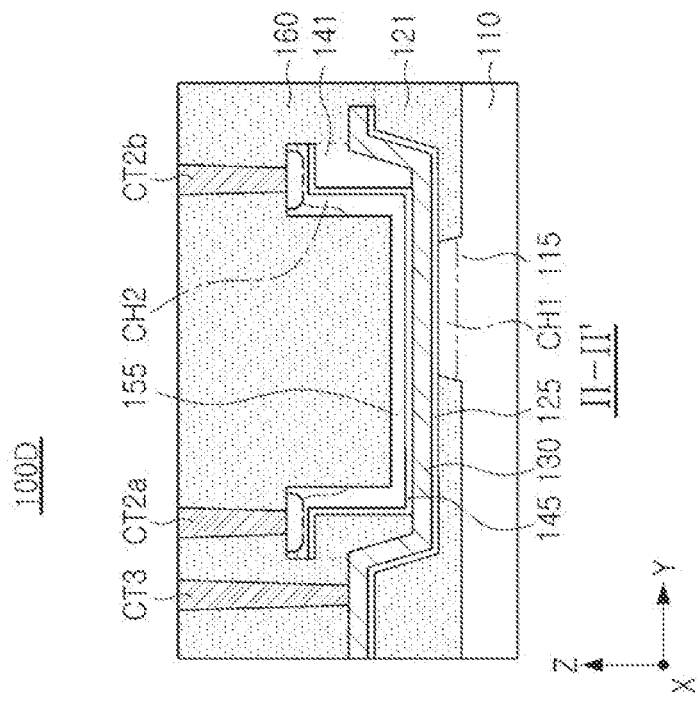
FIGS. 16A and 16B are cross-sectional side views of the semiconductor device of FIG. 13, taken along lines I'-I' and II'-II' respectively.
Figure 16B:
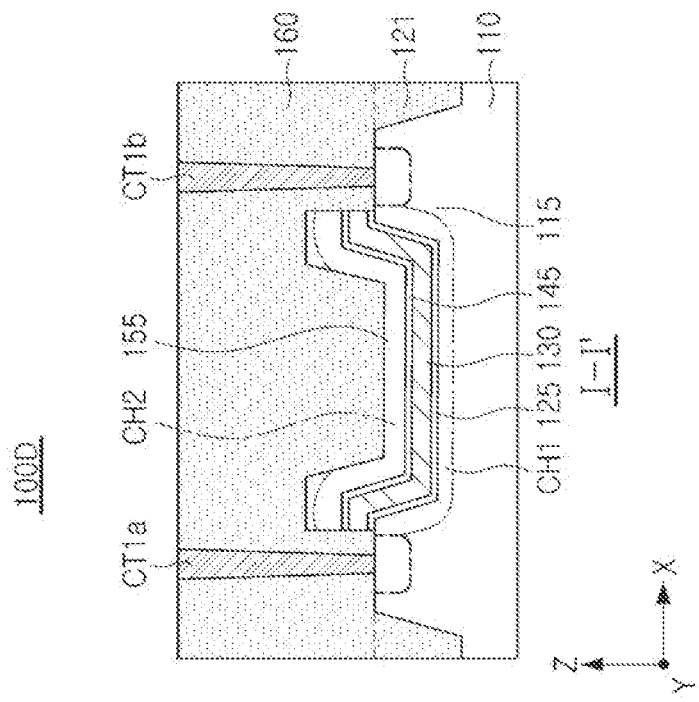

FIG. 15 is a plan view illustrating a semiconductor device according to some embodiments of the present inventive concepts, and FIGS. 16A and 16B are cross-sectional side views of the semiconductor device of FIG. 13, taken along lines I'-I' and II'-II' respectively.

Referring to FIGS. 15, 16A, and 16B, a semiconductor device 100D according to some embodiments can be understood as being similar to the semiconductor device 100C described with reference to and illustrated in FIGS. 13, 14A, and 14B, except that an interlayer insulating portion 141 between a cover semiconductor layer 155 and an extended portion of a shared gate electrode 130 is introduced, and a shared gate contact CT3 is connected to the extended portion of the shared gate electrode 130. Components described with reference to the semiconductor device 100D illustrated in FIGS. 15, 16A, and 16B can be understood as referring to the same or similar components as those which are similarly numbered and which have been previously described, unless otherwise specified.

A semiconductor device 100D according to some embodiments may be similar to the semiconductor device 100B illustrated in FIG. 12B, in view of the fact that an interlayer insulating portion 141 between the cover semiconductor layer 155 and an extended portion of the shared gate electrode 130 may be further included. A second source/drain region (S2 and D2) may be located on a higher level than a second channel region CH2 by the interlayer insulating portion 141. In addition, a portion of a second gate insulating film 145 may extend on the interlayer insulating portion 141.

As described with reference to the semiconductor device 100B illustrated in FIGS. 11, 12A, and 12B, the shared gate electrode 130 may have an extended portion in the second direction (e.g., the Y direction). The extended portion of the shared gate electrode 130 may extend to a location that does not overlap an active region 115 in the vertical or third direction (e.g., the Z direction) that is perpendicular to an upper surface of a substrate 110. As illustrated in FIG. 14B, the extended portion of the shared gate electrode 130 may extend over a device isolation film 121. The extended portion of the shared gate electrode 130 may include a region that does not overlap or is not overlapped by the cover semiconductor layer 155 in the vertical or third direction (e.g., the Z direction). A shared gate contact CT3 may be formed to be connected to the extended portion of the shared gate electrode 130.

FIGS. 17A, 18A, 19A, 20A, 21A, 22A, 23A, and 24A are plan views of main processes of a method of manufacturing a semiconductor device according to some embodiments of the present inventive concept, and FIGS. 17B, 18B, 19B, 20B, 21B, 22B, 23B, and 24B are cross-sectional views of the plan views of FIGS. 17A, 18A, 19A, 20A, 21A, 22A, 23A, and 24A, taken along lines I'-I' and II'-II' respectively.

The processes of manufacturing a semiconductor device illustrated in FIGS. 17A-24B can be understood as processes within a method of manufacturing the semiconductor device 100A illustrated in FIGS. 9, 10A, and 10B. Specifically, FIGS. 17A, 18A, 19A, 20A, 21A, 22A, 23A, and 24A correspond to the plan view of FIG. 9, and the two (2) cross-sectional views in FIGS. 17B, 18B, 19B, 20B, 21B, 22B, 23B, and 24B, respectively, correspond to the cross-sectional view of FIG. 10A and the cross-sectional view of FIG. 10B, respectively.

Figure 17A:
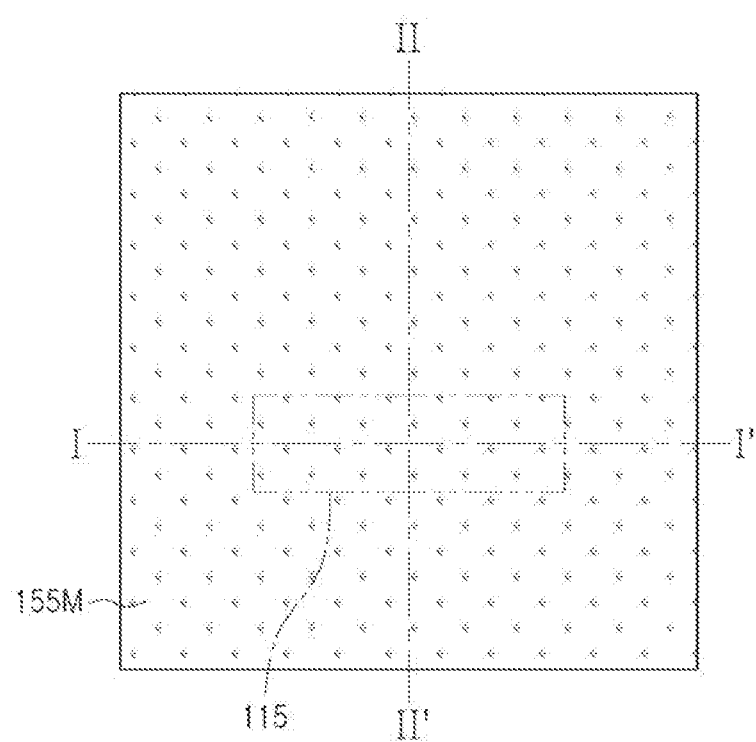
FIGS. 17A, 18A, 19A, 20A, 21A, 22A, 23A, and 24A are plan views of main processes of a method of manufacturing a semiconductor device according to some embodiments of the present inventive concepts.
Figure 17B:
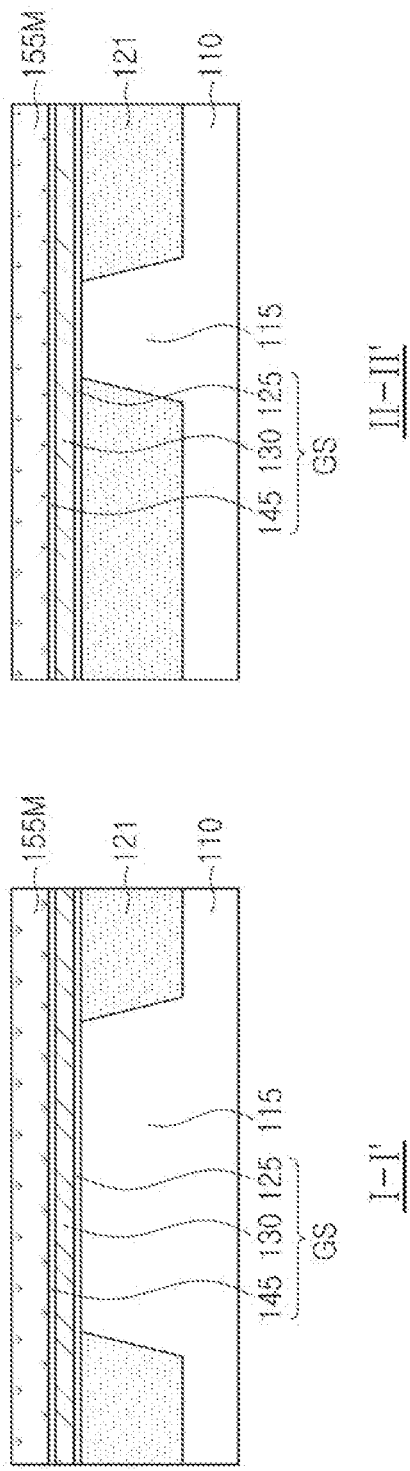
FIGS. 17B, 18B, 19B, 20B, 21B, 22B, 23B, and 24B are cross-sectional views of the plan views of FIGS. 17A, 18A, 19A, 20A, 21A, 22A, 23A, and 24A, taken along lines I'-I' and II'-II' respectively.

Referring to FIGS. 17A and 17B, a gate structure GS may be formed on an active region 115 of a substrate 110, and a device isolation film 121.

The substrate 110 may include silicon, germanium, or silicon-germanium. The active region 115 may be defined by the device isolation film 121. The active region 115 may have a substantially coplanar surface with an upper surface of the device isolation film 121 by a polishing process such as CMP. In some embodiments, p-type or n-type wells and/or n-type or p-type impurity regions may be formed on the substrate 110, to form a transistor.

Subsequently, the gate structure GS may be formed by sequentially stacking a first gate insulating film 125, a shared gate electrode 130, and a second gate insulating film 145 on the active region 115 and the device isolation film 121. The first and second gate insulating films 125 and 145 and the shared gate electrode 130 may include materials as previously described. In some embodiments, the shared gate electrode 130 may have an upper and lower symmetrical structure (e.g., Poly-Si/W/Poly-Si) and/or may have a multi-layered structure. In some embodiments, the first and second gate insulating films 125 and 145 may be formed to have different thicknesses and/or different dielectric layers, to have different threshold voltages.

Figure 18A:
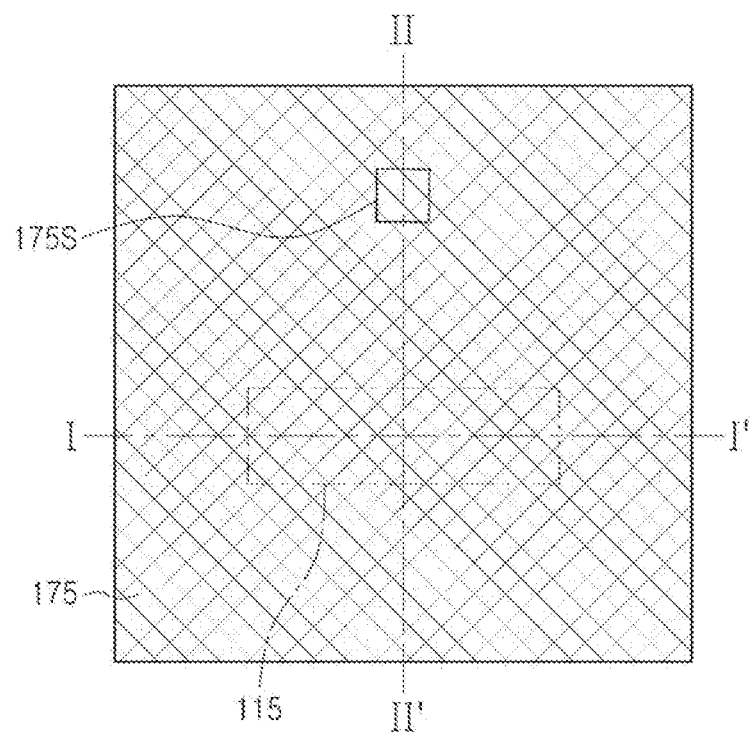
Figure 18B:
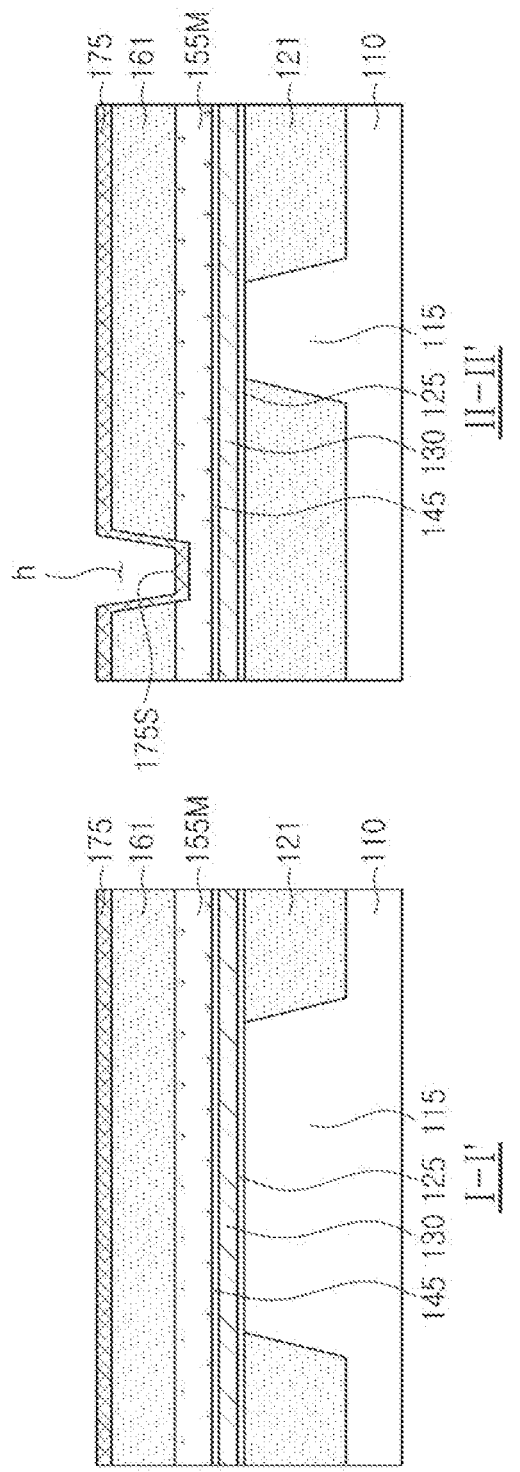

Next, referring to FIGS. 18A and 18B, an amorphous semiconductor layer 155M may be formed on the second gate insulating film 145, and a first insulating layer 161 may be formed. The first insulating layer 161 may have an opening h by which a portion of the amorphous semiconductor layer 155M is exposed. A metal layer 175 may be formed on the first insulating layer 161.

In some embodiments, a single crystal layer (for example, a cover semiconductor layer (see 155 in FIG. 20B)) forming a channel region may be formed using a MILC process. For example, the amorphous semiconductor layer 155M may include amorphous silicon, amorphous germanium, or amorphous silicon-germanium. The first insulating layer 161 having the opening h by which a portion of the amorphous semiconductor layer 155M is exposed may be formed, and the metal layer 175 may be formed on the first insulating layer 161. In this process, a metal seed layer 175S, which may be a portion of the metal layer 175, may be connected to the amorphous semiconductor layer 155M through the exposed opening h. For example, the first insulating layer 161 may include an insulating material such as silicon oxide, silicon nitride, and silicon oxynitride. For example, the metal layer 175 may include cobalt (Co), nickel (Ni), or palladium (Pd). In some embodiments, the first insulating layer 161 may remain, without being removed in a subsequent process, to form a portion of an insulating portion 160 of a final semiconductor device.

Figure 19A:
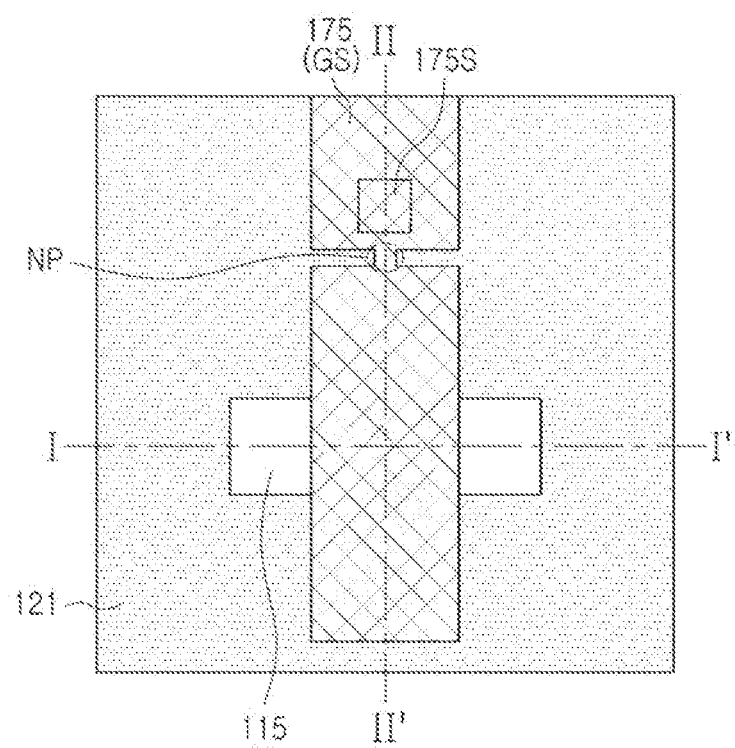
Figure 19B:
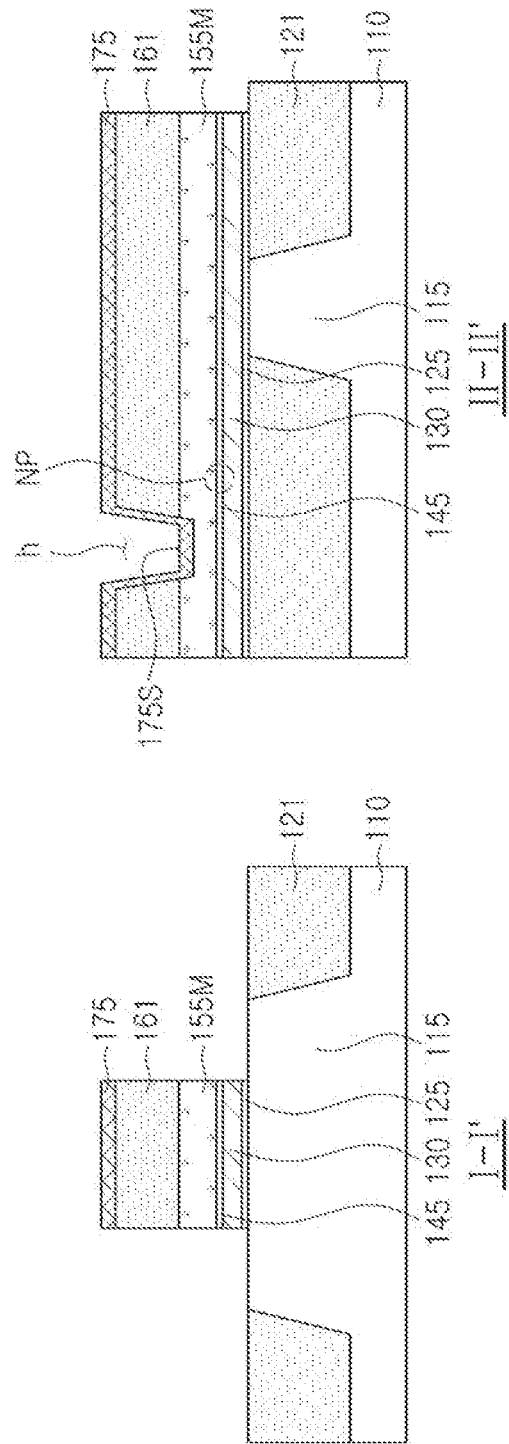

Next, referring to FIGS. 19A and 19B, the gate structure GS and the amorphous semiconductor layer 155M may be patterned.

In this process, a portion of the active region 115 on first and second sides of the patterned gate structure GS may be exposed (see FIG. 19A), and the exposed portion of the active region 115 may be provided as a region for a first source/drain region (S1 and D1). The patterned amorphous semiconductor layer, together with the patterned gate structure GS, may have a pattern extending in the second direction (e.g., the Y direction) to intersect the active region 155. Specifically, the gate structure GS, e.g., the shared gate electrode 130 may extend onto the device isolation film 121 in the second direction (e.g., the Y direction).

The amorphous semiconductor layer 155M may have a neck portion NP adjacent to the opening h. The neck portion NP may have a width narrower than a width of the remaining portion of the amorphous semiconductor layer 155M, adjacent to the opening h. As described above, the neck portion NP may be provided as a movement path of the metal seed layer to provide crystallization directionality in an MILC process. The gate structure to be patterned, in addition to the amorphous semiconductor layer 155M, may also have a neck portion corresponding to the neck portion NP.

Figure 20A:
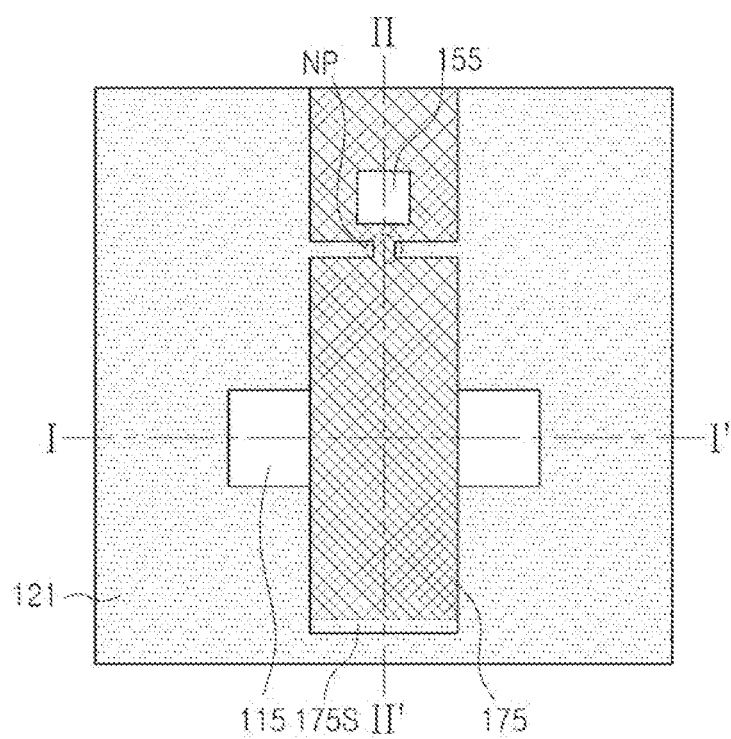
Figure 20B:
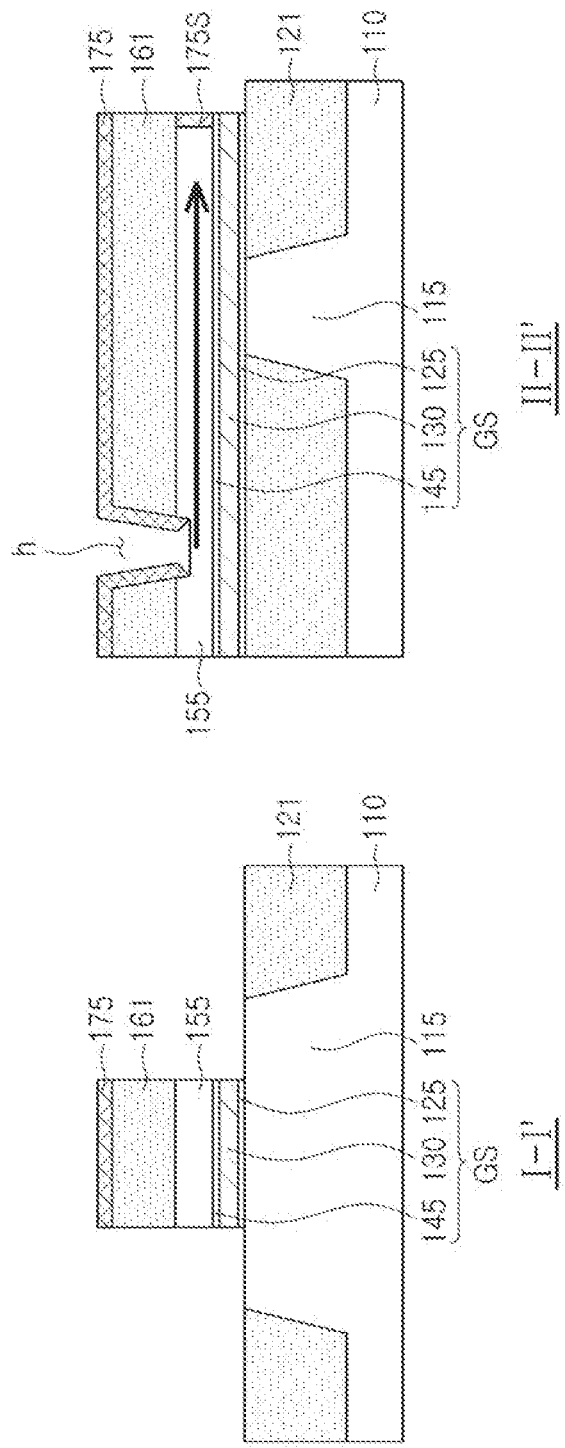

Next, referring to FIGS. 20A and 20B, an annealing process using the metal seed layer 175S may be applied to crystallize the amorphous semiconductor layer 155M.

In this annealing, the metal seed layer 175S may be moved in the amorphous semiconductor layer 155M to crystallize the amorphous semiconductor layer 155M. As a result, a crystallized cover semiconductor layer 155 may be formed. The annealing may be performed at a relatively low temperature (400° C. or lower). For example, the annealing may be performed in a range of 300° C. to 400° C. After crystallization, the metal seed layer 175S may remain on one end of the cover semiconductor layer 155.

Figure 21A:
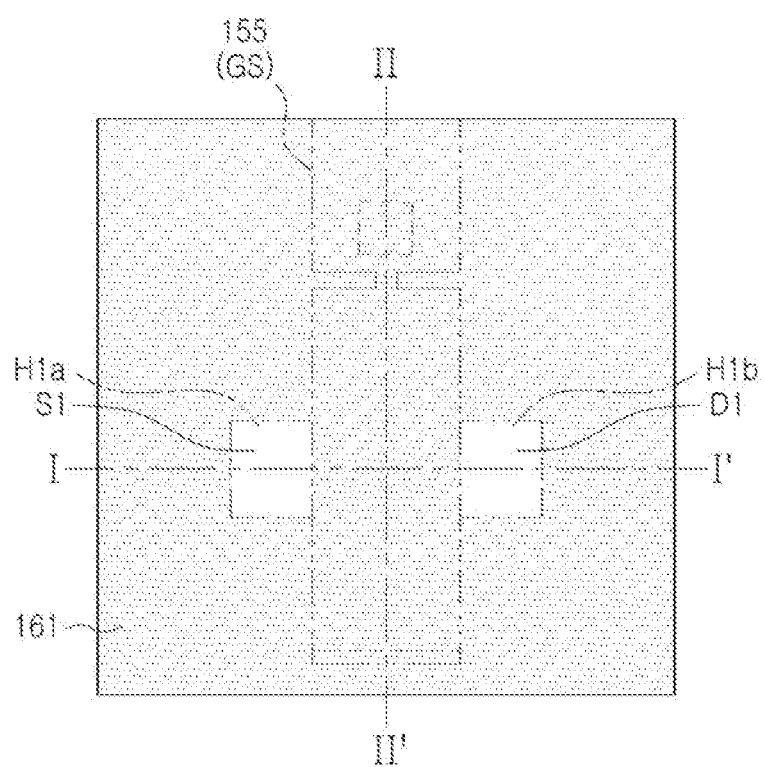
Figure 21B:
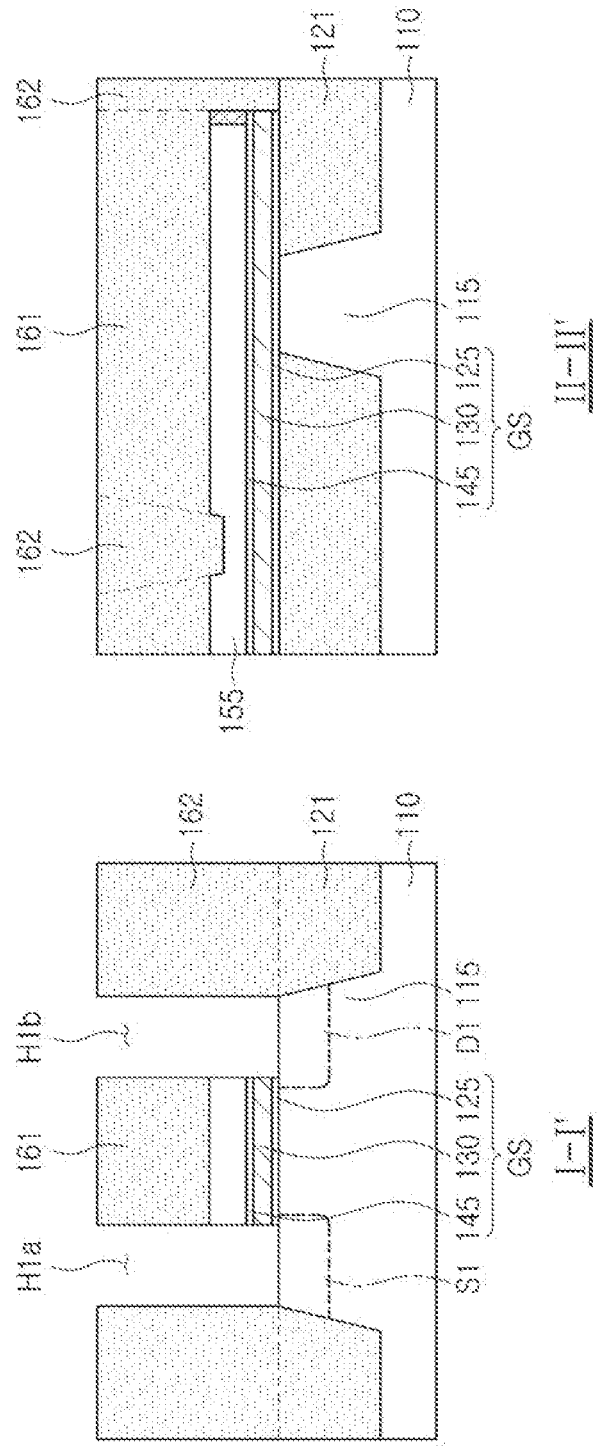

Next, referring to FIGS. 21A and 21B, a first source/drain region (S1 and D1) may be formed in the active region 115 exposed through first openings H1a and H1b.

This process may be started with forming a second insulating layer 162 on the first insulating layer 161 to embed or fill the opening h of the first insulating layer 161 after the process illustrated in FIGS. 20A and 20B. Subsequently, a polishing process may be performed such that a portion of the metal layer 175 and portions the first and second insulating layers 161 and 162 are removed. Next, the first openings H1a and H1b may be formed in the first and second insulating layers 161 and 162 to expose the active region 115, and the first source/drain region (S1 and D1) may be formed in the active region 115 exposed through the first openings H1a and H1b using an ion implantation process.

Figure 22A:
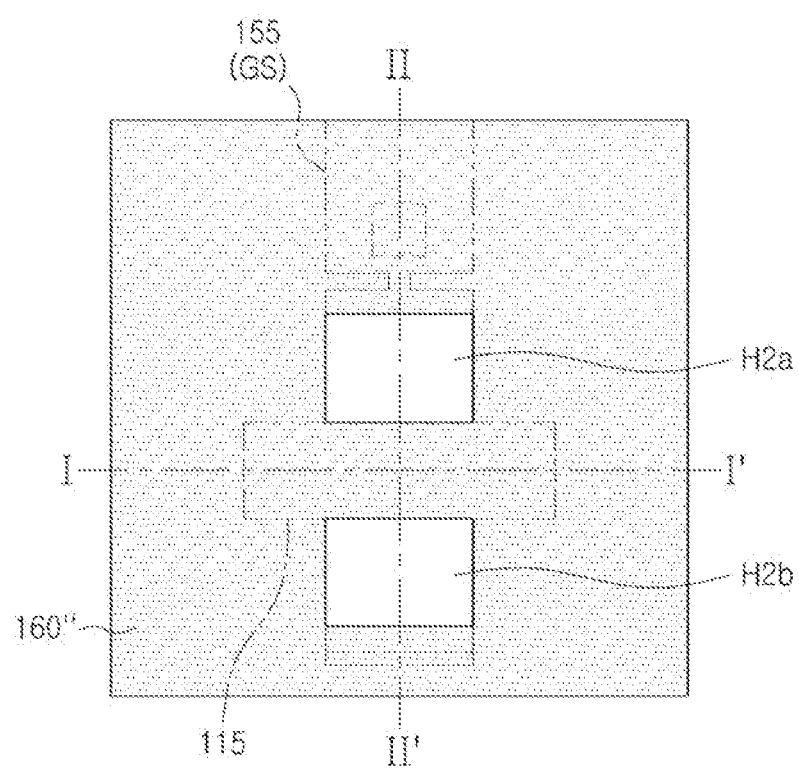
Figure 22B:
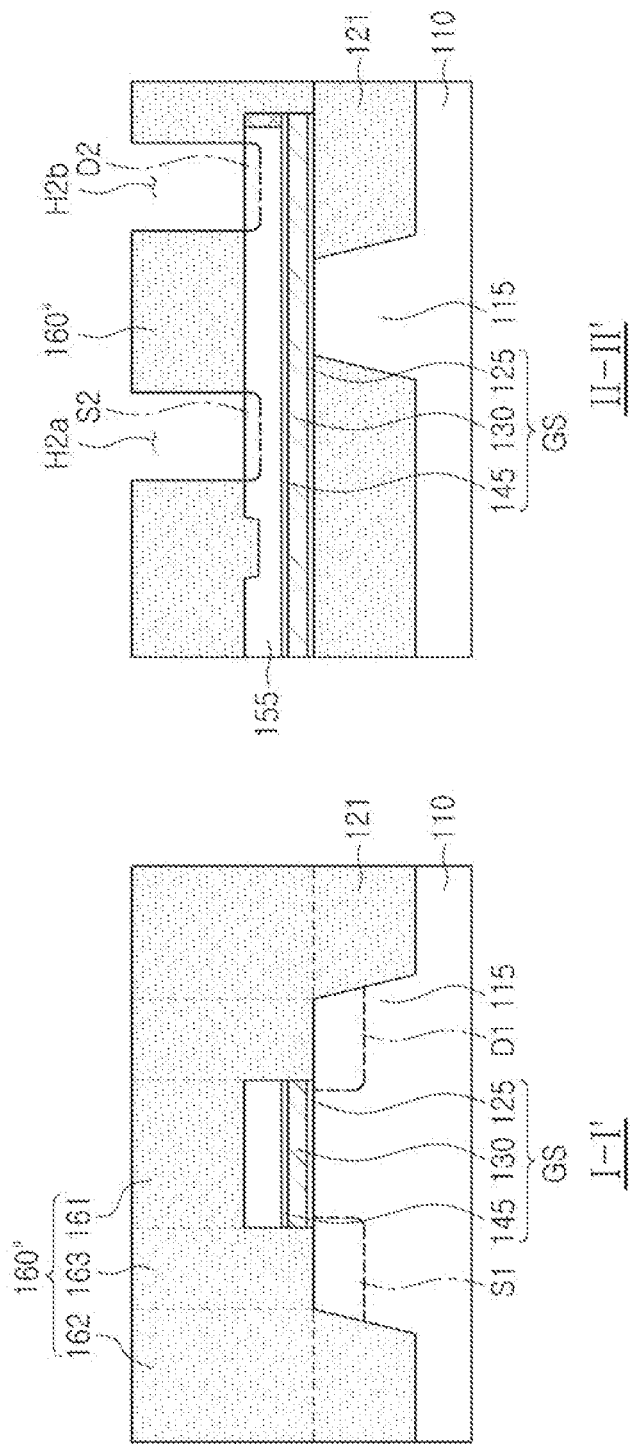

Next, referring to FIGS. 22A and 22B, a second source/drain region (S2 and D2) may be formed on the cover semiconductor layer 155 exposed through second openings H2a and H2b.

This process may be started with preparing an insulating portion 160" by forming a third insulating layer 163 on the first and second insulating layers 161 and 162 to embed or fill the first openings H1a and H1b after the process illustrated in FIGS. 21A and 21B. Subsequently, a polishing process may be performed such that a portion of the insulating portion 160" is removed, and the second openings H2a and H2b may be formed on the insulating portion 160" to expose the cover semiconductor layer 155. Next, similar to the process of forming the first source/drain region (S1 and D1), the second source/drain region (S2 and D2) may be formed in the cover semiconductor layer 155 exposed through the second openings H2a and H2b using the ion implantation process.

Figure 23A:
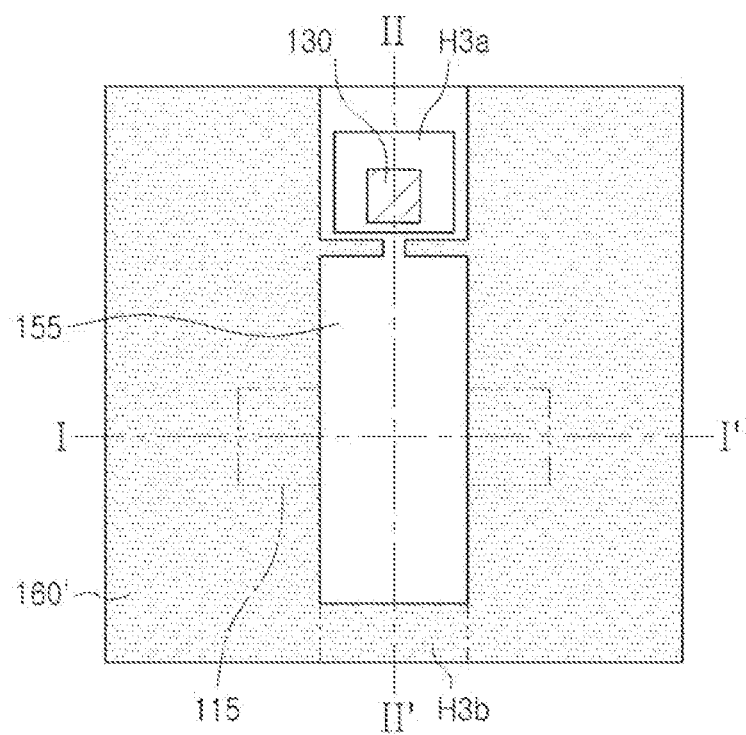
Figure 23B:
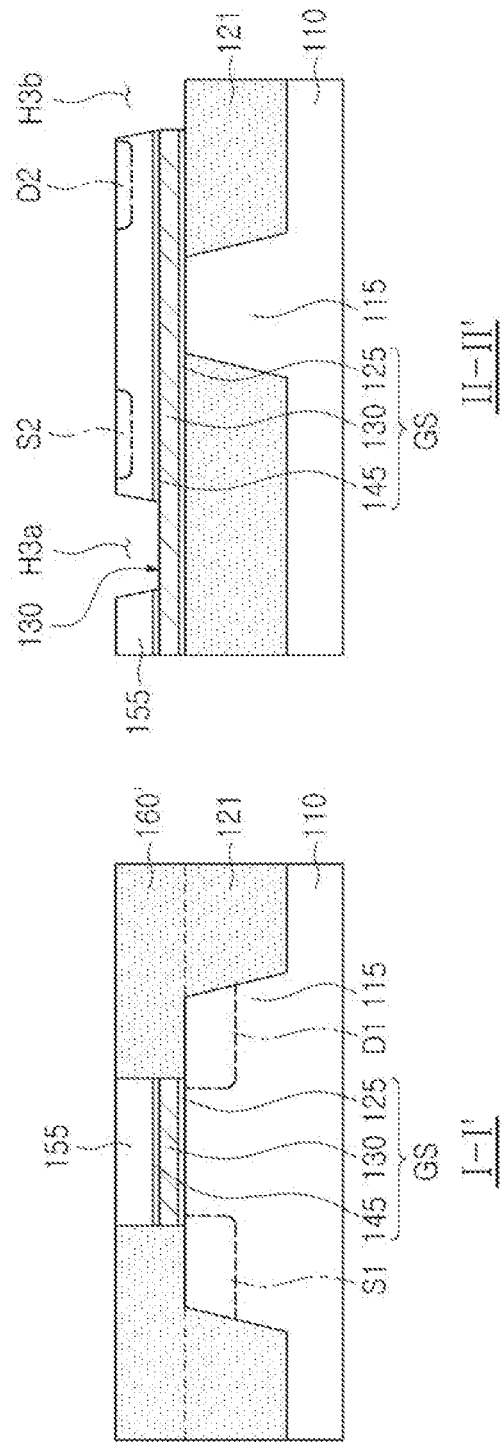

Next, referring to FIGS. 23A and 23B, the cover semiconductor layer 155 may be partially etched to expose a contact region CA of the gate electrode 145.

In this process, an insulating portion 160' may be polished to expose an upper surface of the cover semiconductor layer 155. Subsequently, the contact region of the gate electrode 145 may be exposed by partially etching the cover semiconductor layer 155. Through the partial etching, an end portion of the cover semiconductor layer 155 in which remaining portion of the metal seed layer 175S is located may also be removed.

Figure 24A:
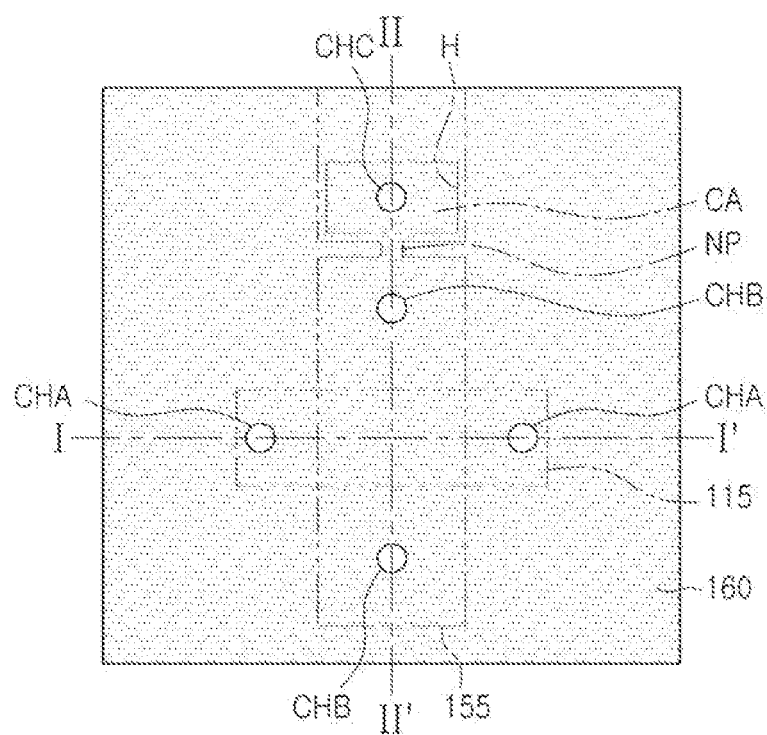
Figure 24B:
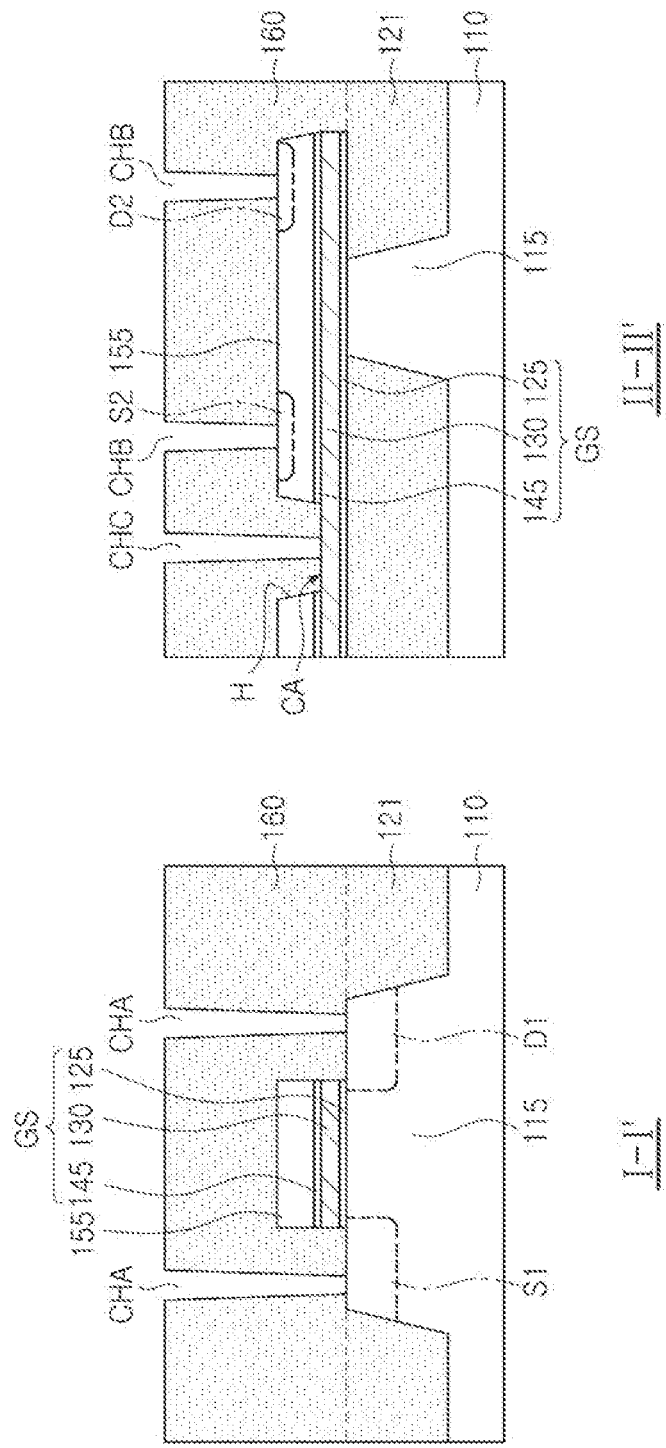

Next, referring to FIGS. 24A and 24B, after forming an insulating portion 160 to cover the cover semiconductor layer 155, contact openings CHA, CHB, and CHC in which the first and second source/drain regions (S1 and D1, and S2 and D2) and the contact region CA of the gate electrode 145 are open may be formed in the insulating portion 160.

Additionally, a shared gate contact CT3 and first and second source/drain contacts CT1a, CT1b, CT2a, and CT2b may be formed in the contact openings CHA, CHB, and CHC, respectively, to prepare the semiconductor device 100A illustrated in FIGS. 9, 10A, and 10B. The shared gate contact CT3 and the first and second source/drain contacts CT1a, CT1b, CT2a, and CT2b may include a contact plug and a barrier film surrounding the contact plug, respectively. For example, the contact plug may be made of W, Cu, Al, alloys thereof, or a combination thereof. The barrier film may include a conductive metal nitride film, and may include, for example, TiN, TaN, AlN, WN, or a combination thereof.

In the above-described processes, forming the cover semiconductor layer 155 is described with reference to use of a MILC process, but similarly to the processes illustrated in FIGS. 6A to 6G and 7A to 7F, the cover semiconductor layer 155 for the upper channel region may be formed by a different process or processes, and for example may be grown by an epitaxial lateral overgrowth (ELO) process.

FIGS. 25A, 26A, 27A, 28A, 29A, 30A, 31A, and 32A are plan views of main processes of a method of manufacturing a semiconductor device according to some embodiment of the present inventive concepts, and FIGS. 25B, 26B, 27B, 28B, 29B, 30B, 31B, and 32B are cross-sectional views of the plan views of FIGS. 25A, 26A, 27A, 28A, 29A, 30A, 31A, and 32A, taken along lines I-I' and II-II', respectively.

The processes of manufacturing a semiconductor device illustrated in FIGS. 25A to 32B can be understood as processes within a method of manufacturing the semiconductor device 100B illustrated in FIGS. 11, 12A, and 12B. Specifically, FIGS. 25A, 26A, 27A, 28A, 29A, 30A, 31A, and 32A correspond to the plan view of FIG. 11, and the two (2) cross-sectional views in FIGS. 25B, 26B, 27B, 28B, 29B, 30B, 31B, and 32B, respectively, correspond to the cross-sectional view of FIG. 12A and the cross-sectional view of FIG. 12B, respectively.

Figure 25A:
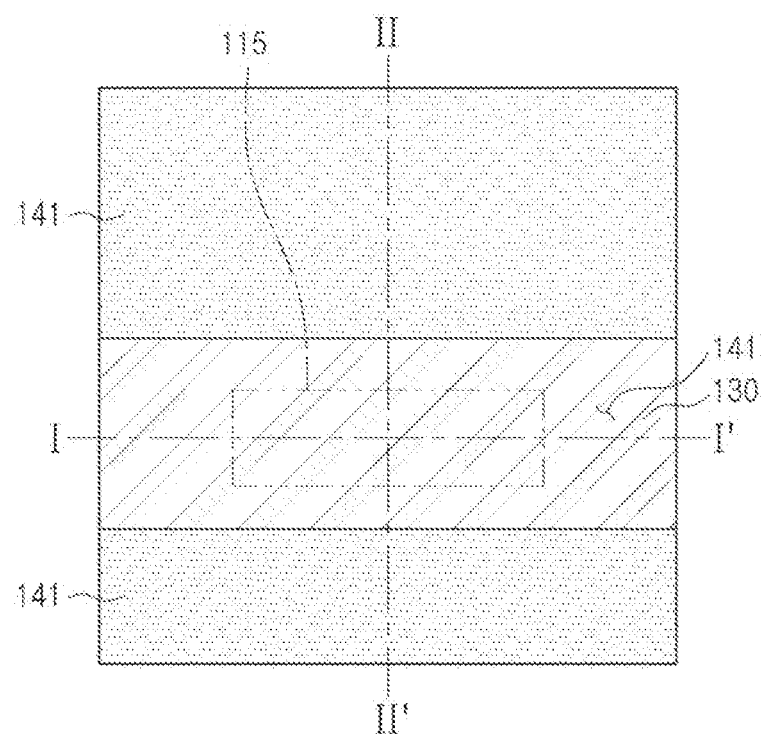
FIGS. 25A, 26A, 27A, 28A, 29A, 30A, 31A, and 32A are plan views of main processes of a method of manufacturing a semiconductor device according to some embodiments of the present inventive concepts.
Figure 25B:
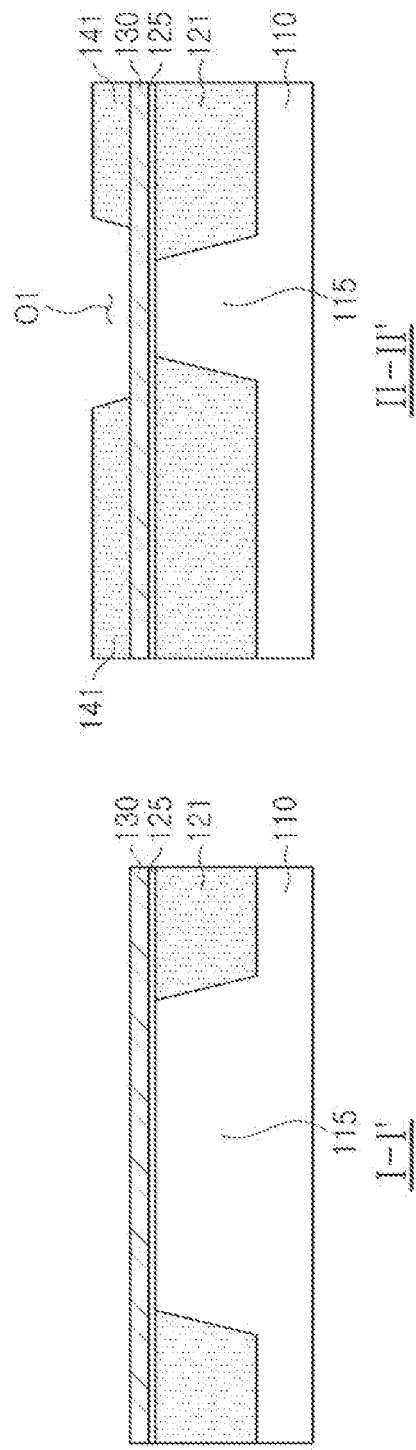
FIGS. 25B, 26B, 27B, 28B, 29B, 30B, 31B, and 32B are cross-sectional views of the plan views of FIGS. 25A, 26A, 27A, 28A, 29A, 30A, 31A, and 32A, taken along lines I'-I' and II'-II' respectively.

Referring to FIGS. 25A and 25B, a first gate insulating film 125 and a shared gate electrode 130 may be formed on an active region 115 of a substrate 110, and a device isolation film 121, and an interlayer insulating portion 141 may be formed on the gate electrode 130.

The interlayer insulating portion 141 may be formed to open an opening region O1 overlapping the active region 115 in a vertical direction or third direction (e.g., the Z direction). A width of a contact region (which may be, for example, a second channel region) between the gate semiconductor 130 and a cover semiconductor layer 155, which is formed in a subsequent process, in a second direction (e.g., the Y direction) may be set by the interlayer insulating portion 141. In addition, a distance between the shared gate electrode 130 and a second source/drain region (S2 and D2), which is formed in a subsequent process, and may be secured by a thickness of the interlayer insulating portion 141. For example, the interlayer insulating portion 141 may include an insulating material such as silicon oxide, silicon nitride, or silicon oxynitride.

Figure 26A:
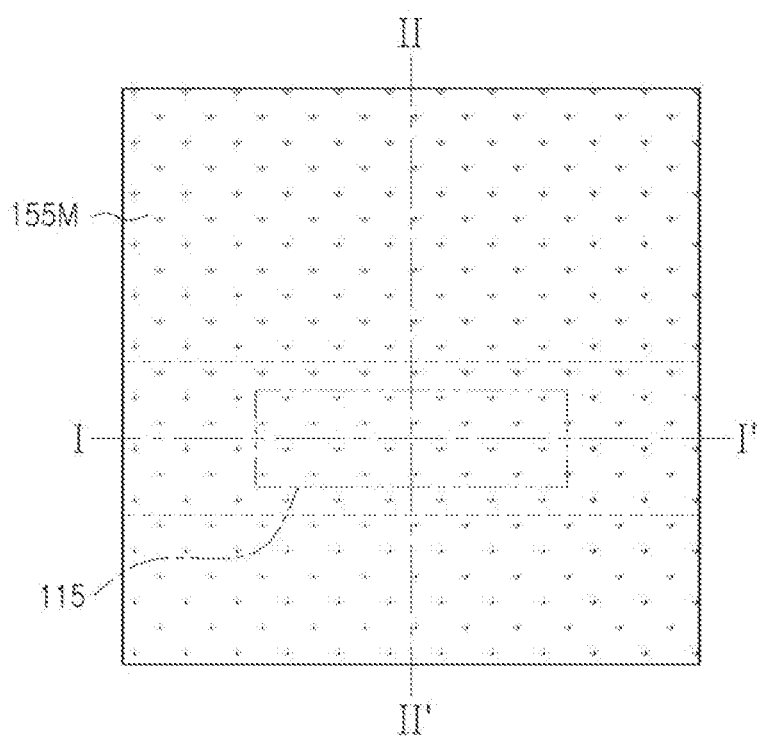
Figure 26B:
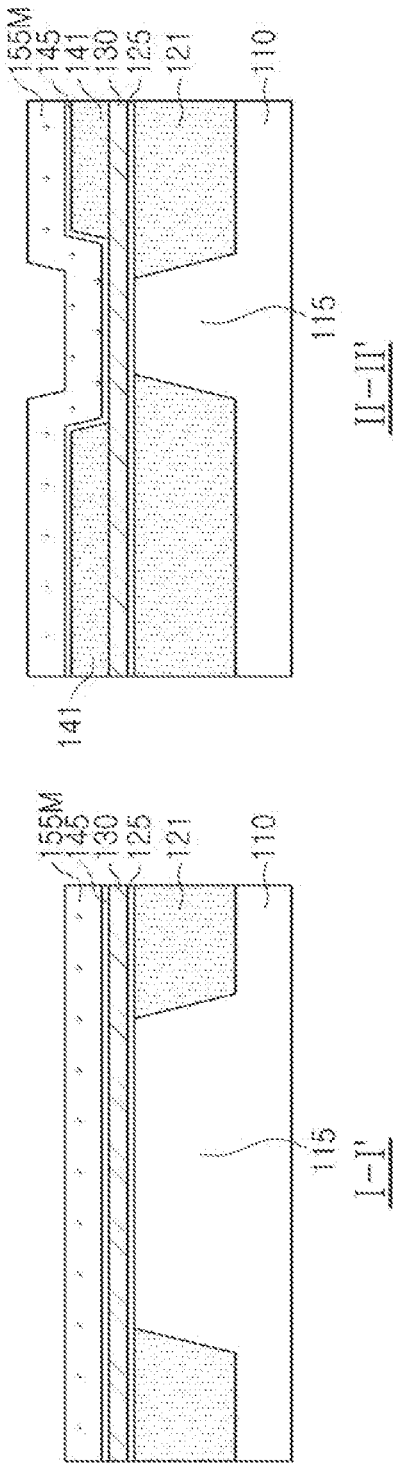

Next, referring to FIGS. 26A and 26B, a second gate insulating film 145 and an amorphous semiconductor layer 155M may be sequentially formed on the shared gate electrode 130 on which the interlayer insulating portion 141 is formed.

In the opening region O1 of the interlayer insulating portion 141, the second gate insulating film 145 may be formed to directly contact the shared gate electrode 130. A portion of the second gate insulating film 145 may be disposed on the interlayer insulating portion 141. The amorphous semiconductor layer 155M may be disposed on the second gate insulating film 145.

Figure 27A:
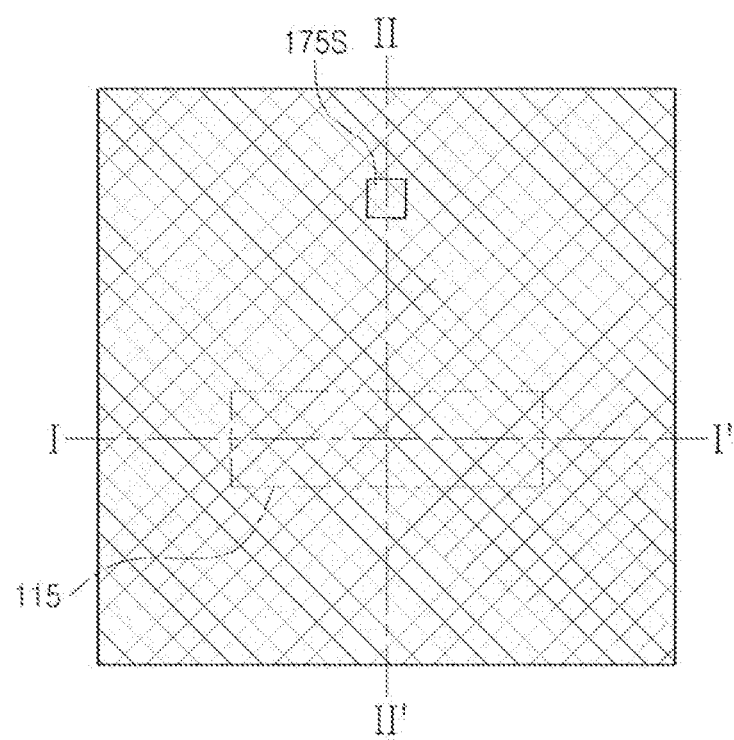
Figure 27B:
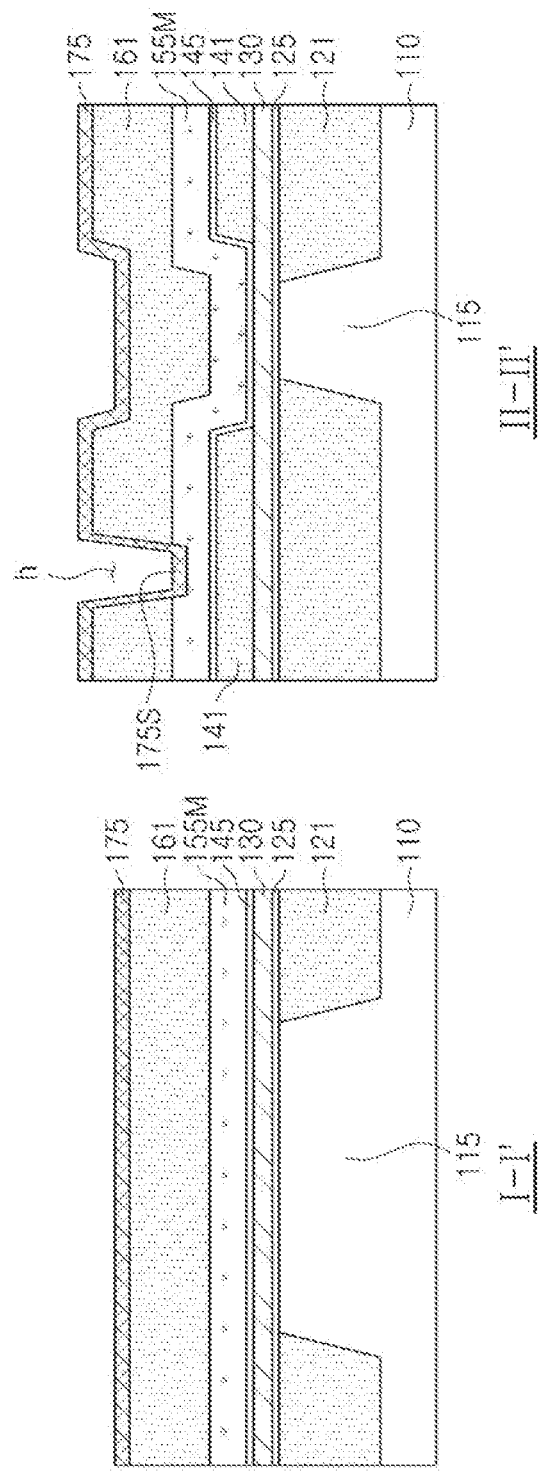

Subsequently, referring to FIGS. 27A and 27B, a first insulating layer 161 having an opening h via which a portion of the amorphous semiconductor layer 155M is exposed may be formed on the amorphous semiconductor layer 155M, and a metal layer 175 may be formed on the first insulating layer 161.

In some embodiments, a single crystal layer (i.e., a cover semiconductor layer (see 155 in FIG. 20B)) forming a channel region may be formed using a MILC process. The first insulating layer 161 having the opening h via which a portion of the amorphous semiconductor layer 155M is exposed may be formed. The metal layer 175 may be formed on the first insulating layer 161. A metal seed layer 175S, which may be a portion of the metal layer 175, may be connected to the amorphous semiconductor layer 155M through the exposed opening h.

Figure 28A:
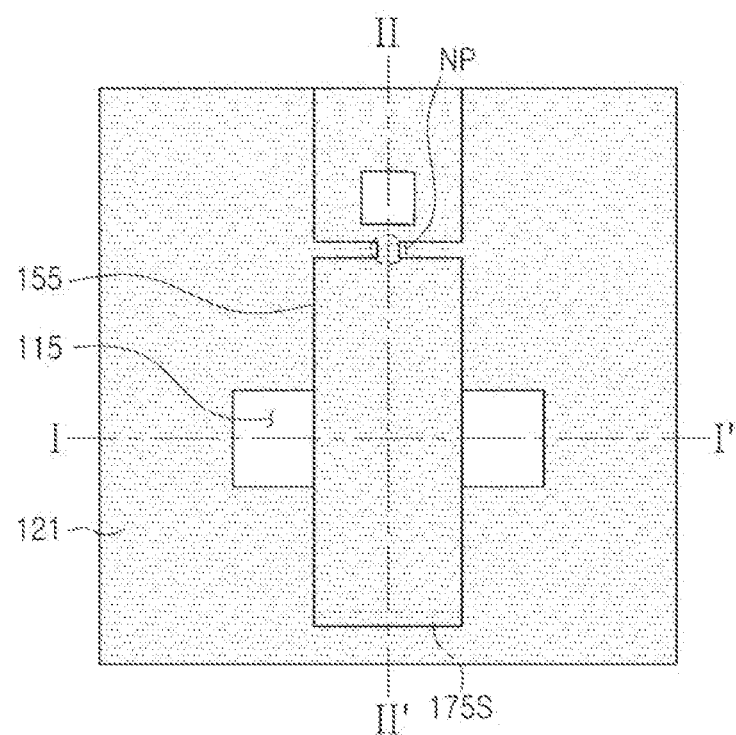
Figure 28B:
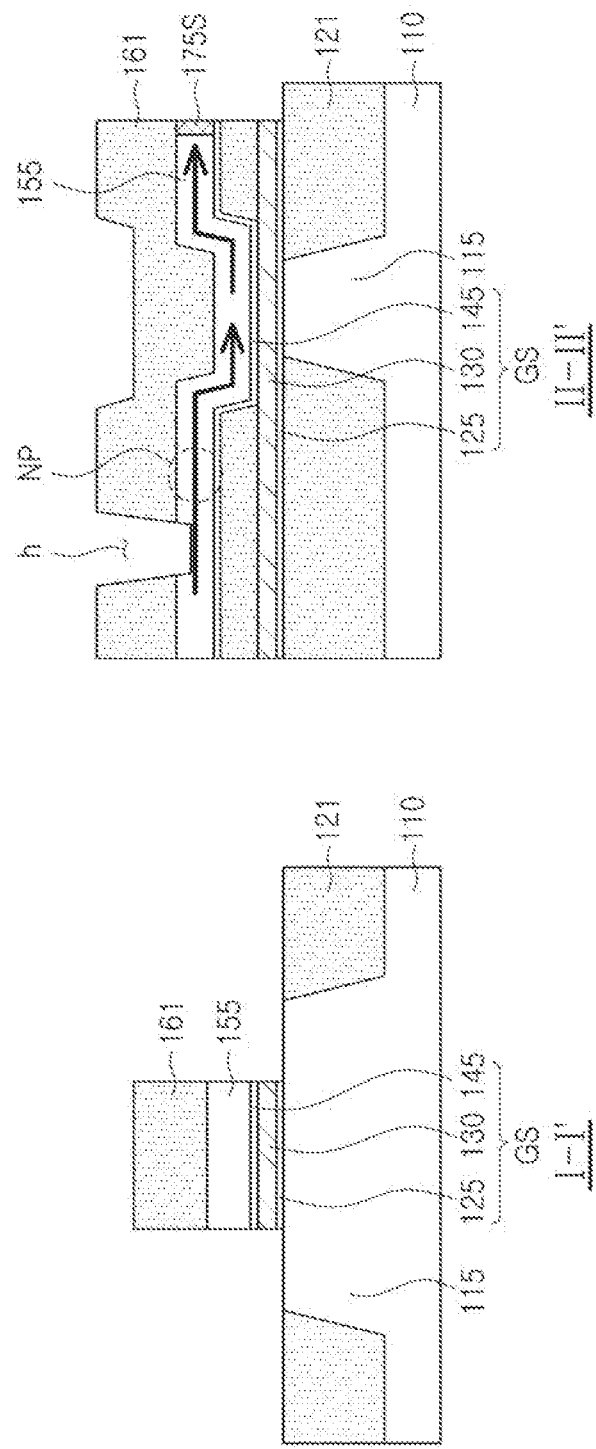

Next, referring to FIGS. 28A and 28B, a gate structure GS and the amorphous semiconductor layer 155M may be patterned, and an annealing process using the metal seed layer 175S may be applied to crystallize the amorphous semiconductor layer 155M.

In this patterning process, a portion of the active region 115 on first and second sides of the patterned gate structure GS may be exposed, similar to the process described with reference to FIGS. 19A and 19B. The exposed portion of the active region 115 may be provided as a region for a first source/drain region (S1 and D1). The amorphous semiconductor layer 155M may have a neck portion NP that is adjacent to the opening h. The neck portion MP may have a width that is narrower than a width of a remaining portion of the amorphous semiconductor layer 155M.

Subsequently, an annealing process may be applied. In this annealing process, the metal seed layer 175S may be moved in the amorphous semiconductor layer 155M to crystallize the amorphous semiconductor layer 155M, to form a cover semiconductor layer 155. After the annealing is completed, the metal seed layer 175S may remain on one end of the cover semiconductor layer 155.

Figure 29A:
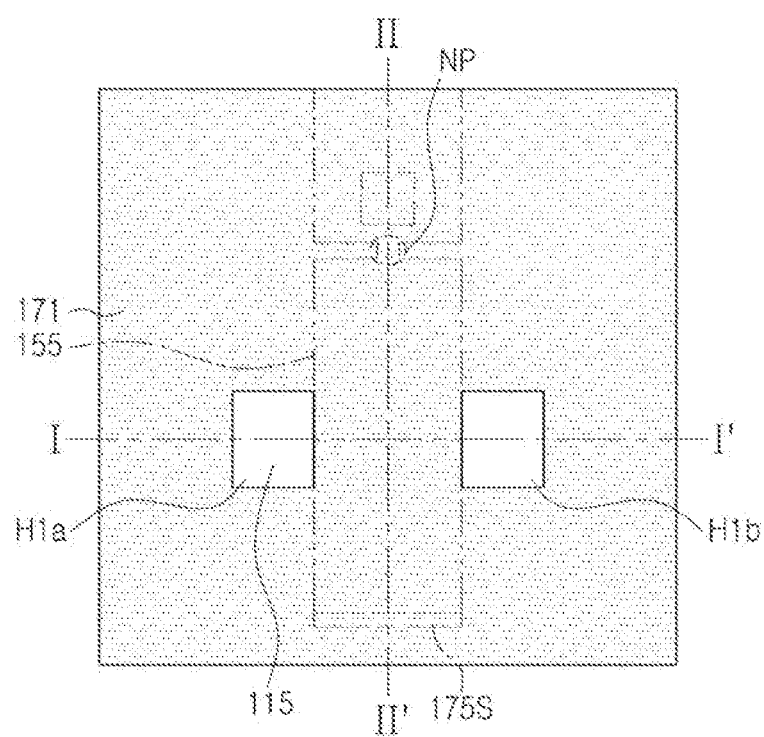
Figure 29B:
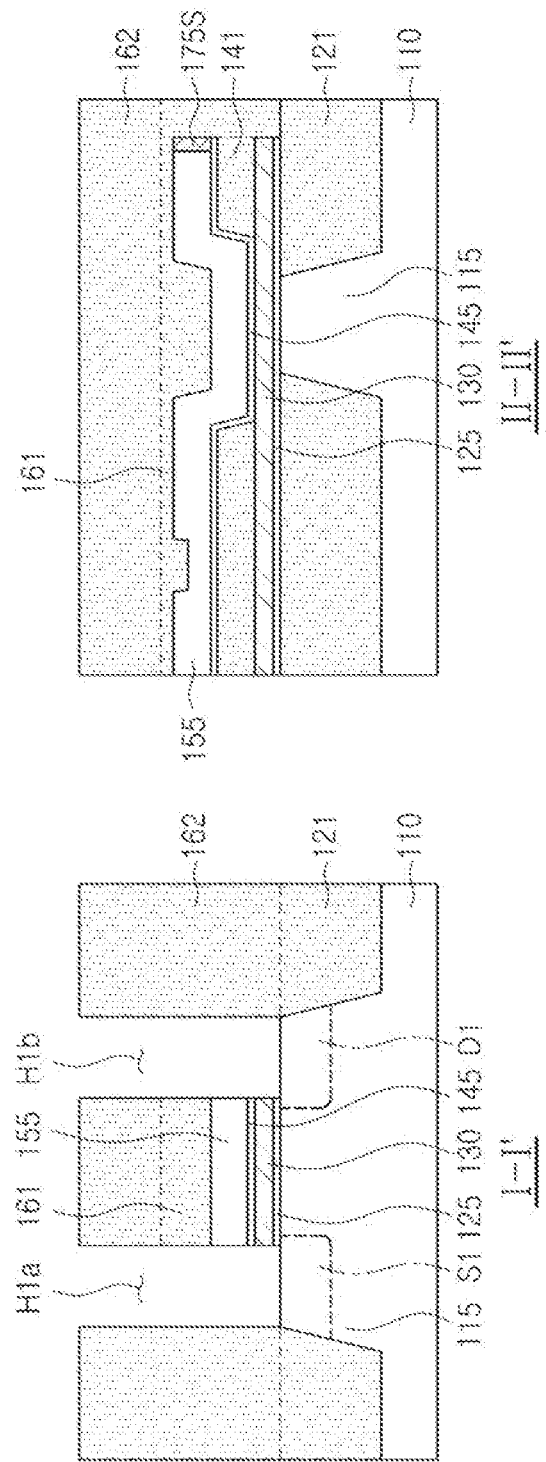

Next, referring to FIGS. 29A and 29B, a first source/drain region (S1 and D1) may be formed in the active region 115 that is exposed through first openings H1a and H1b.

This process may be performed by forming a second insulating layer 162 on the first insulating layer 161 to embed or fill the opening h of the first insulating layer 161 after the process illustrated in FIGS. 28A and 28B, and forming the first openings H1a and H1b in the first and second insulating layers 161 and 162 to expose the active region 115. Next, the first source/drain region (S1 and D1) may be formed in the active region 115 exposed through the first openings H1a and H1b using an ion implantation process.

Figure 30A:
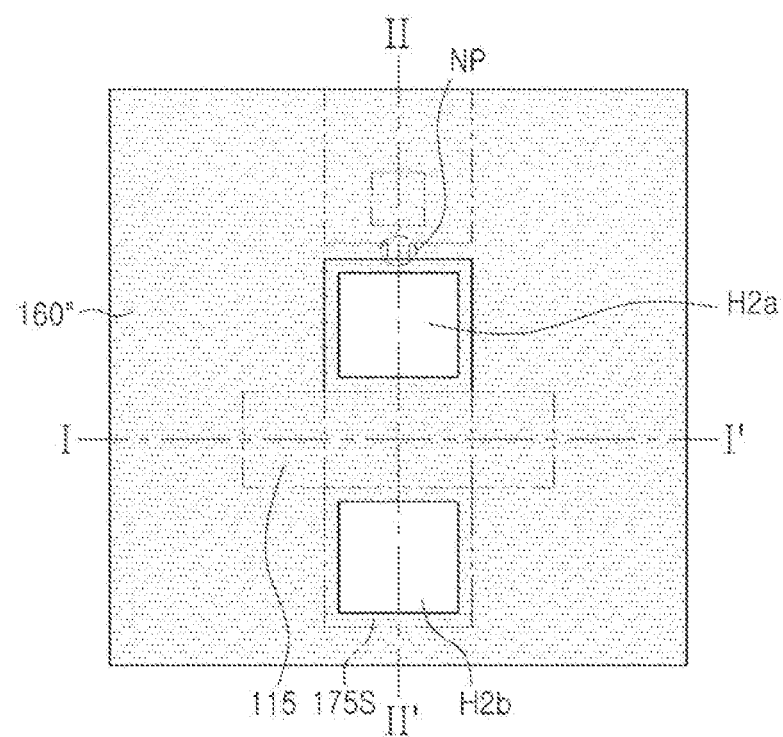
Figure 30B:
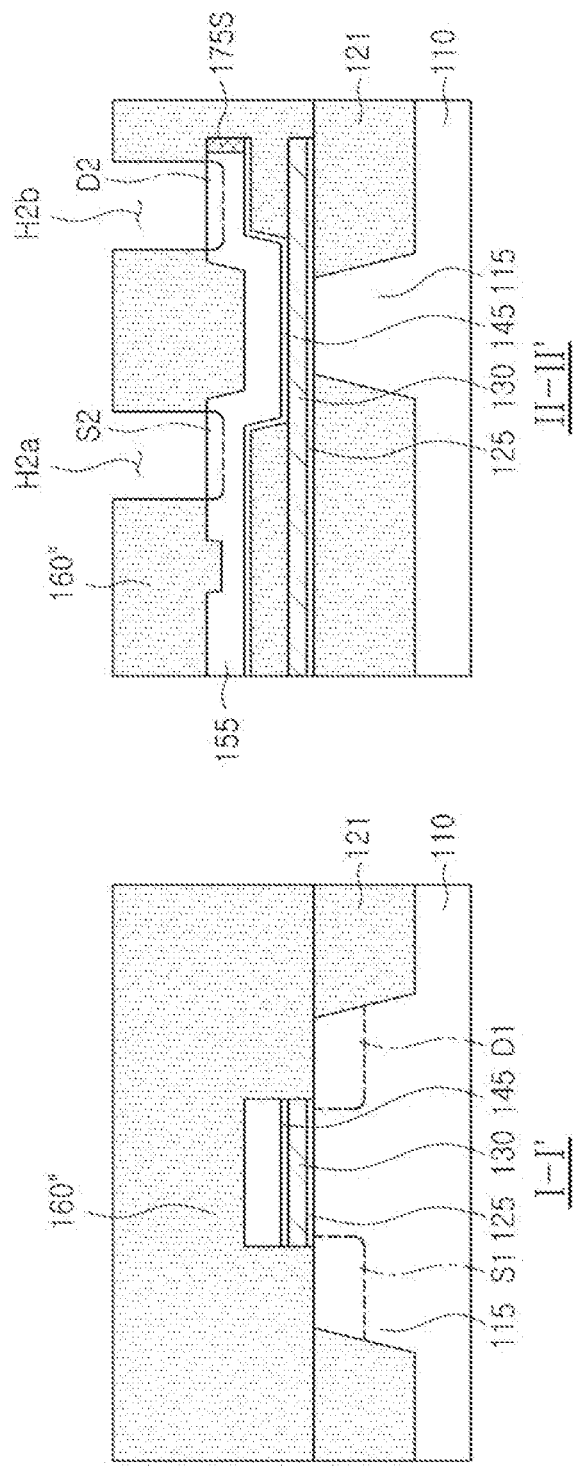

Next, referring to FIGS. 30A and 30B, a second source/drain region (S2 and D2) may be formed on the cover semiconductor layer 155 exposed through second openings H2a and H2b.

This process may be performed by preparing an insulating portion 160" by forming a further insulating layer to embed or fill the first openings H1a and H1b after the process illustrated in FIGS. 29A and 29B, and, after a polishing process is performed, forming the second openings H2a and H2b on the insulating portion 160" to expose the cover semiconductor layer 155. Next, the second source/drain region (S2 and D2) may be formed in the cover semiconductor layer 155 exposed through the second openings H2a and H2b using the ion implantation process.

Figure 31A:
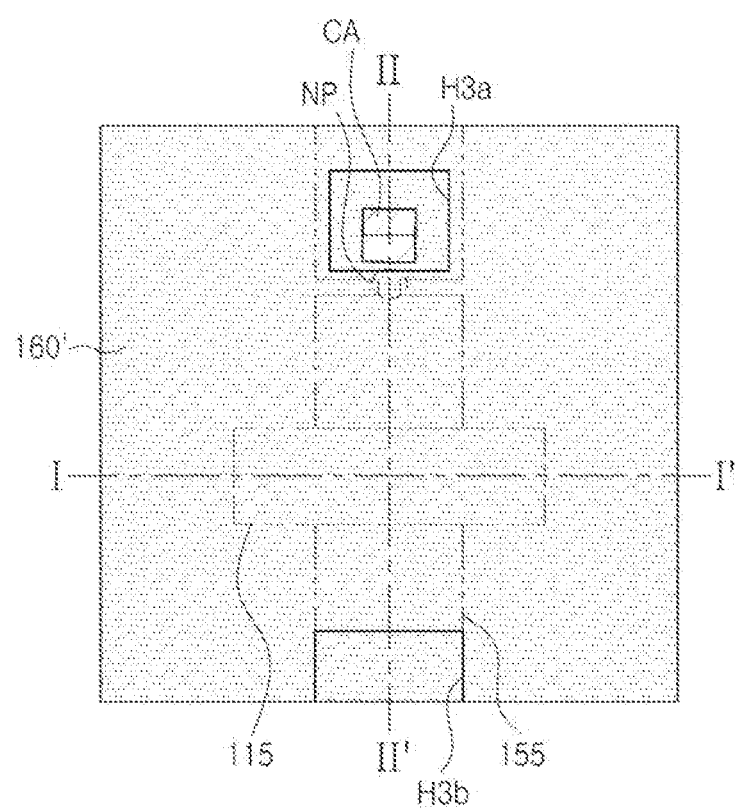
Figure 31B:
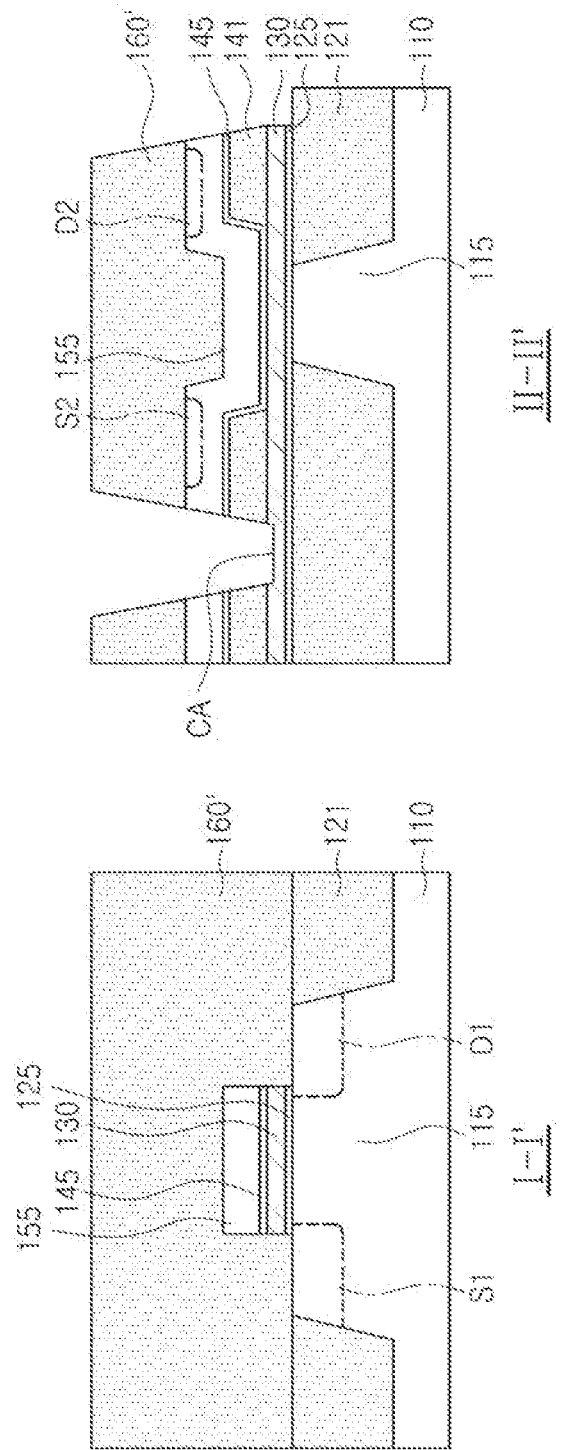

Next, referring to FIGS. 31A and 31B, the cover semiconductor layer 155 may be partially etched to expose a contact region CA of the gate electrode 145.

In this process, an insulating portion 160' may be polished to expose an upper surface of the cover semiconductor layer 155. Subsequently, the contact region of the gate electrode 145 may be exposed by partially etching the cover semiconductor layer 155. Through the partial etching, an end portion of the cover semiconductor layer 155 in which remaining portion of the metal seed layer 175S is located may also be removed.

Figure 32A:
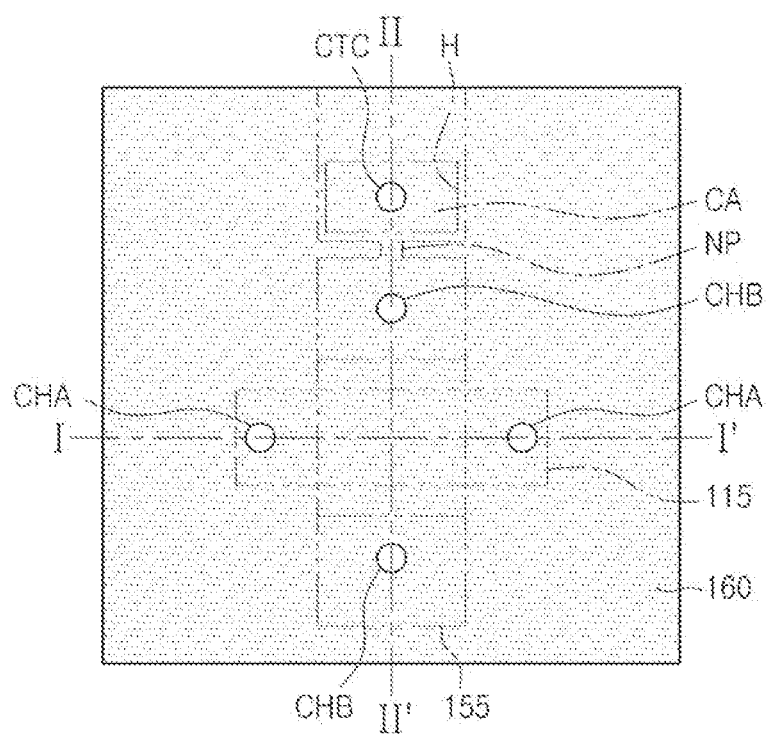
Figure 32B:
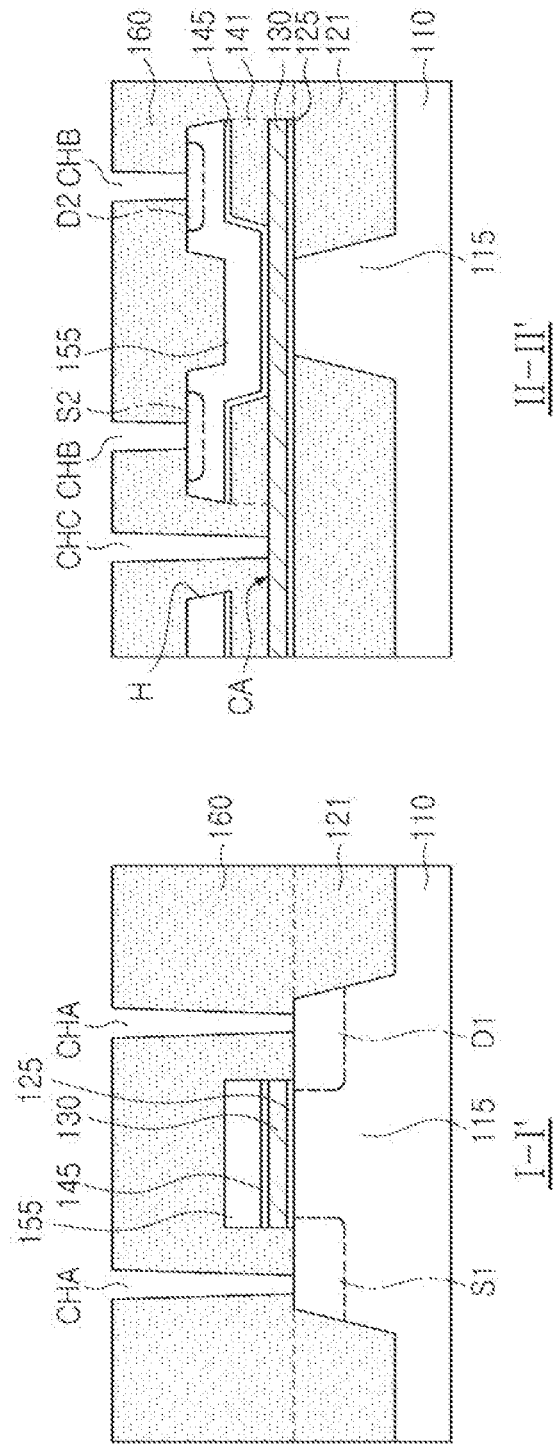

Next, referring to FIGS. 32A and 32B, after forming an insulating portion 160 to cover the cover semiconductor layer 155, contact openings CHA, CHB, and CHC in which the first and second source/drain regions (S1 and D1, and S2 and D2) and the contact region CA of the gate electrode 145 are open may be formed in the insulating portion 160.

Additionally, a shared gate contact CT3 and first and second source/drain contacts CT1a, CT1b, CT2a, and CT2b may be formed in the contact openings CHA, CHB, and CHC, respectively, to prepare the semiconductor device 100B illustrated in FIGS. 11, 12A, and 12B.

FIGS. 33A, 34A, 35A, 36A, 37A, 38A, 39A, and 40A are plan views of main processes of a method of manufacturing a semiconductor device according to some embodiments of the present inventive concepts, and FIGS. 33B, 34B, 35B, 36B, 37B, 38B, 39B, and 40B are cross-sectional views of the plan views of FIGS. 33A, 34A, 35A, 36A, 37A, 38A, 39A, and 40A, taken along lines I-I' and II-II', respectively.

The processes of manufacturing a semiconductor device illustrated in FIGS. 33A to 40B can be understood as processes within a method of manufacturing the semiconductor device 100D illustrated in FIGS. 15, 16A, and 16B. Specifically, FIGS. 33A, 34A, 35A, 36A, 37A, 38A, 39A, and 40A correspond to the plan view of FIG. 15, and the two (2) cross-sectional views in FIGS. 33B, 34B, 35B, 36B, 37B, 38B, 39B, and 40B, respectively, correspond to the cross-sectional view of FIG. 16A and the cross-sectional view of FIG. 16B, respectively.

Figure 33A:
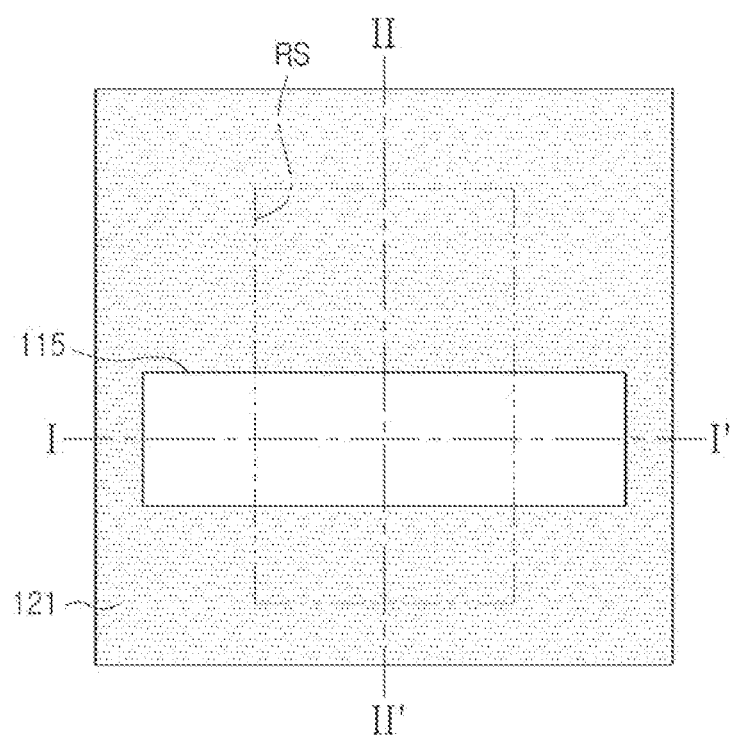
FIGS. 33A, 34A, 35A, 36A, 37A, 38A, 39A, and 40A are plan views of main processes of a method of manufacturing a semiconductor device according to some embodiments of the present inventive concepts.
Figure 33B:
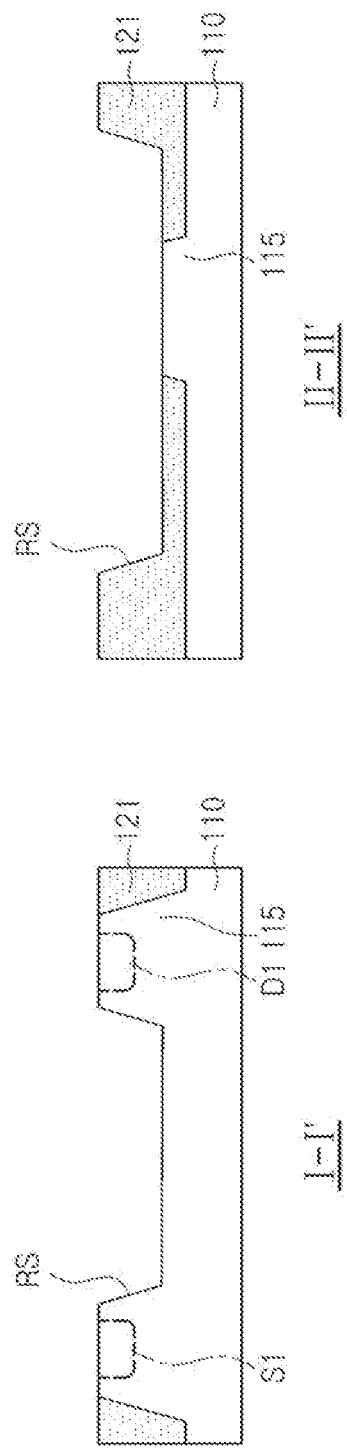
FIGS. 33B, 34B, 35B, 36B, 37B, 38B, 39B, and 40B are cross-sectional views of the plan views of FIGS. 33A, 34A, 35A, 36A, 37A, 38A, 39A, and 40A, taken along lines I'-I' and II'-II' respectively.

Referring to FIGS. 33A and 33B, an active region 115 defined by a device isolation film 121 may be formed on a substrate 110, and a recess RS may be formed in the active region 115 and a portion of the device isolation film 121. Subsequently, a first source/drain region (S1 and D1) may be formed on an upper end of the active region located around the recess RS.

Figure 34A:
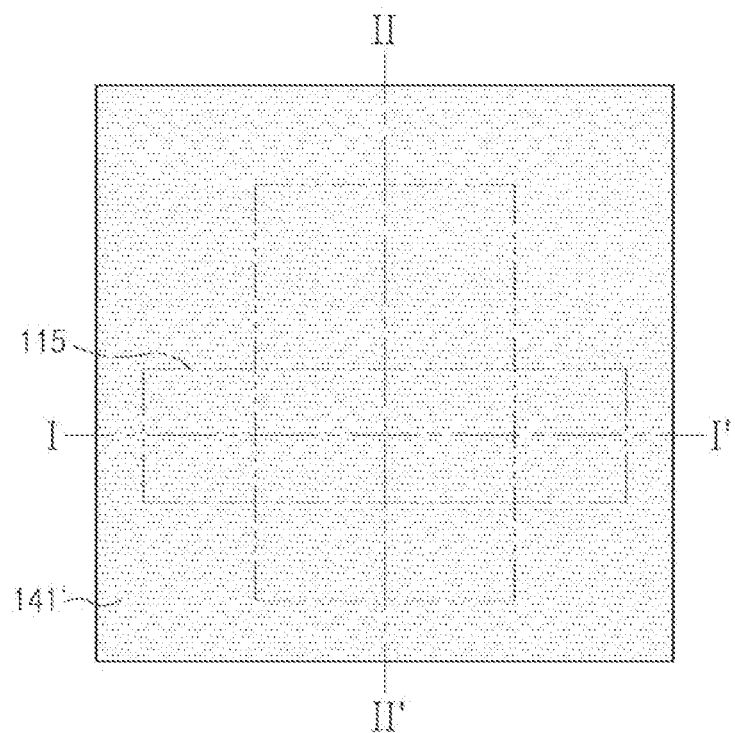
Figure 34B:
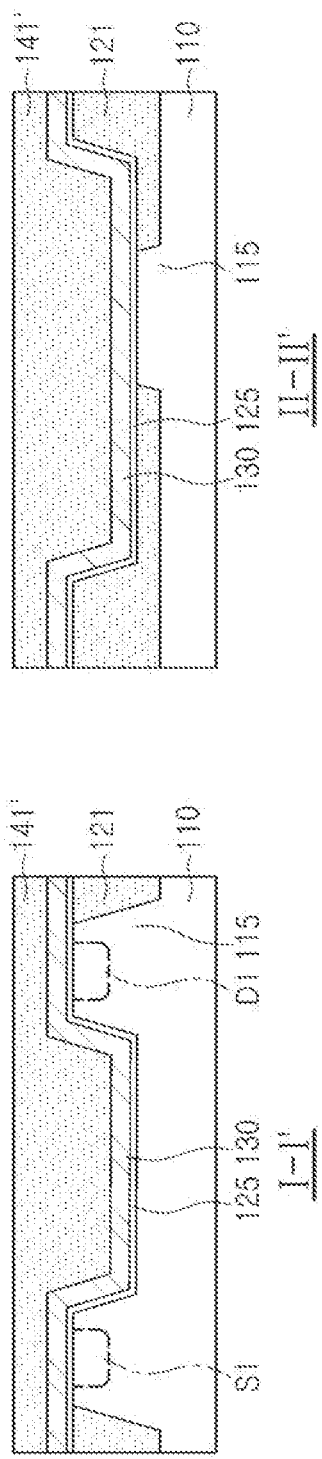

Next, referring to FIGS. 34A and 34B, a first gate insulating film 125 and a shared gate electrode 130 may be formed on the active region 115 and the device isolation film 121, in which the recess RS is formed, and, as illustrated in FIGS. 34A and 34B, an interlayer insulating layer 141' may be formed on the shared gate electrode 130.

The first gate insulating film 125 and the shared gate electrode 130 may be arranged in the recess RS, and may also extend onto the active region 115 and the device isolation film 121, located around the recess RS. The interlayer insulating layer 141' may be formed on the shared gate electrode 130. In some embodiments, the interlayer insulating layer 141' may have a flat upper surface.

Figure 35A:
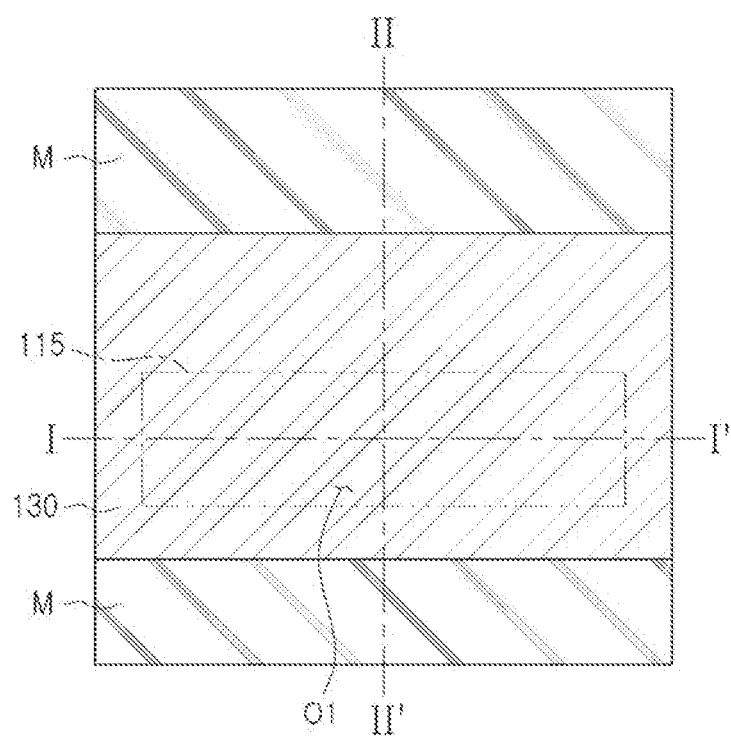
Figure 35B:
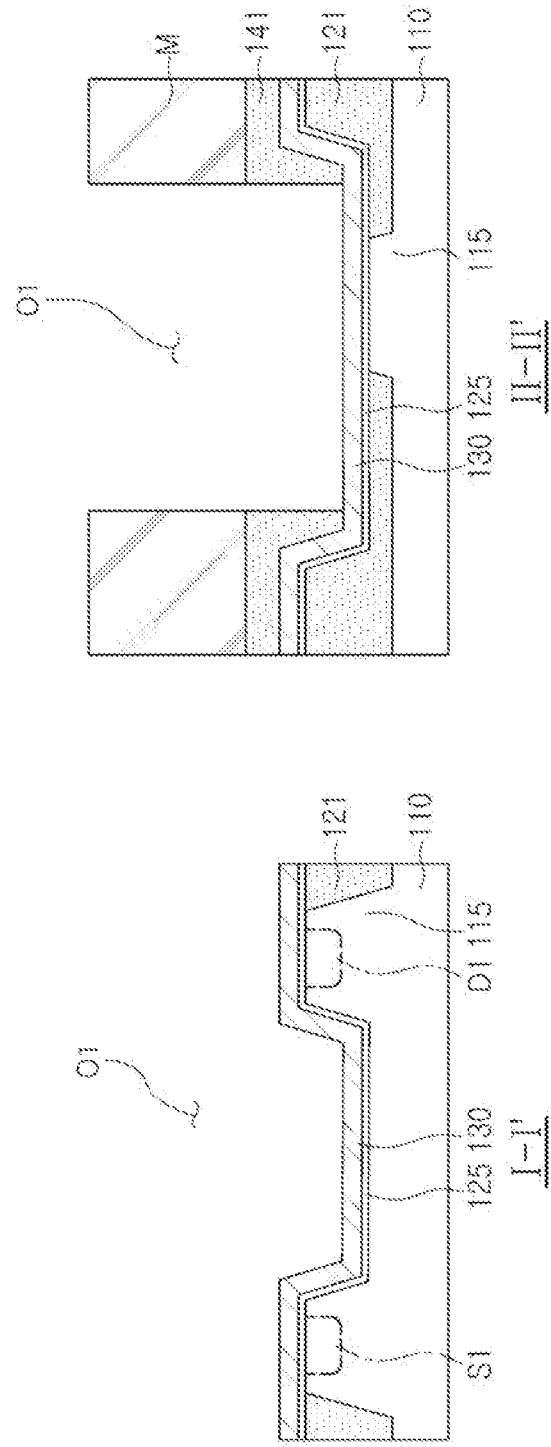

As illustrated in FIGS. 35A and 35B, a mask pattern M in which an opening region O1 overlapping the active region 115 may be formed on the interlayer insulating layer 141', and an interlayer insulating portion 141 may be formed by etching using the mask pattern M. A distance between the shared gate electrode 130 and a second source/drain region (S2 and D2), which is formed in a subsequent process, may be secured by a thickness of the interlayer insulating portion 141. By performing the etching process with anisotropic etching, a distance between the first source/drain region (S1 and D1) and the cover semiconductor layer 155, which is formed in a subsequent step (in a diagonal direction in the right cross-sectional view in FIG. 35B) may additionally increase.

Figure 36A:
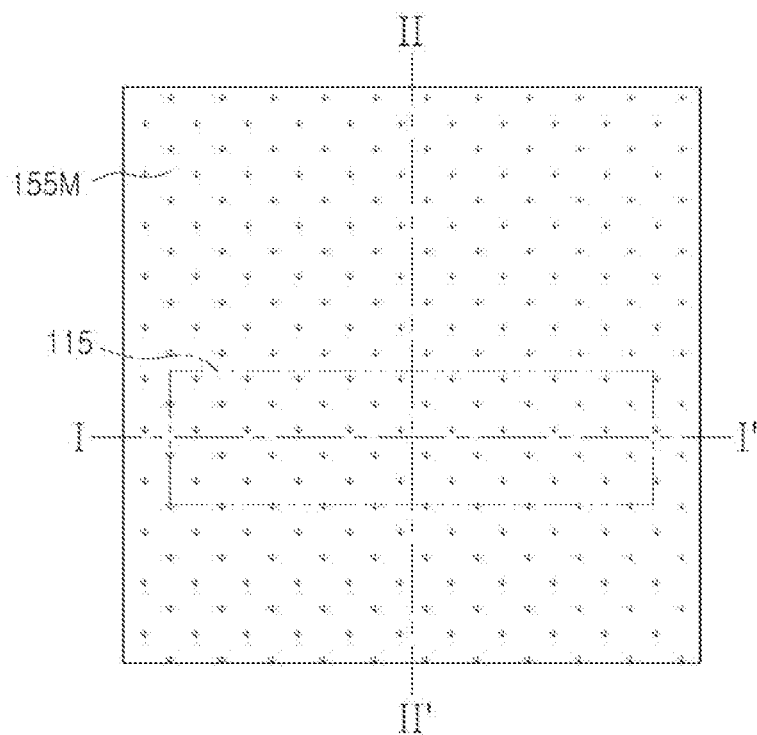
Figure 36B:
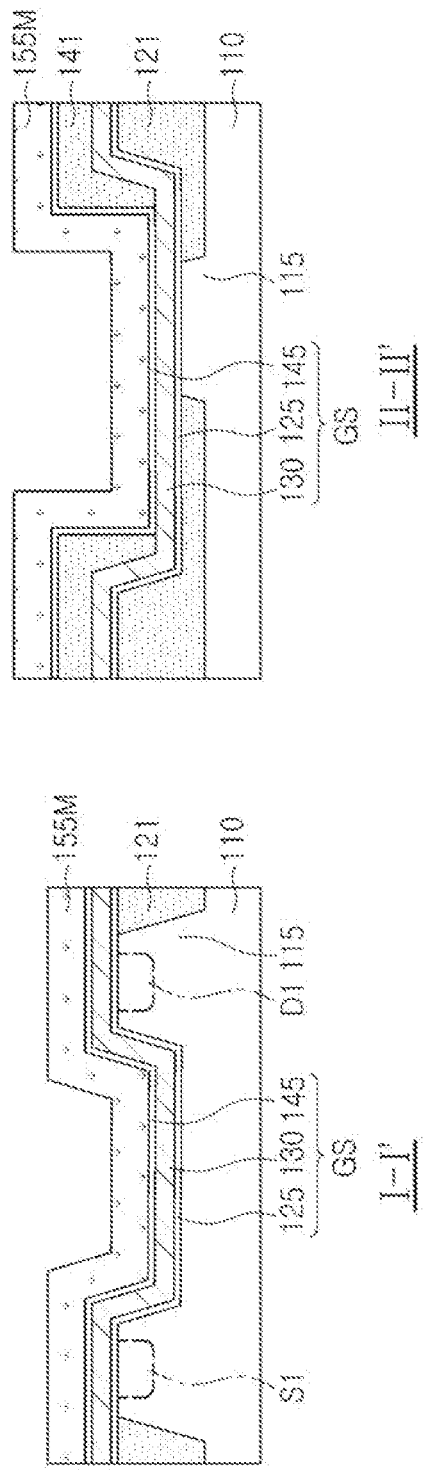

Next, referring to FIGS. 36A and 36B, a second gate insulating film 145 and an amorphous semiconductor layer 155M may be sequentially formed on the shared gate electrode 130 on which the interlayer insulating portion 141 is formed.

In the opening region O1 of the interlayer insulating portion 141, the second gate insulating film 145 may be formed to directly contact the shared gate electrode 130. A portion of the second gate insulating film 145 may be on the interlayer insulating portion 141. The amorphous semiconductor layer 155M may be on the second gate insulating film 145.

Figure 37A:
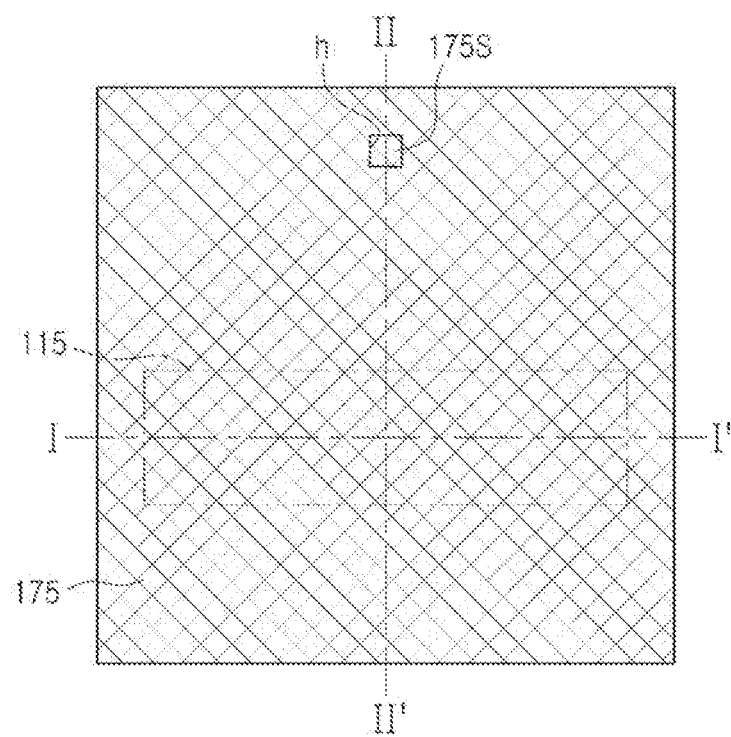
Figure 37B:
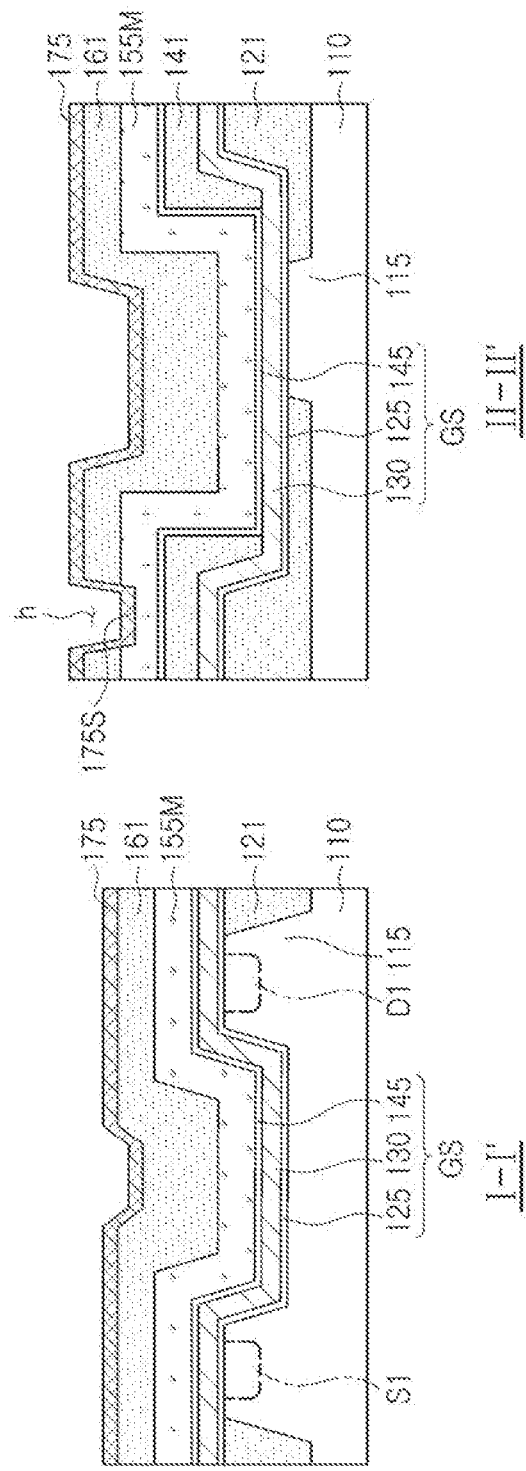

Next, referring to FIGS. 37A and 37B, a first insulating layer 161 having an opening h by which a portion of the amorphous semiconductor layer 155M is exposed may be formed on the amorphous semiconductor layer 155M, and a metal layer 175 may be formed on the first insulating layer 161.

In some embodiments, a single crystal layer (which may be, for example, a cover semiconductor layer (see 155 in FIG. 20B)) forming a channel region may be formed using a MILC process. The first insulating layer 161 having the opening h by which a portion of the amorphous semiconductor layer 155M is exposed may be formed, and the metal layer 175 may be formed on the first insulating layer 161. A metal seed layer 175S, which may be a portion of the metal layer 175, may be connected to the amorphous semiconductor layer 155M through the exposed opening h.

Figure 38A:
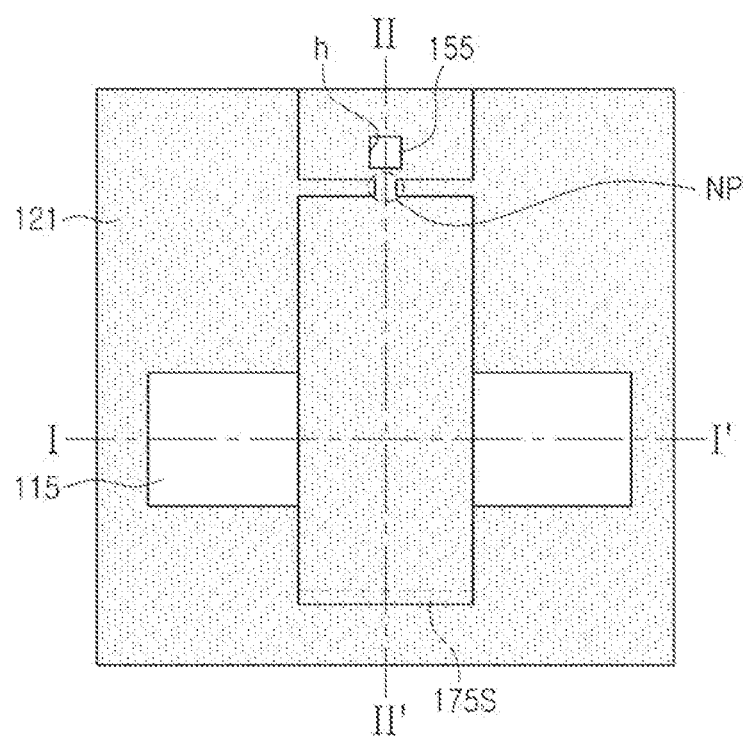
Figure 38B:
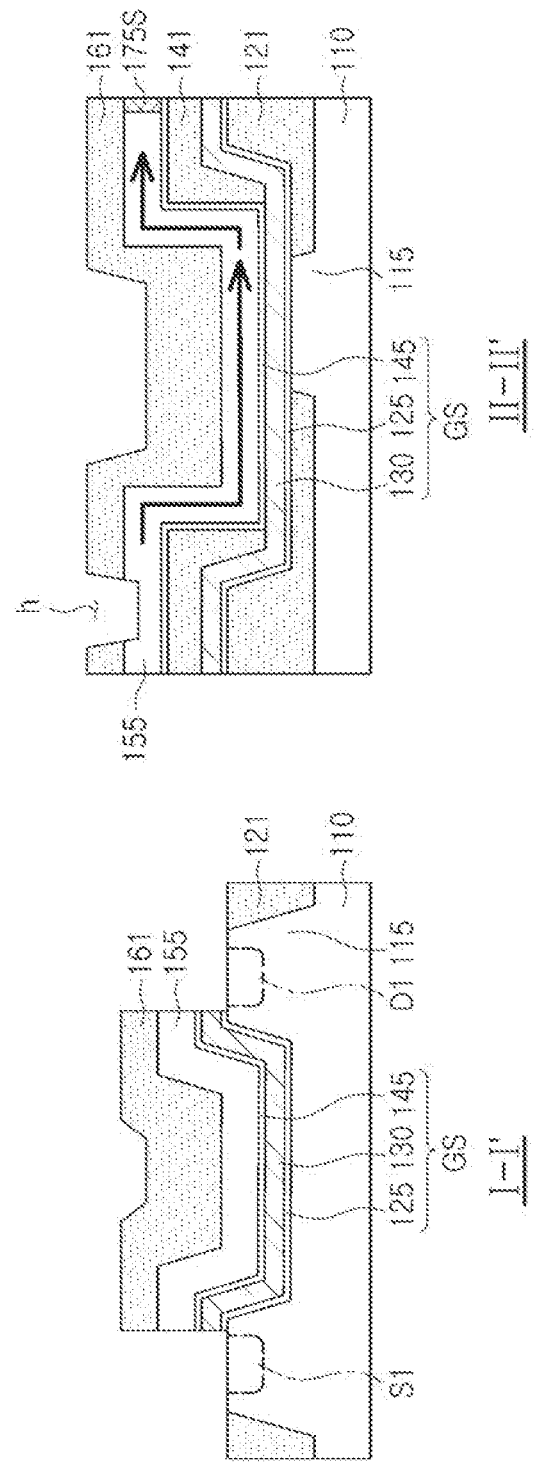

Next, referring to FIGS. 38A and 38B, a gate structure GS and the amorphous semiconductor layer 155M may be patterned, and an annealing process using the metal seed layer 175S may be applied to crystallize the amorphous semiconductor layer 155M.

In this patterning, a portion of the active region 115 on first and second sides of the patterned gate structure GS may be exposed, similar to the processes described with reference to FIGS. 19A and 19B. The exposed portion of the active region 115 may be provided as a region for a first source/drain region (S1 and D1). The amorphous semiconductor layer 155M may have a neck portion NP adjacent to the opening h. The neck portion NP may have a width that narrower than a width of a remaining portion of the amorphous semiconductor layer 155M. Subsequently, an annealing process may be applied. In this annealing, the metal seed layer 175S may be moved in the amorphous semiconductor layer 155M to crystallize the amorphous semiconductor layer 155M, to form a cover semiconductor layer 155. After the annealing is completed, the metal seed layer 175S may remain on one end of the cover semiconductor layer 155.

Figure 39A:
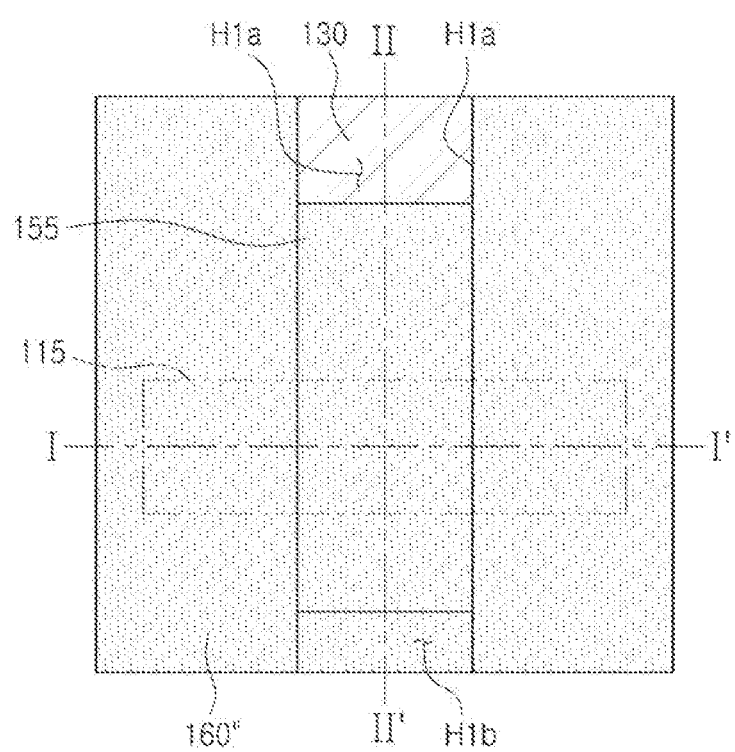
Figure 39B:
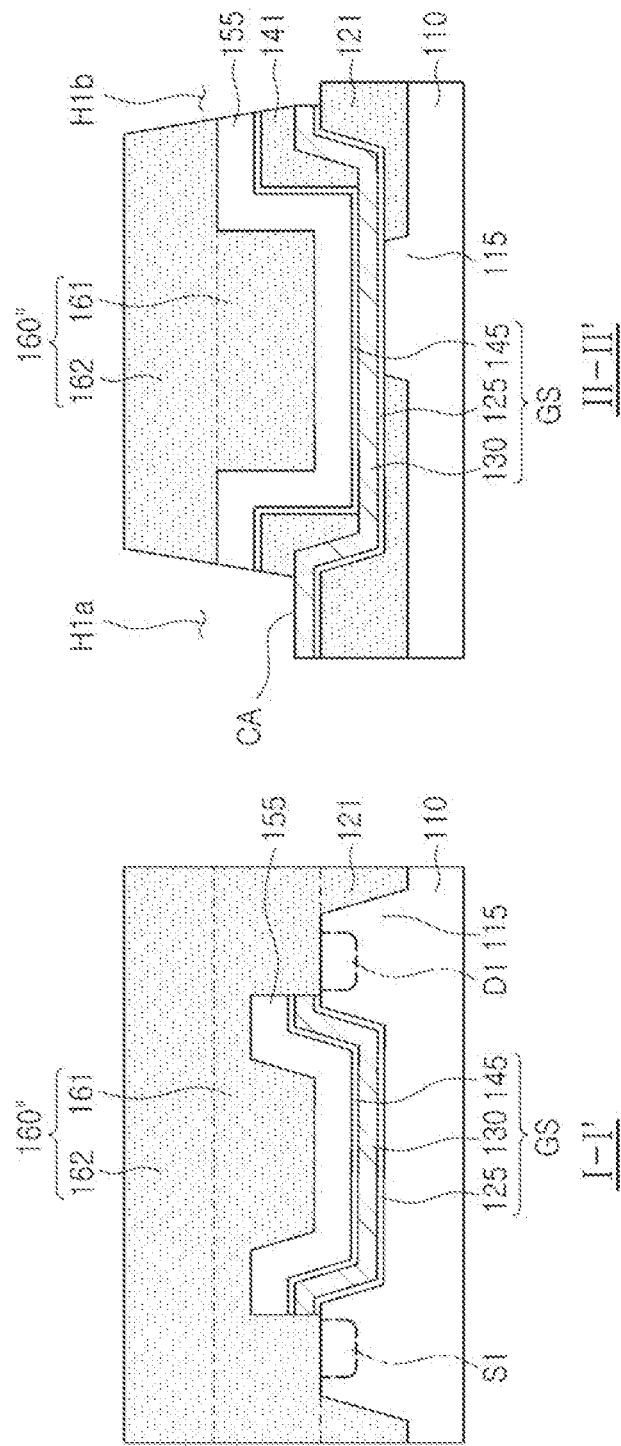

Next, referring to FIGS. 39A and 39B, the cover semiconductor layer 155 may be partially etched to expose a contact region CA of the gate electrode 145.

In this process, an insulating portion 160' may be polished to expose an upper surface of the cover semiconductor layer 155. Subsequently, as indicated by H1a, the contact region CA of the gate electrode 145 may be exposed by partially etching the cover semiconductor layer 155. In some embodiments, in the process of exposing the contact region CA, a portion of the cover semiconductor layer 155 in which the neck portion NP is located may be removed. In addition, through the partial etching, an end portion of the cover semiconductor layer 155 in which remaining portion of the metal seed layer 175S is located may also be removed (indicated by H1b).

Figure 40A:
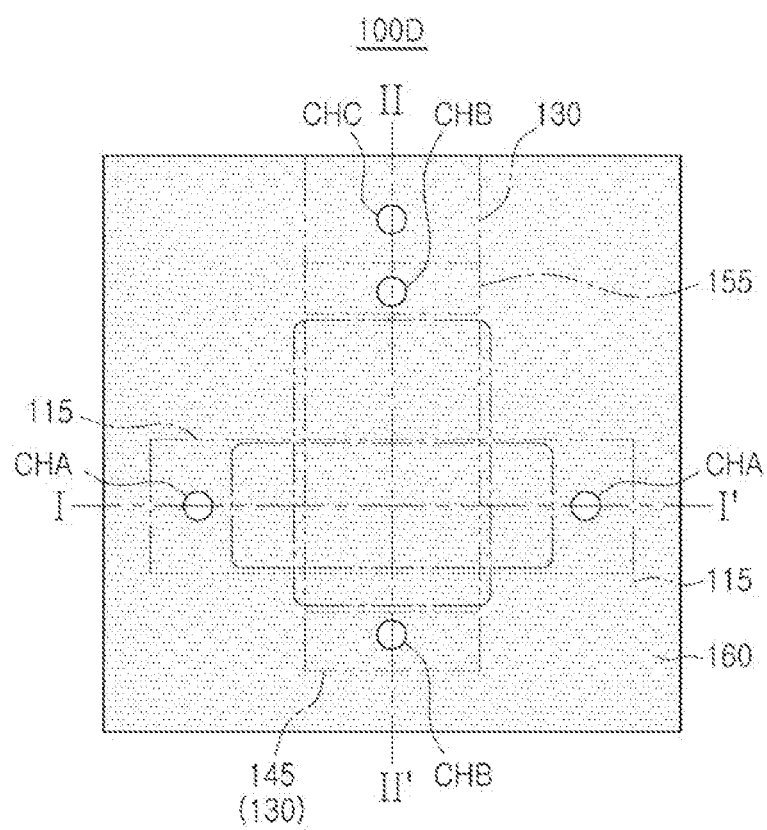
Figure 40B:
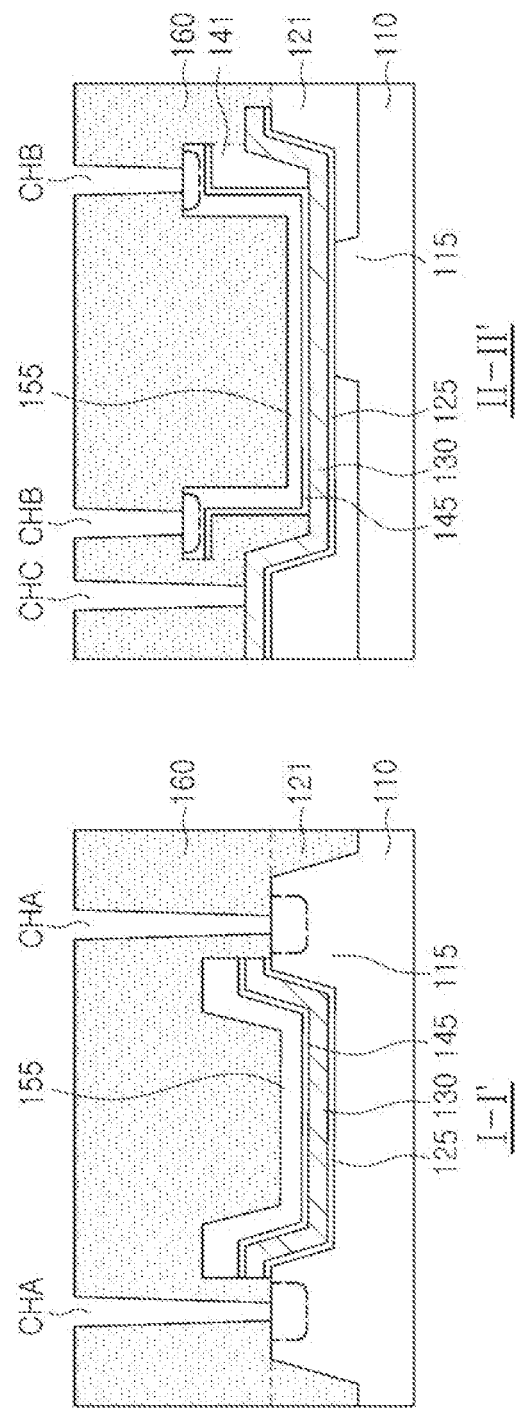

Next, referring to FIGS. 40A and 40B, a second source/drain region (S2 and D2) may be formed on the cover semiconductor layer 155 that is exposed through the second openings H2a and H2b, an insulating portion 160 may be formed to cover the cover semiconductor layer 155, and contact openings CHA, CHB, and CHC in which the first and second source/drain regions (S1 and D1, and S2 and D2) and the contact region CA of the gate electrode 145 are open may be formed in the insulating portion 160.

Additionally, a shared gate contact CT3 and first and second source/drain contacts CT1a, CT1b, CT2a, and CT2b may be formed in the contact openings CHA, CHB, and CHC, respectively, to prepare the semiconductor device 100D illustrated in FIGS. 15, 16A, and 16B.

Areas of channel regions of upper and lower transistors may be variously changed, and in some embodiments, a position of the gate contact for the shared gate electrode may also be changed.

Figure 41:
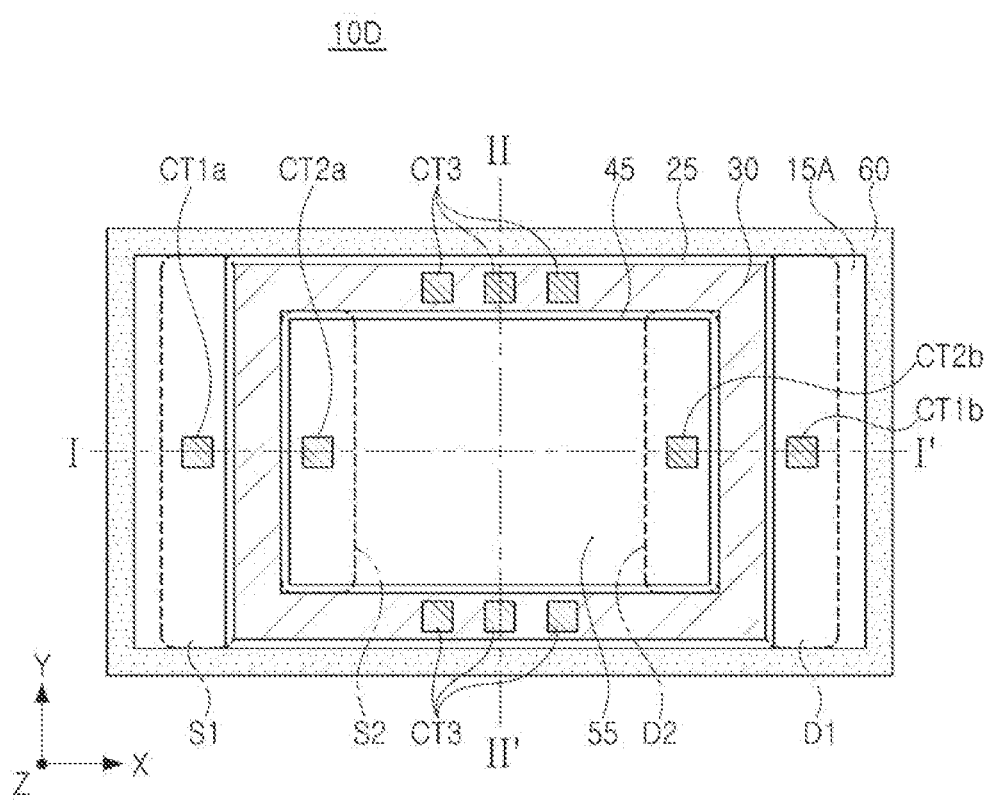
FIG. 41 is a plan view illustrating a semiconductor device according to some embodiments of the present inventive concepts.
Figure 42A:
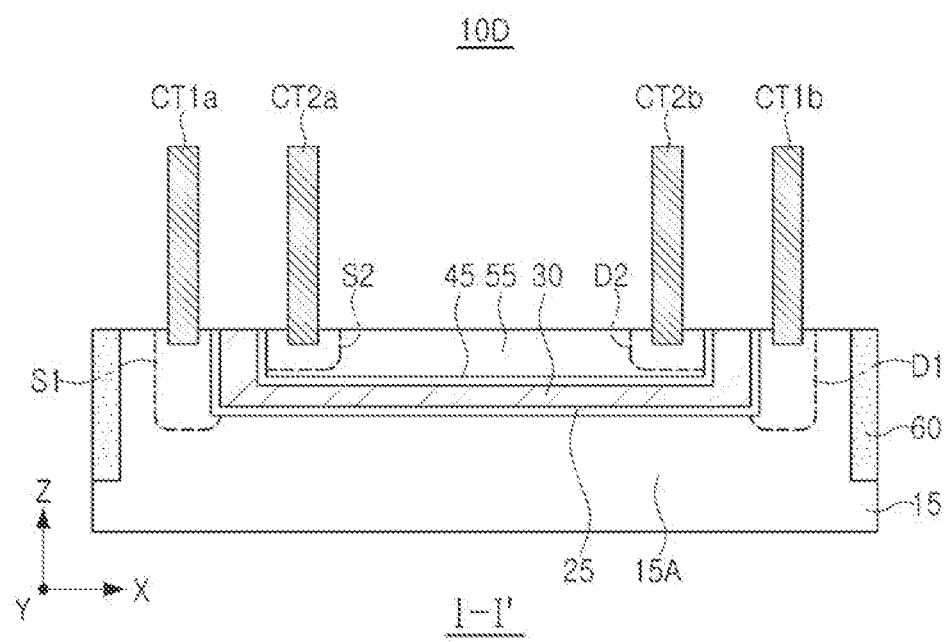
FIGS. 42A and 42B are cross-sectional side views of the semiconductor device of FIG. 41, taken along lines I'-I' and II'-II' respectively.
Figure 42B:
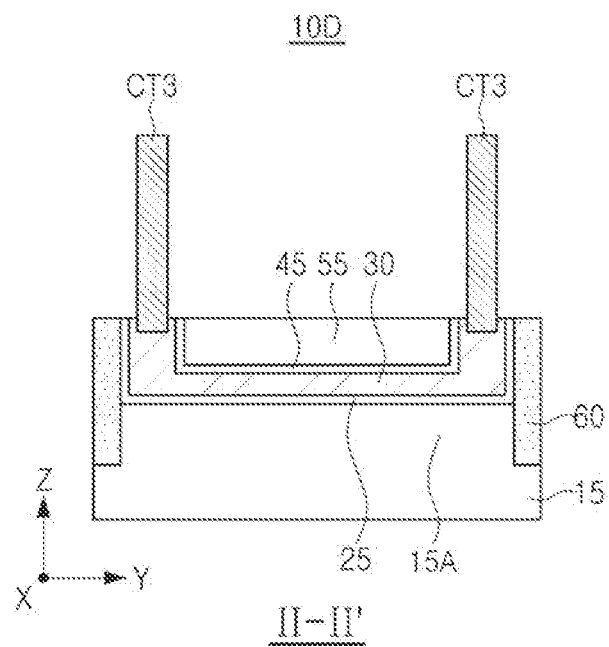

FIG. 41 is a plan view illustrating a semiconductor device according to some embodiments of the present inventive concepts, and FIGS. 42A and 42B are cross-sectional side views of the semiconductor device of FIG. 41, taken along lines I'-I' and II'-II' respectively.

Referring to FIGS. 41, 42A, and 42B, a semiconductor device 10D according to some embodiments can be understood as being similar to the semiconductor device 10B illustrated in FIGS. 3A and 3B, except that an insulation portion 60 may be used to have a relatively small area of an active region 15A of a first semiconductor layer 15. Components described with reference to the semiconductor device 10D illustrated in FIGS. 41, 42A, and 42B can be understood as referring to the same or similar components as those which are similarly numbered and which have been previously described, unless otherwise specified.

In some embodiments, an insulating portion 60 may be provided on a side surface of a gate electrode 30, instead of an active region 55. As such, an area of a first channel region of a first semiconductor layer 15 may be reduced by an area of the side surface of the gate electrode 30, as compared to the semiconductor device 10B illustrated in FIG. 3B.

Figure 43:
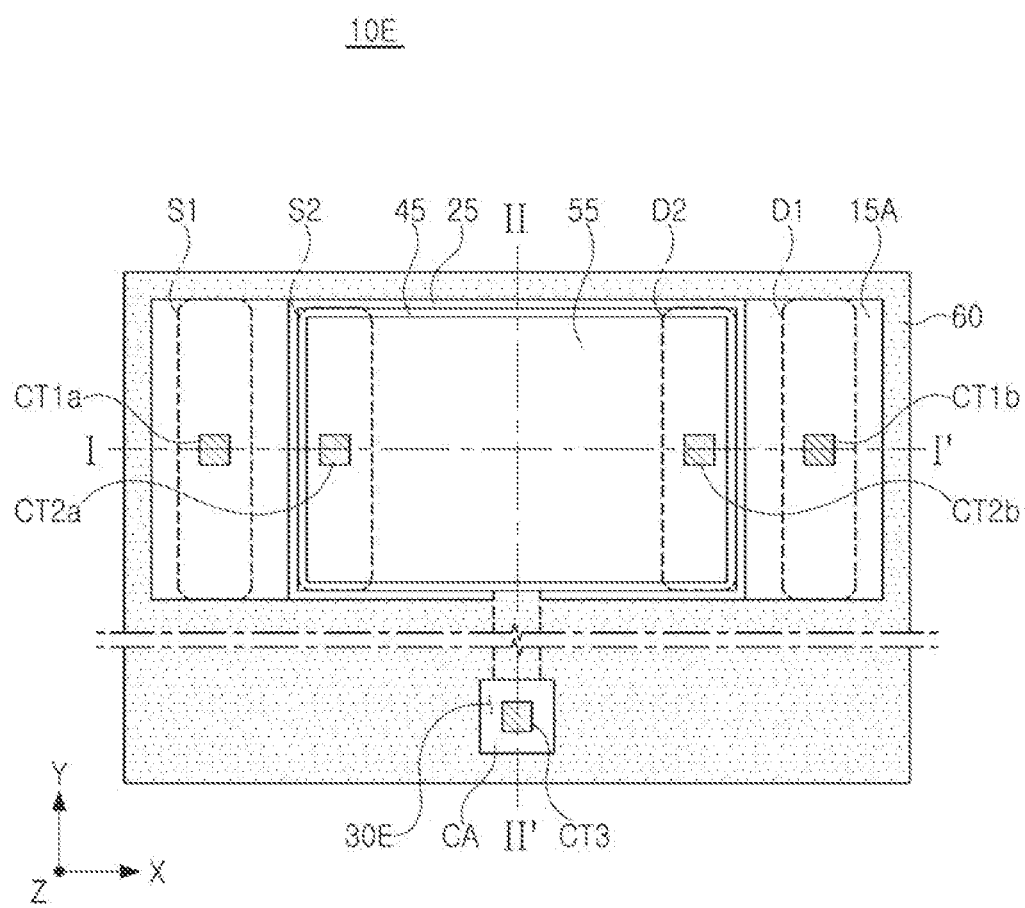
FIG. 43 is a plan view illustrating a semiconductor device according to some embodiments of the present inventive concepts.
Figure 44A:
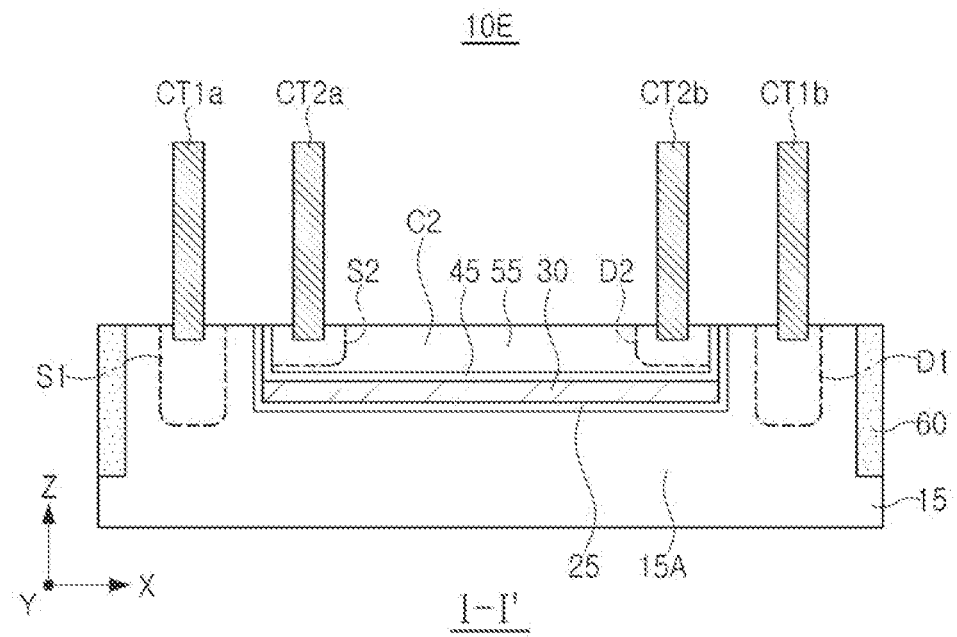
FIGS. 44A and 44B are cross-sectional side views of the semiconductor device of FIG. 43, taken along lines I'-I' and II'-II' respectively.
Figure 44B:
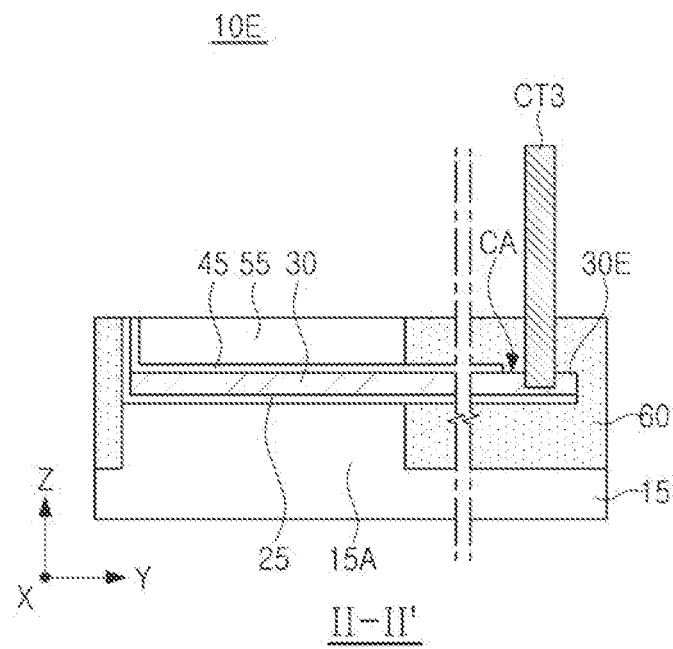

FIG. 43 is a plan view illustrating a semiconductor device according to some embodiments of the present inventive concept, and FIGS. 44A and 44B are cross-sectional side views of the semiconductor device of FIG. 43, taken along lines I'-I' and II'-II' respectively.

Referring to FIGS. 43, 44A, and 44B, a semiconductor device 10E according to some embodiments can be understood as being similar to the semiconductor device 10D illustrated in FIGS. 41, 42A and 42B, except that a channel area of a second semiconductor layer 55 is additionally adjusted by using an insulation portion 60, and the number and an arrangement of contacts are different. Components described with reference to the semiconductor device 10E illustrated in FIGS. 43, 44A, and 44B can be understood as referring to the same or similar components as those which are similarly numbered and which have been previously described, unless otherwise specified.

In some embodiments, as illustrated in FIG. 43, first and second source/drain contacts CT1a, CT1b, CT2a, and CT2b for first and second source/drain regions (S1 and D1, and S2 and D2) may be arranged one by one in a first direction (e.g., the X direction). A shared gate electrode 30 may have an extended portion 30E in a second direction (e.g., the Y direction), different from the first direction (e.g., the X direction), as illustrated in FIGS. 43 and 44B, The extended portion 30E may provide a contact region CA in which a second gate insulating film 45 is partially removed. A shared gate contact CT3 may pass through an insulating portion 60 to be connected to the extended portion 30E.

Further, in some embodiments, since first and second gate insulating films 25 and 45 and a first semiconductor layer 15 may be provided on a side surface of the second semiconductor layer 55, instead of the shared gate electrode 30, an area of a second channel region of the second semiconductor layer 55 may be reduced by an area of the side surface of the second semiconductor layer 55, as compared to the semiconductor device 10D illustrated in FIG. 42A.

Figure 45:
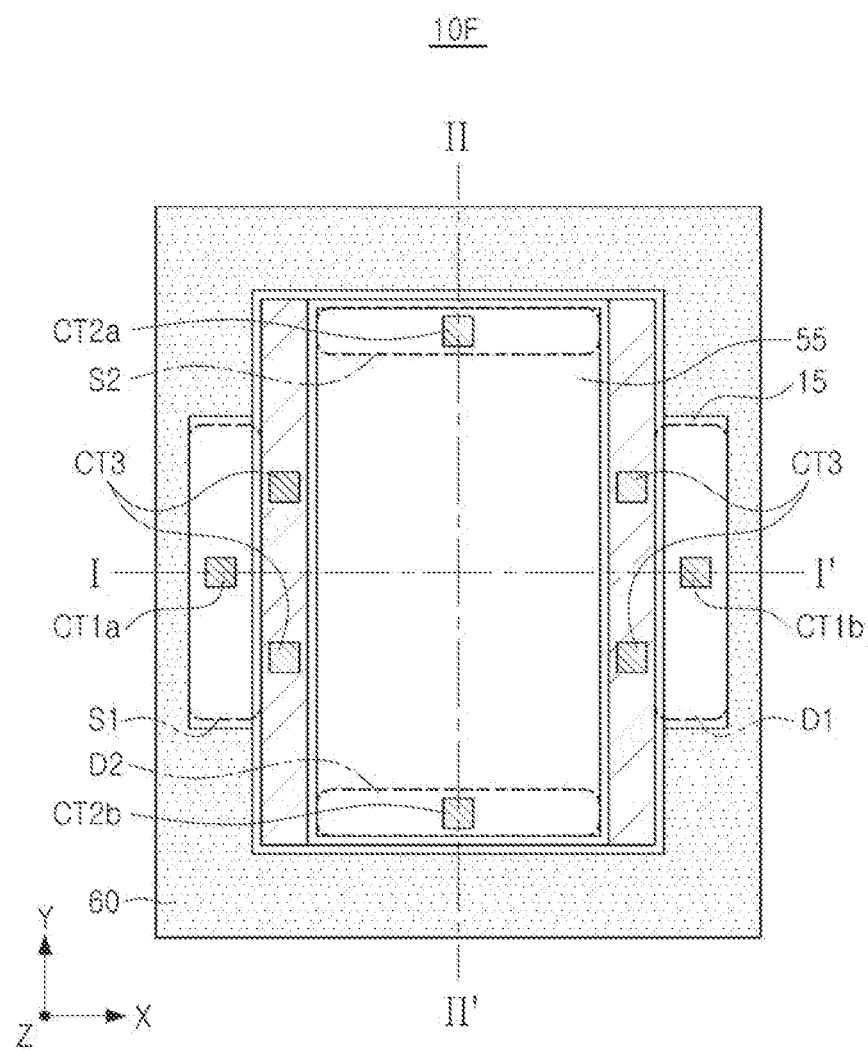
FIG. 45 is a plan view illustrating a semiconductor device according to some embodiments of the present inventive concepts.
Figure 46A:
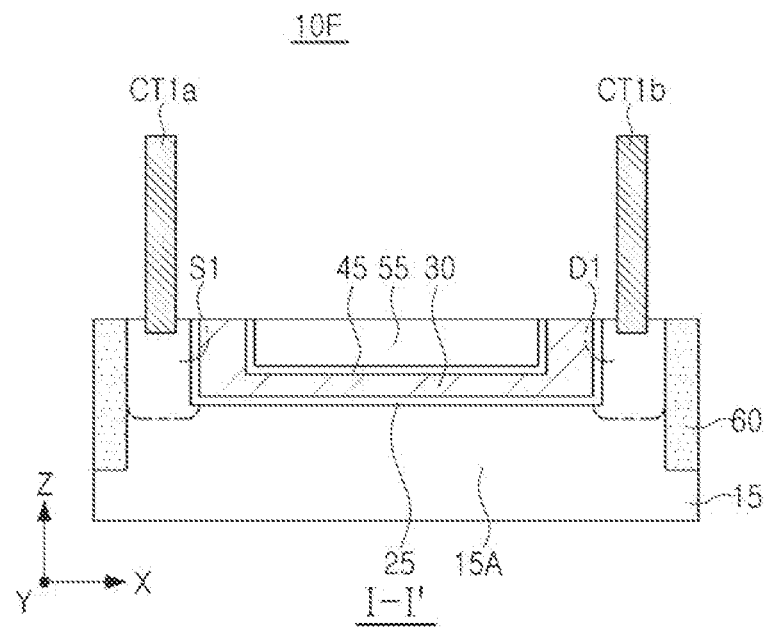
FIGS. 46A and 46B are cross-sectional side views of the semiconductor device of FIG. 45, taken along lines I'-I' and II'-II' respectively.
Figure 46B:
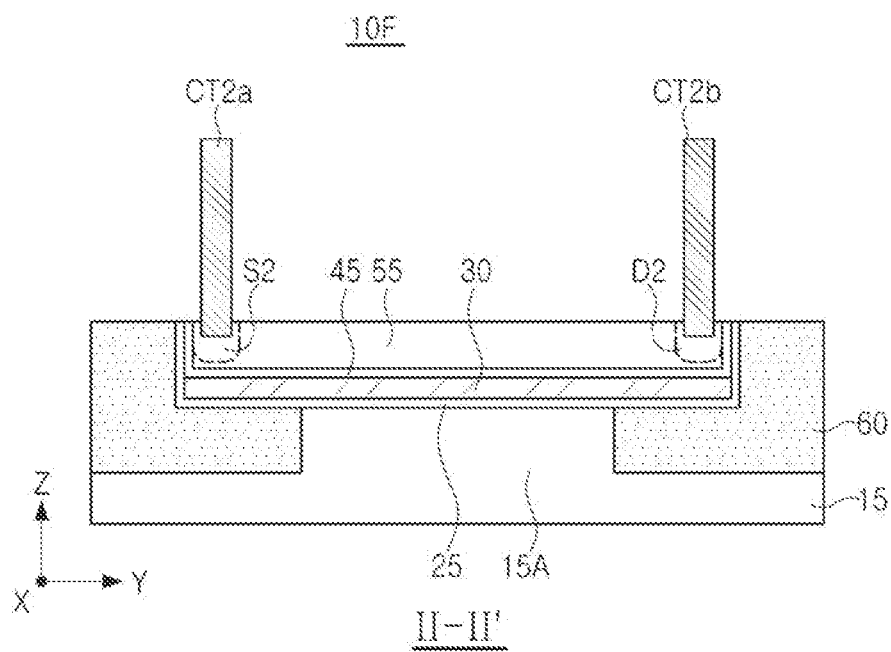

FIG. 45 is a plan view illustrating a semiconductor device according to some embodiments of the present inventive concepts, and FIGS. 46A and 46B are cross-sectional side views of the semiconductor device of FIG. 45, taken along lines I'-I' and II'-II' respectively.

Referring to FIGS. 45, 46A, and 46B, a semiconductor device 10F according to some embodiments can be understood as being similar to the semiconductor device 10C illustrated in FIGS. 4, 5A and 5B, except that channel areas of first and second semiconductor layers 15 and 55 are additionally adjusted by using an insulation portion 60, and an arrangement of the shared gate contacts CT3 is different. Components described with reference to the semiconductor device 10F illustrated in FIGS. 45, 46A, and 46B can be understood as referring to the same or similar components as those which are similarly numbered and which have been previously described, unless otherwise specified.

In some embodiments, and differing from the semiconductor device 10C illustrated in FIG. 4, the shared gate contacts CT3 may be in an exposed region of a gate electrode 30 adjacent to first source/drain contacts CT1a and CT1b.

As illustrated in FIG. 46B, an insulating portion 60 may be provided onto a side surface of a gate electrode 30 and a portion of a lower surface of the gate electrode 30, adjacent thereto, and an area of the first channel region of the semiconductor layer 15 may be further reduced by areas of the side surface and the portion of the lower surface of the gate electrode 30. Since first and second gate insulating films 25 and 45 and the insulating portion 60 are provided on a side surface of a second semiconductor layer 55, instead of the gate electrode 30, an area of a second channel region of the second semiconductor layer 55 may be reduced by an area of the side surface of a second semiconductor layer 55.

Figure 47:
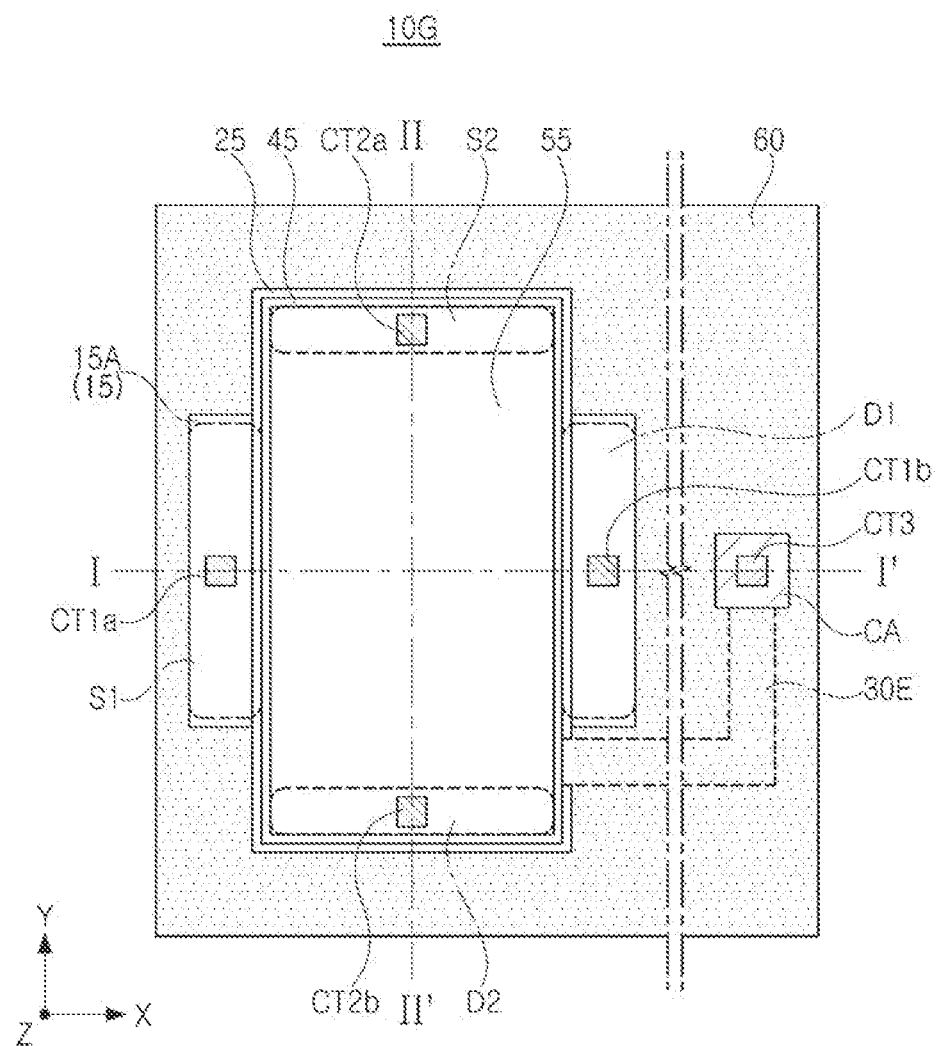
FIG. 47 is a plan view illustrating a semiconductor device according to some embodiments of the present inventive concepts.
Figure 48A:
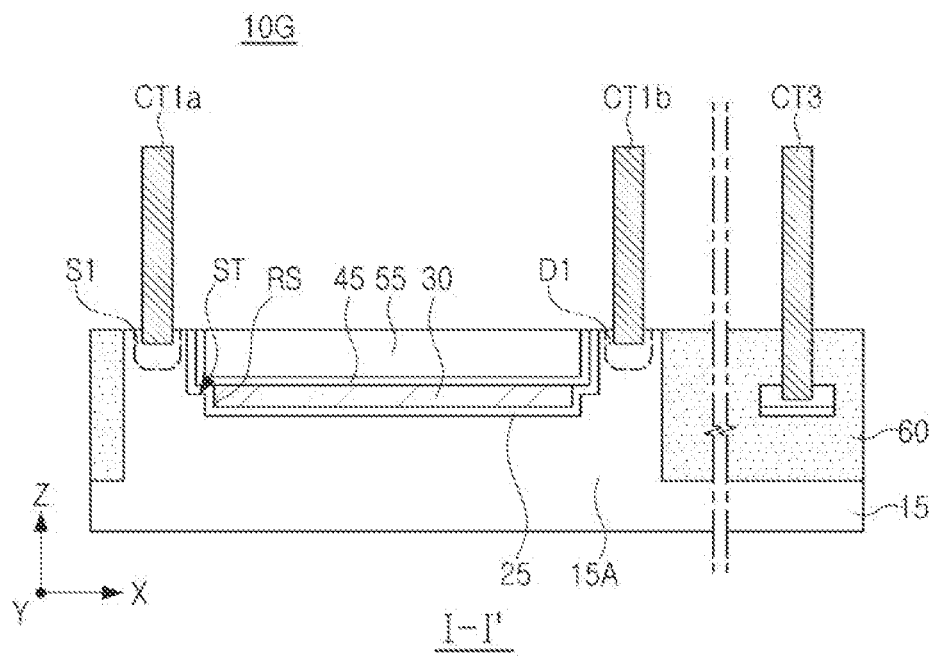
FIGS. 48A and 48B are cross-sectional side views of the semiconductor device of FIG. 47, taken along lines I'-I' and II'-II' respectively.
Figure 48B:
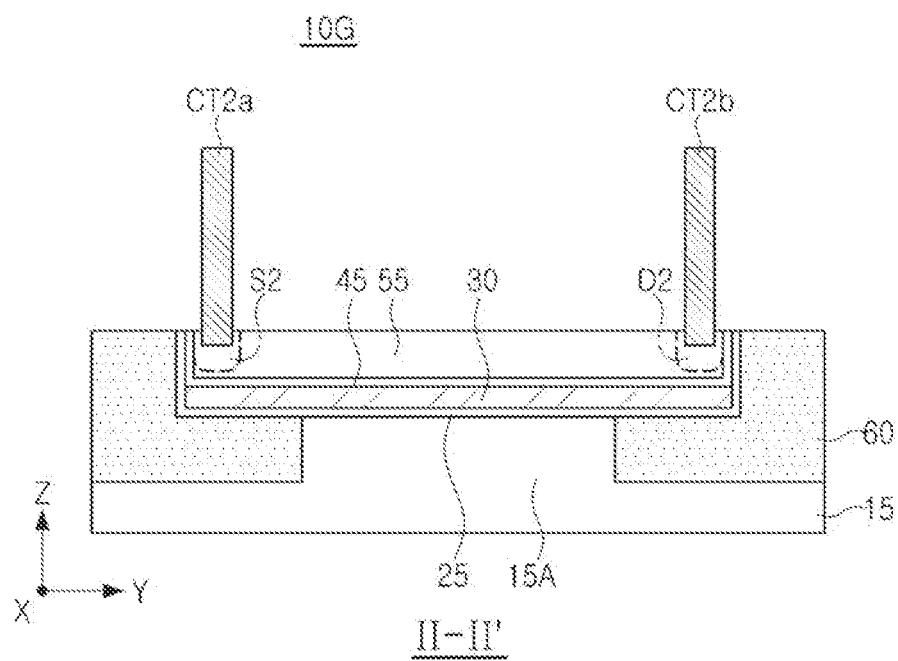

FIG. 47 is a plan view illustrating a semiconductor device according to some embodiments of the present inventive concepts, and FIGS. 48A and 48B are cross-sectional side views of the semiconductor device of FIG. 47, taken along lines I'-I' and II'-II' respectively.

A semiconductor device 10G according to some embodiments can be understood as being similar to the semiconductor device 10F illustrated in FIGS. 45, 46A, and 46B, except that a structure of a recess RS is different and the number and an arrangement of a shared gate contacts CT3 is different. Components described with reference to the semiconductor device 10G illustrated in FIGS. 47, 48A, and 48B can be understood as referring to the same or similar components as those which are similarly numbered and which have been previously described, unless otherwise specified.

In some embodiments, a shared gate electrode 30 may have an extended portion 30E having an L-shape, as illustrated in FIGS. 47 and 48B. The extended portion 30E may provide a contact region CA in which a second gate insulating film 45 is partially removed. A shared gate contact CT3 may pass through an insulating portion 60 to be connected to the extended portion 30E. In addition, a recess introduced in this embodiment may have a step difference ST, when viewed from a cross-sectional view of line I-I'.

In some embodiments, and as seen in FIGS. 47, 48A, and 48B, a form is illustrated in which upper and lower transistors are arranged one by one, but at least one of the upper and lower transistors may be configured in various forms.

Figure 49A:
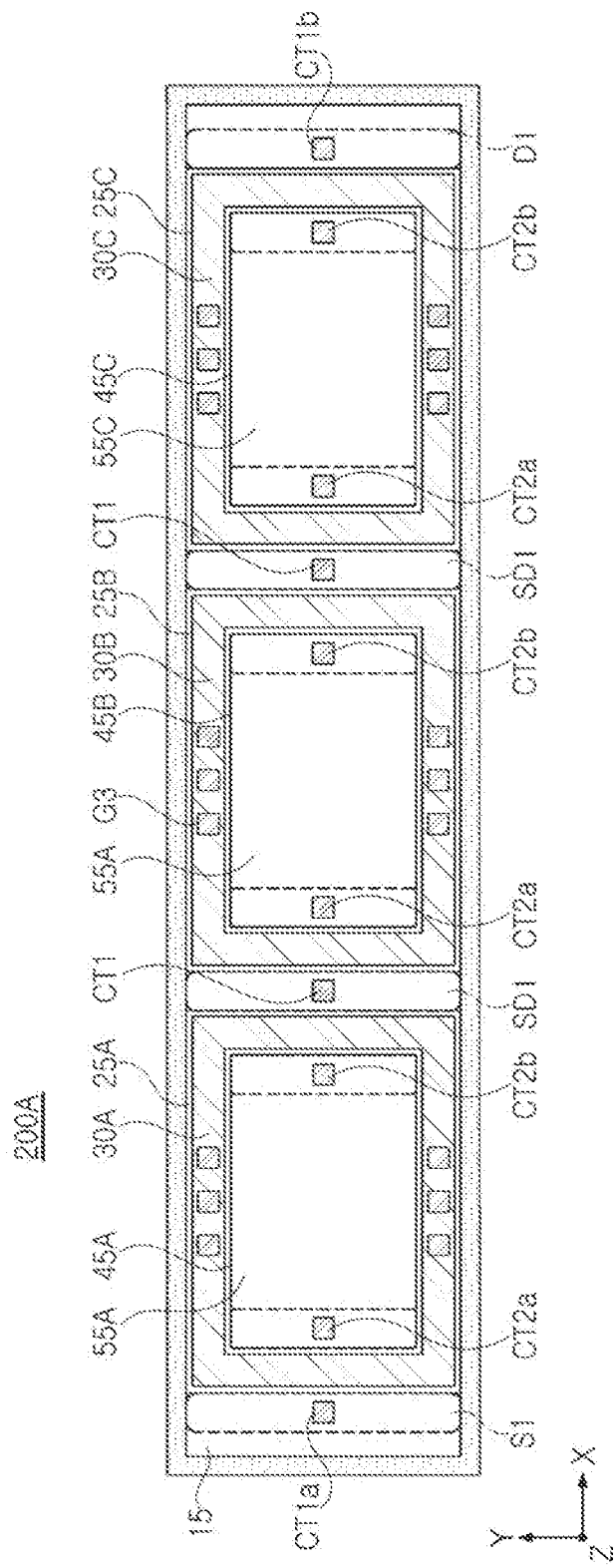
FIGS. 49A to 49D are plan views illustrating semiconductor devices according to various embodiments of the present inventive concepts.
Figure 49B:
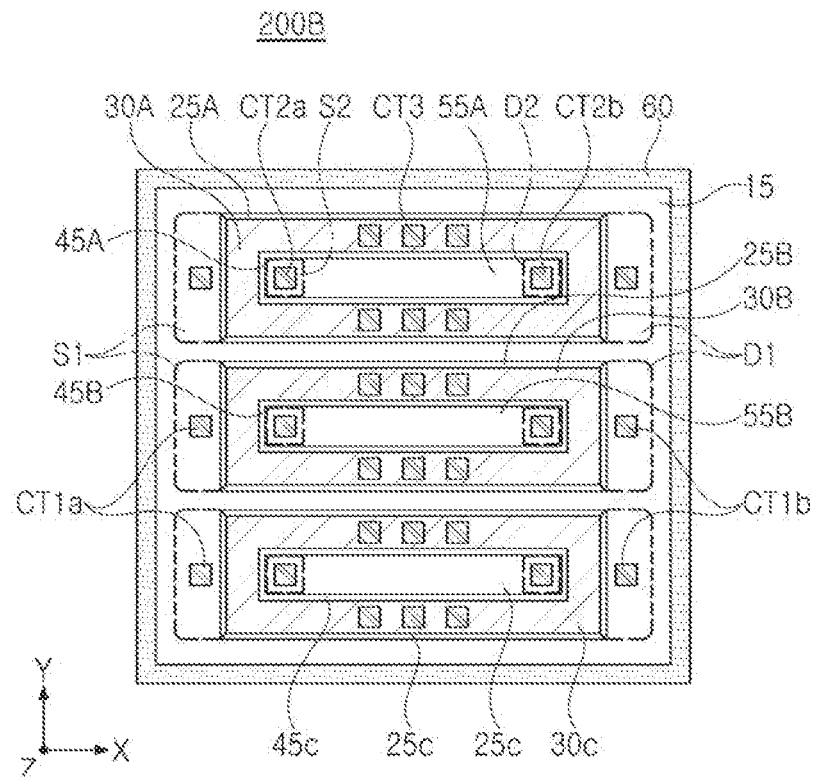
Figure 49C:
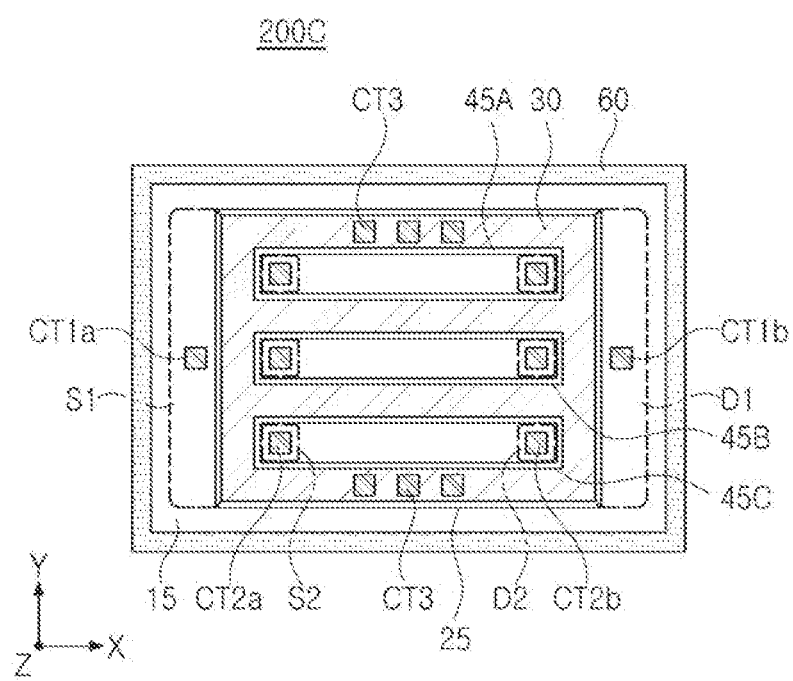
Figure 49D:
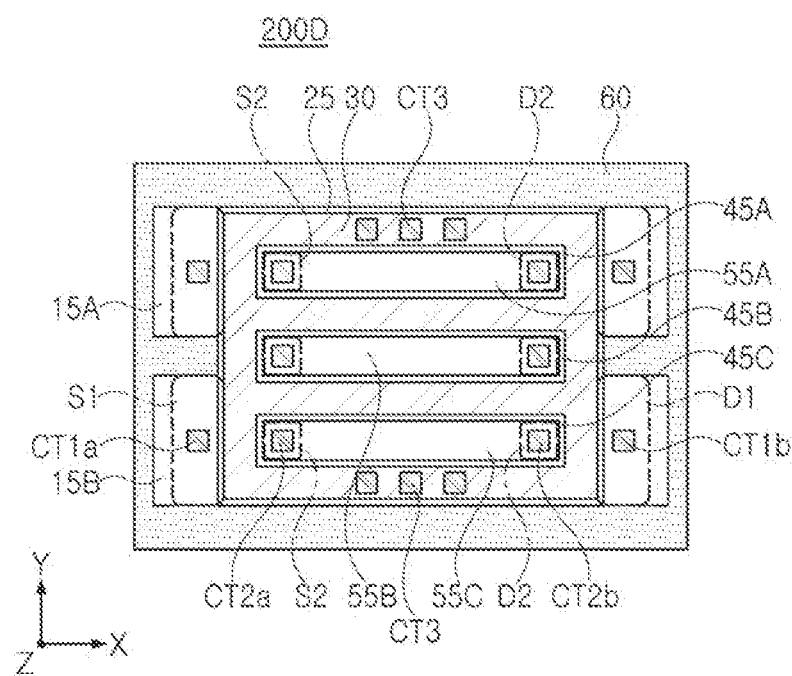
Figure 50A:
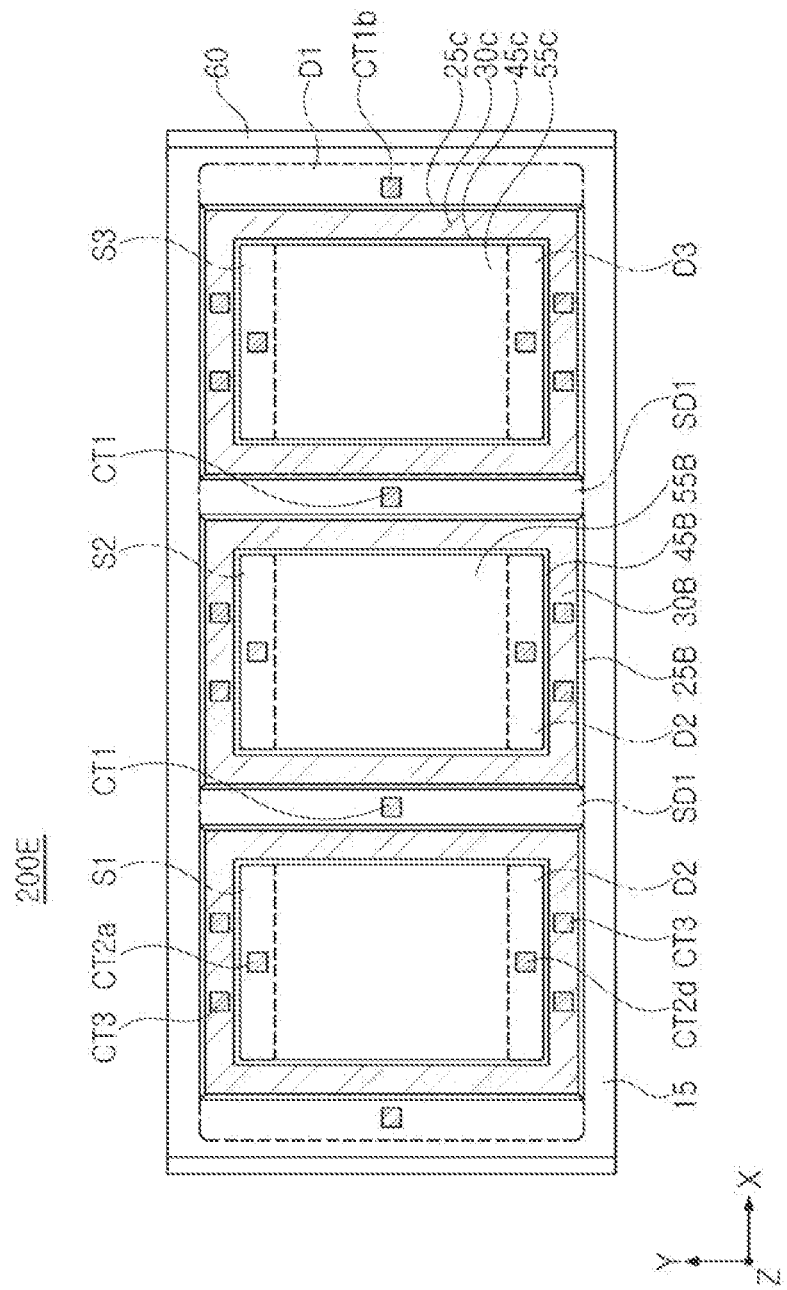
FIGS. 50A to 50C are plan views illustrating semiconductor devices according to various embodiments of the present inventive concepts.
Figure 50B:
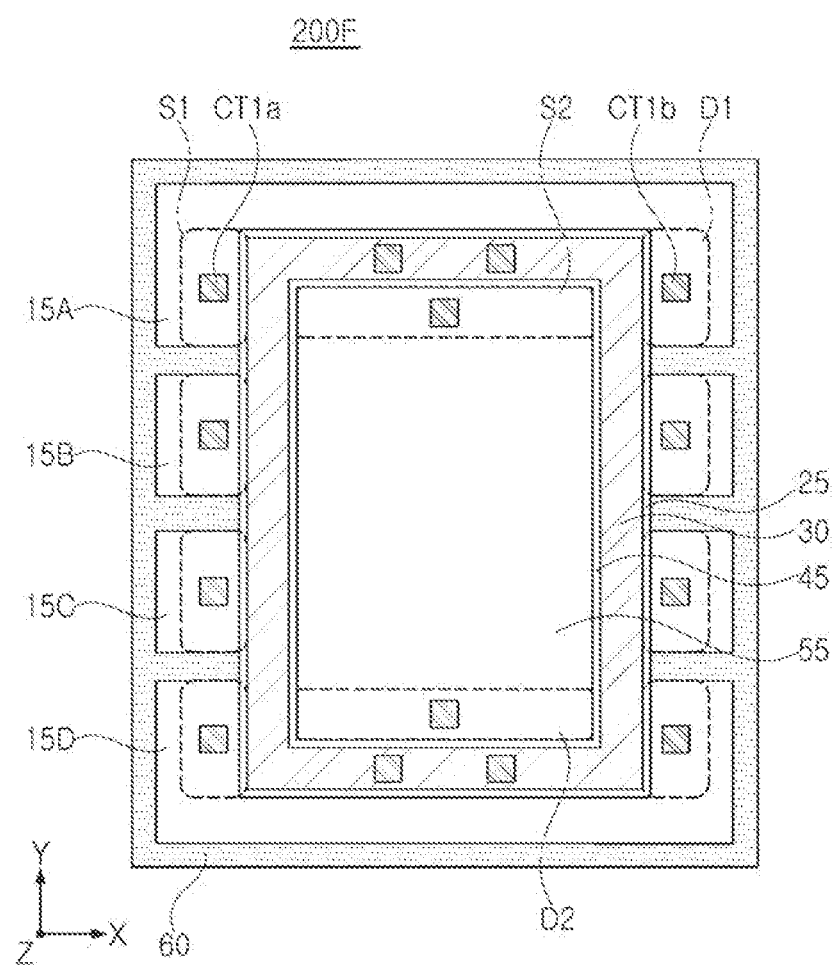
Figure 50C:
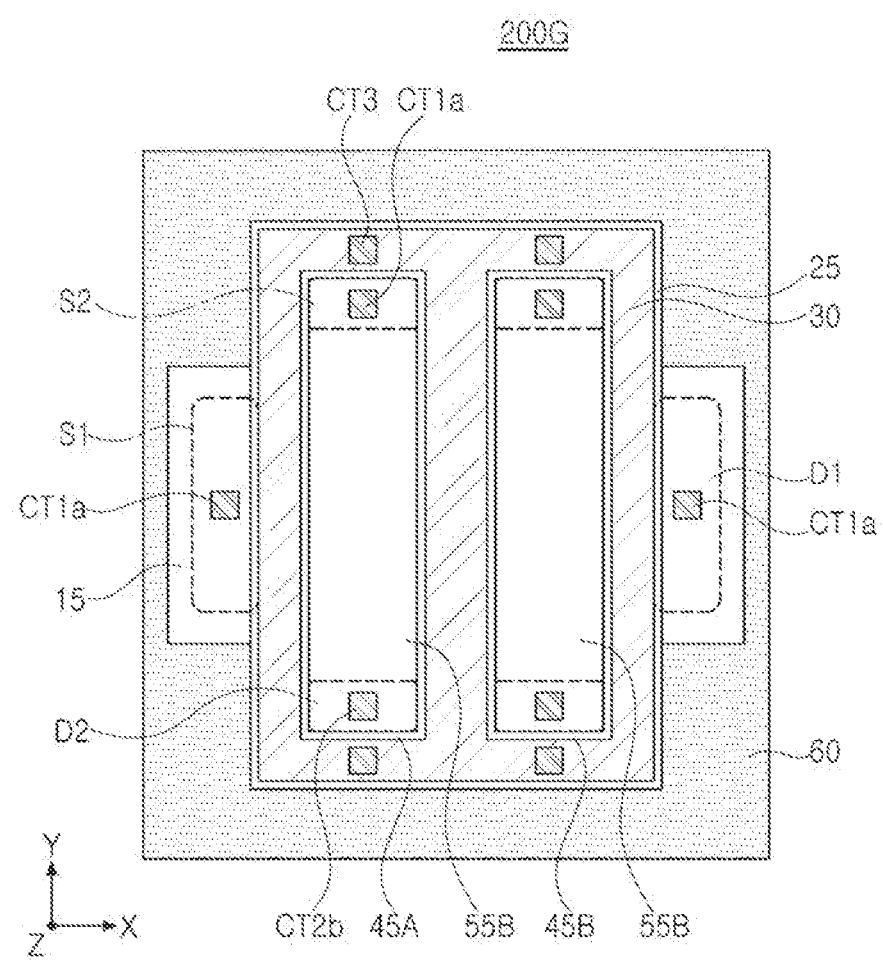

FIGS. 49A to 49D and FIGS. 50A to 50C are plan views illustrating semiconductor devices according to various embodiments of the present inventive concepts. Embodiments illustrated in FIGS. 49A to 49D illustrate cases in which current directions of the upper and lower transistors are parallel, and embodiments illustrated in FIGS. 50A to 50C illustrate cases in which current directions of the upper and lower transistors are perpendicular or almost perpendicular.

Referring to FIG. 49A, a semiconductor device 200A according to some embodiments may include three stacked cells arranged in the first direction (e.g., the X direction). Each of the three stacked cells can be understood as the semiconductor devices 10A and 10B illustrated in FIG. 1.

A semiconductor device 200A may include a first semiconductor layer 15, three gate structures (for example, three shared gate electrodes 30A, 30B, and 30C) arranged on the first semiconductor layer 15 in the first direction (e.g., the X direction), and three second semiconductor layers 55A, 55B, and 55C arranged on the three gate structures, respectively. The three gate structures may include first gate insulating films 25A, 25B, and 25C, shared gate electrodes 30A, 30B, and 30C, and second gate insulating films 45A, 45B, and 45C, respectively.

The semiconductor device 200A may include three pairs of second source/drain regions respectively arranged in the three second semiconductor layers 55A, 55B, and 55C, and a plurality of first source/drain regions arranged in the first semiconductor layer 15 in the first direction. In this case, as illustrated in FIG. 49A, a first source/drain region located between the plurality of gate structures, among the plurality of first source/drain regions, may be shared by an adjacent first channel region. For example, a first source/drain contact CT1 located between the plurality of gate structures, among a plurality of first source/drain contacts CT1a, CT1b, and CT1, may be shared by two adjacent first channel regions.

Referring to FIG. 49B, a semiconductor device 200B according to some embodiments may include three stacked cells arranged in the second direction (e.g., the Y direction). Each of the three stacked cells can be understood as the semiconductor devices 10A and 10B illustrated in FIG. 1.

The semiconductor device 200B may include a first semiconductor layer 15, three gate structures (for example, three shared gate electrodes 30A, 30B, and 30C) arranged on the first semiconductor layer 15 in the second direction (e.g., the Y direction), and three second semiconductor layers 55A, 55B, and 55C arranged on the three gate structures, respectively. The semiconductor device 200B may include three pairs of first and second source/drain regions.

Referring to FIG. 49C, a semiconductor device 200C according to some embodiments may include a first semiconductor layer 15, a shared gate electrode 30 arranged on the first semiconductor layer 15, and three second semiconductor layers 55A, 55B, and 55C arranged on the shared gate electrode 30 in the second direction (e.g., the Y direction), respectively. In some embodiments, a first gate insulating film 25 contributing to a first (lower) channel region may be provided as one (1) gate insulating film, and second gate insulating films 45A, 45B and 45C contributing to a second (upper) channel region may be provided as three (3) gate insulating films.

The semiconductor device 200C may include a first source/drain region (for example, a pair of first source/drain contacts CT1a and CT1b) arranged in the first semiconductor layer 15 in the first direction, and three pairs of second source/drain regions (for example, three pairs of second source/drain contacts CT2a and CT2b) arranged on the three second semiconductor layers 55A, 55B, and 55C, respectively.

As such, the semiconductor device 200C according to some embodiments may include a lower transistor and three upper transistors, sharing a shared gate electrode 30.

Referring to FIG. 49D, a semiconductor device 200D according to some embodiments may include two first semiconductor layers 15A and 15B arranged in the second direction (e.g., the Y direction), a shared gate electrode 30 disposed over the first semiconductor layers 15A and 15B), and three second semiconductor layers 55A, 55B, and 55C arranged on the shared gate electrode 30 in the second direction (e.g., the Y direction). In some embodiments, the first gate insulating film 25 contributing to a first (lower) channel region may be provided as one (1) gate insulating film, and the second gate insulating films 45A, 45B, and 45C contributing to a second (upper) channel region may be provided as three (3) gate insulating films.

The semiconductor device 200D may include two pairs of first source/drain regions (for example, two pairs of first source/drain contacts CT1a and CT1b) arranged in two first semiconductor layers 15A and 15B, respectively, and three pairs of second source/drain regions (for example, three pairs of second source/drain contacts CT2a and CT2b) arranged on the three second semiconductor layers 55A, 55B, and 55C, respectively.

As such, the semiconductor device 200D according to some embodiments may include two lower transistors and three upper transistors, sharing a shared gate electrode 30 in a vertical direction.

Referring to FIG. 50A, a semiconductor device 200E according to some embodiments may include three stacked cells arranged in the first direction (e.g., the X direction). Each of the three stacked cells may correspond to the semiconductor device 10C illustrated in FIG. 3.

The semiconductor device 200E may include a first semiconductor layer 15, three gate structures (for example, three shared gate electrodes 30A, 30B, and 30C) arranged on the first semiconductor layer 15 in the second direction (e.g., the Y direction), and three second semiconductor layers 55A, 55B, and 55C arranged on the three gate structures, respectively. The three gate structures may include first gate insulating films 25A, 25B, and 25C, shared gate electrodes 30A, 30B, and 30C, and second gate insulating films 45A, 45B, and 45C, respectively.

Also in some embodiments, similar to the semiconductor device illustrated in FIG. 49A, a first source/drain contact CT1 located between the plurality of gate structures, among a plurality of first source/drain contacts CT1a, CT1b, and CT1, may be shared by two adjacent first channel regions.

Referring to FIG. 50B, a semiconductor device 200F according to some embodiments may include four first semiconductor layers 15A, 15B, 15C, and 15D arranged in the second direction (e.g., the Y direction), a shared gate electrode 30 over the first semiconductor layers 15A, 15B, 15C, and 15D, and a second semiconductor layer 55 over the shared gate electrode 30. In some embodiments, a first gate insulating film 25 contributing to a first (lower) channel region may be provided as one (1) gate insulating film, and a second gate insulating film 45 contributing to a second (upper) channel region may also be provided as one (1) gate insulating film.

The semiconductor device 200F may include four pairs of first source/drain regions (e.g., four pairs of first source/drain contacts CT1*a* and CT1*b*) arranged in each of the four first semiconductor layers 15A, 15B, 15C, and 15D, and each of four pairs of first sources/drains arranged in the first direction (e.g., the X direction), and a pair of second source/drain regions (for example, a pair of second source/drain contacts CT2*a* and CT2*b*) arranged in a second semiconductor layer 55 in the second direction (e.g., the Y direction).

As such, the semiconductor device 200F according to some embodiments may include four lower transistors and one upper transistor, sharing a shared gate electrode 30.

Referring to FIG. 50C, a semiconductor device 200G according to some embodiments may include a first semiconductor layer 15, a shared gate electrode 30 on the first semiconductor layer 15, and two second semiconductor layers 55A and 55B arranged on the shared gate electrode 30 in the first direction (e.g., the X direction). In some embodiments, a first gate insulating film 25 contributing to a first (lower) channel region may be provided as one (1) gate insulating film, and second gate insulating films 45A and 45B contributing to a second (upper) channel region may be provided as two (2) gate insulating films.

The semiconductor device 200G may include a pair of first source/drain regions (for example, a pair of first source/drain contacts CT1*a* and CT1*b*) arranged on the first semiconductor layer 15 in the first direction (e.g., the X direction), and two pairs of second source/drain regions (for example, two pairs of second source/drain contacts CT2*a* and CT2*b*) arranged in second semiconductor layers 55A and 55B in the second direction (e.g., the Y direction).

As such, the semiconductor device 200G according to this embodiment may include one lower transistor and two upper transistors, sharing one shared gate electrode 30.

Hereinafter, various examples of implementing a circuit structure using semiconductor devices according to the present inventive concepts will be described.

Figure 51A:
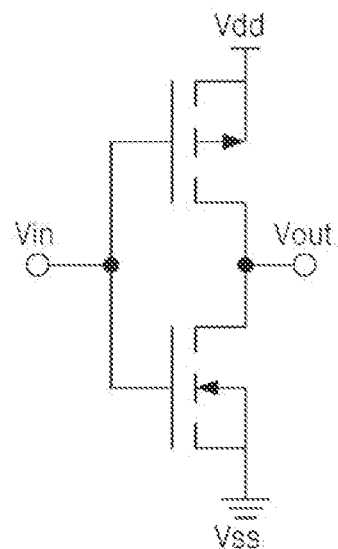
FIG. 51A illustrates a CMOS inverter circuit.
Figure 51B:
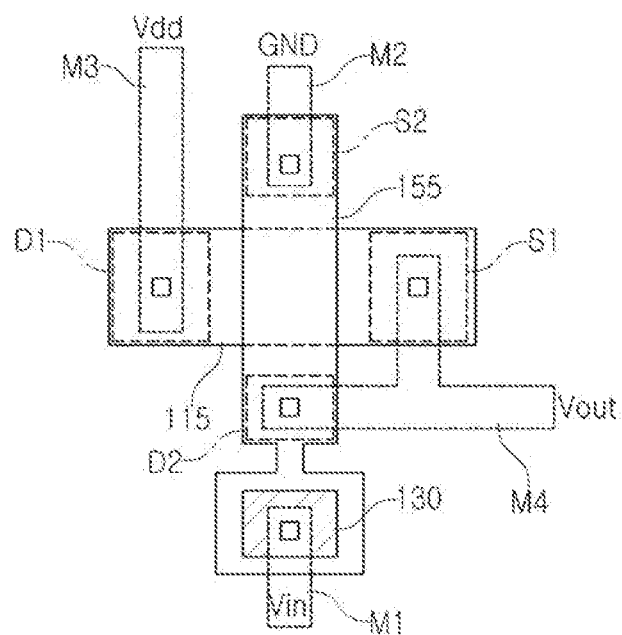
FIGS. 51B and 51C are layouts of semiconductor devices implementing the circuit of FIG. 51A, respectively.
Figure 51C:
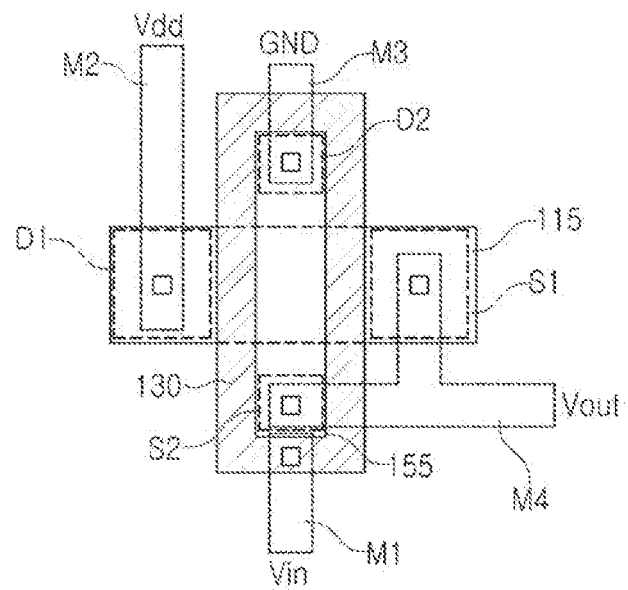

FIG. 51A illustrates a CMOS inverter circuit, and FIGS. 51B and 51C are layouts of semiconductor devices implementing the circuit of FIG. 51A, respectively.

First, referring to FIG. 51B, a semiconductor device according to some embodiments may include (as examples) the semiconductor device illustrated in FIG. 9 or 11, wherein the semiconductor device may include a first transistor and a second transistor sharing a shared gate electrode 130. The first (lower) transistor may include an active region 115 that extends in the first direction, a first gate insulating film (125 in FIGS. 9 and 11), and the shared gate electrode 130, and the second (upper) transistor may include a cover semiconductor layer 155 that extends in the second direction, a second gate insulating film (135 in FIGS. 9 and 11), and the shared gate electrode 130.

As illustrated in FIG. 51B, the first and second transistors may be connected by first to fourth metal wires M1, M2, M3, and M4 to configure the inverter circuit of FIG. 51A. The first metal wire M1 may connect the shared gate electrode 130 of the first and second transistors with an input terminal Vin, the third metal wire M3 may connect a drain D1 of the first transistor and Vdd, and the second metal wire M2 may connect a source S2 of the second transistor and GND. In addition, the fourth metal wire M4 may connect both a source S1 of the first transistor and a drain D2 of the second transistor to an output terminal Vout.

Referring to FIG. 51C, a semiconductor device according to some embodiments may include (as examples) the semiconductor device illustrated in FIG. 13 or 15, wherein the semiconductor device may include a first transistor and a second transistor sharing a shared gate electrode 130. The first (lower) transistor may include an active region 115 extending in the first direction, a first gate insulating film (125 in FIGS. 13 and 15), and the shared gate electrode 130, and the second (upper) transistor may include a cover semiconductor layer 155 extending in the second direction, a second gate insulating film (135 in FIGS. 13 and 15), and the shared gate electrode 130. As illustrated in FIG. 51C, the first and second transistors may be connected by first to fourth metal wires M1, M2, M3, and M4, to configure the inverter circuit of FIG. 51A.

Figure 52A:
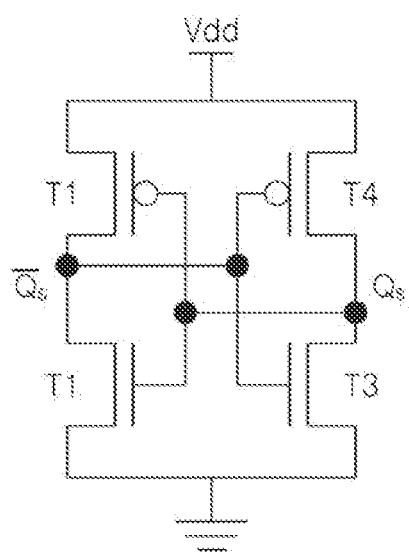
FIG. 52A illustrates a CMOS latch circuit.
Figure 52B:
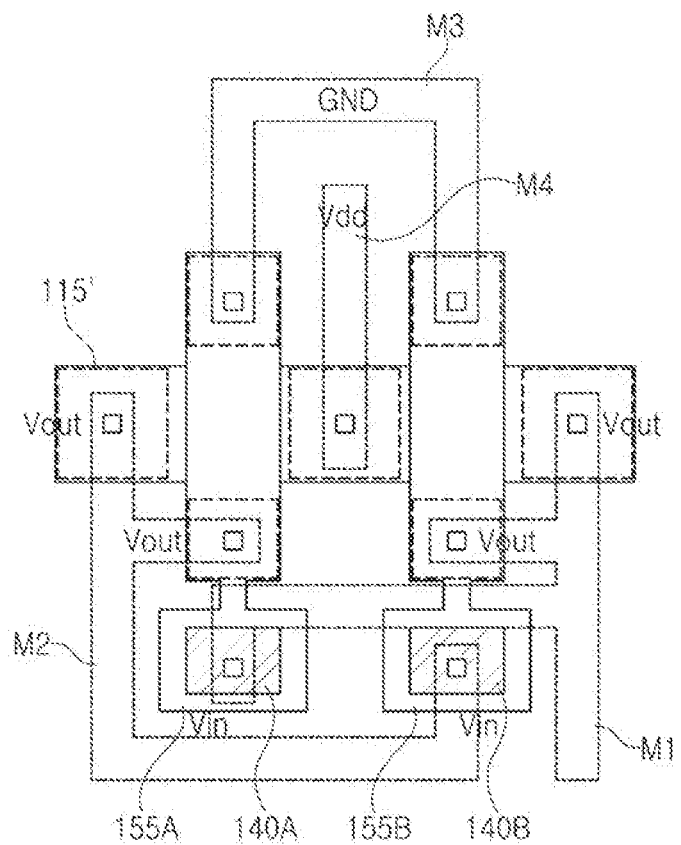
FIGS. 52B and 52C are layouts of semiconductor devices implementing the circuit of FIG. 52A, respectively.
Figure 52C:
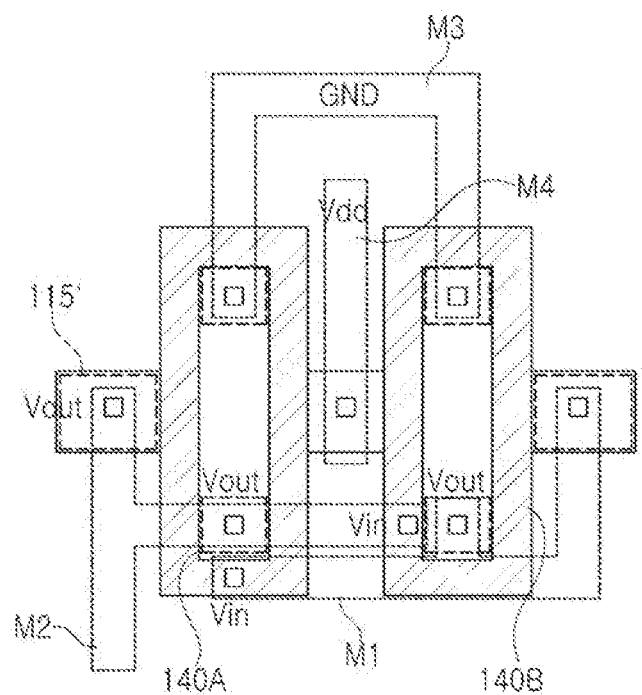

FIG. 52A illustrates a CMOS latch circuit, and FIGS. 52B and 52C are layouts of semiconductor devices implementing the circuit of FIG. 52A, respectively.

FIGS. 53A, 53B, 54A, and 54B are perspective views illustrating various 3D semiconductor devices according to some embodiments of the present inventive concepts.

Figure 53A:
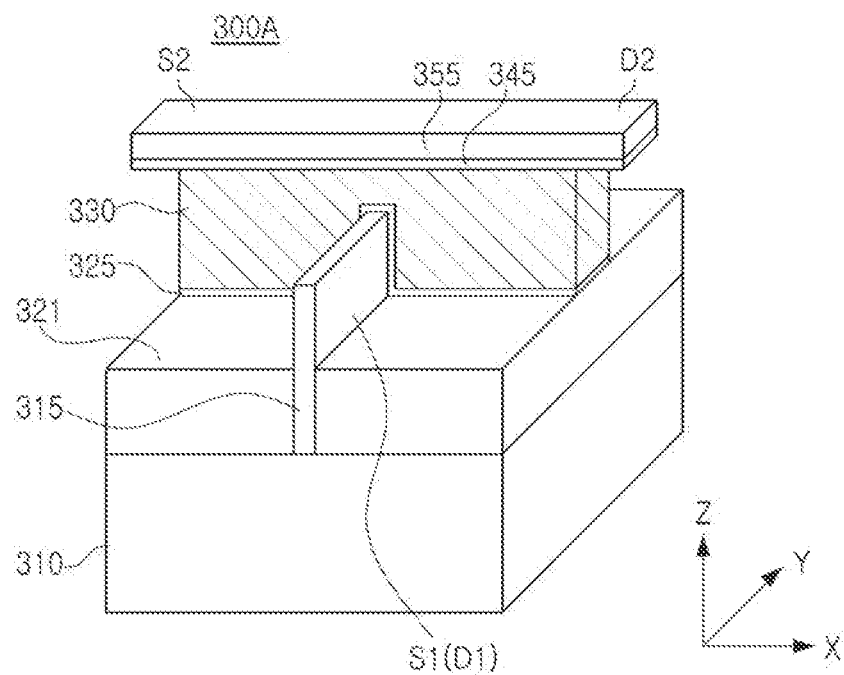
FIGS. 53A, 53B, 54A, and 54B are perspective views illustrating various 3D semiconductor devices according to some embodiments of the present inventive concepts.

Referring to FIG. 53A, a semiconductor device 300A according to some embodiments may include a substrate 310 having an active fin 315 extending in a first direction (e.g., the X direction), a gate structure having a first gate insulating film 325 and a shared gate electrode 330, intersecting the active fin 315, extending in a second direction (e.g., the Y direction), and sequentially arranged on a portion of the active fin 315, and a first source/drain region (S1 and D1) located on the active fin 315 on first and second sides of the gate structure (325 and 330). The active fin 315 may be defined by a device isolation film 321.

In addition, the semiconductor device 300A may include a second gate insulating film 345 having a region overlapping the gate structure and is on the shared gate electrode 330, a cover semiconductor layer 355 that is on the second gate insulating film 345, and a second source/drain region (S2 and D2) on first and second sides of the cover semiconductor layer 355. The second gate insulating film 345 and the cover semiconductor layer 355 may extend in the first direction (e.g., the X direction). For example, the first source/drain region (S1 and D1) and the second source/drain region (S2 and D2) may be arranged in directions that are perpendicular or almost perpendicular to each other.

In some embodiments, a first channel region formed in the active fin 315 may have a three-dimensional channel structure, and the second channel region formed in the cover insulating layer 355 may have a planar channel structure.

Figure 53B:
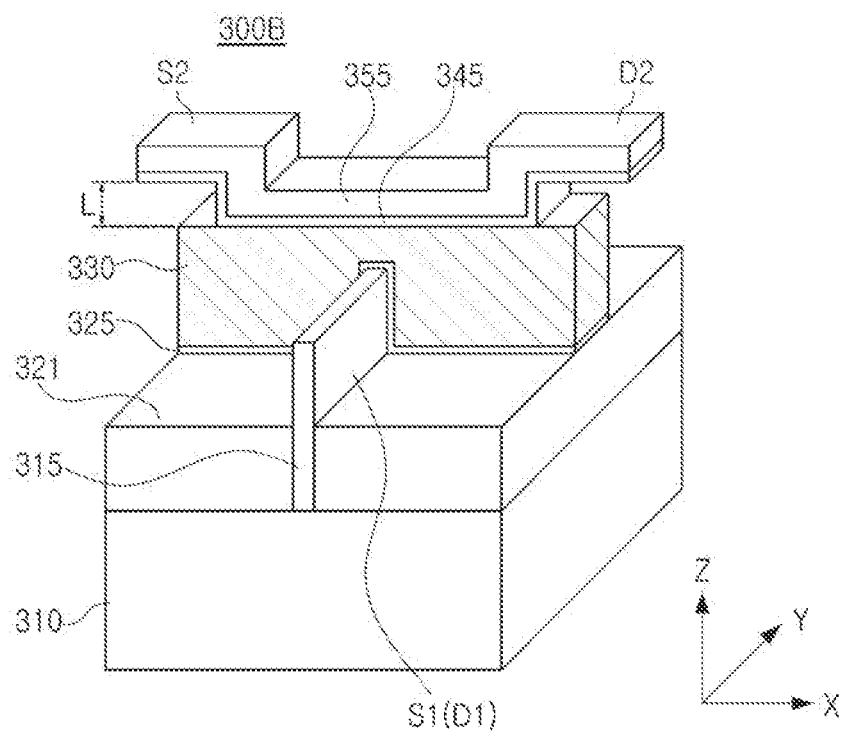

Referring to FIG. 53B, a semiconductor device 300B according to some embodiments can be understood as being similar to the semiconductor device 300A illustrated in FIG. 53A, except that a portion of a cover semiconductor layer 355 and a shared gate electrode 330 may be spaced apart in a vertical direction or third direction (e.g., the Z direction). Components described with reference to the semiconductor device 300B illustrated in FIG. 53B can be understood as referring to the same or similar components as those which are similarly numbered and which have been previously described, unless otherwise specified.

In a semiconductor device 300B according to some embodiments, a second source/drain region (S2 and D2) of a cover semiconductor layer 355 and a shared gate electrode 330 may be spaced apart in the vertical direction (e.g., the Z direction). The second source/drain region (S2 and D2) may be located on a higher level than a second channel region by a space L. The space L may be filled by an interlayer insulating portion (not illustrated).

Figure 54A:
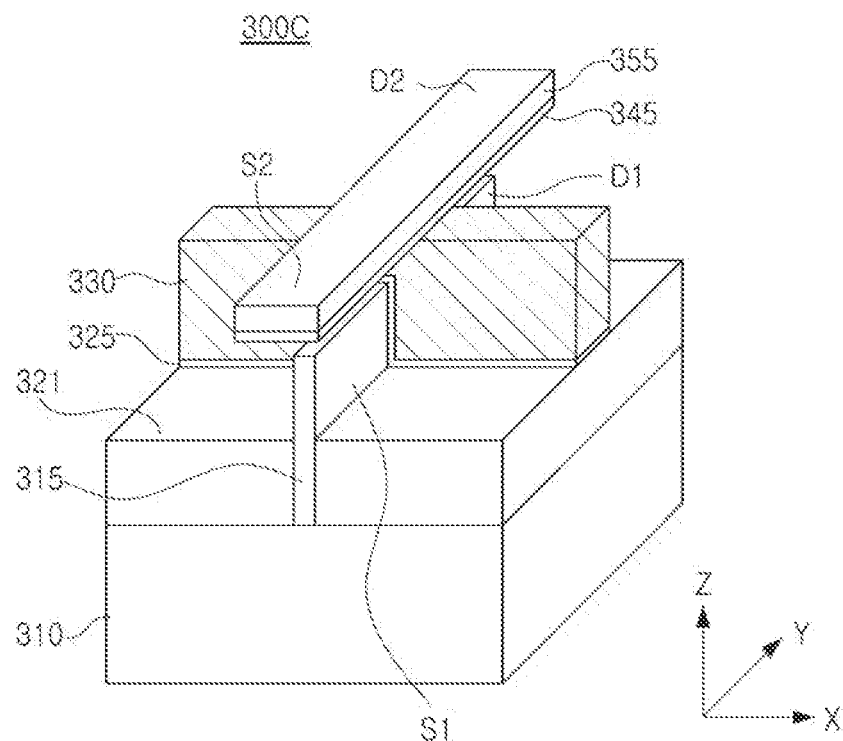

Referring to FIG. 54A, a semiconductor device 300C according to some embodiments can be understood as being similar to the semiconductor device 300A illustrated in FIG. 53A, except that a direction in which a cover semiconductor layer 355 extends is different. Components described with reference to the semiconductor device 300C illustrated in FIG. 54A can be understood as referring to the same or similar components as those which are similarly numbered and which have been previously described, unless otherwise specified.

In some embodiments, a second gate insulating film 345 and a cover semiconductor layer 355 may extend in the second direction (e.g., the Y direction). For example, a first source/drain region (S1 and D1) and a second source/drain region (S2 and D2) may be arranged in the same direction (e.g., the X direction).

Figure 54B:
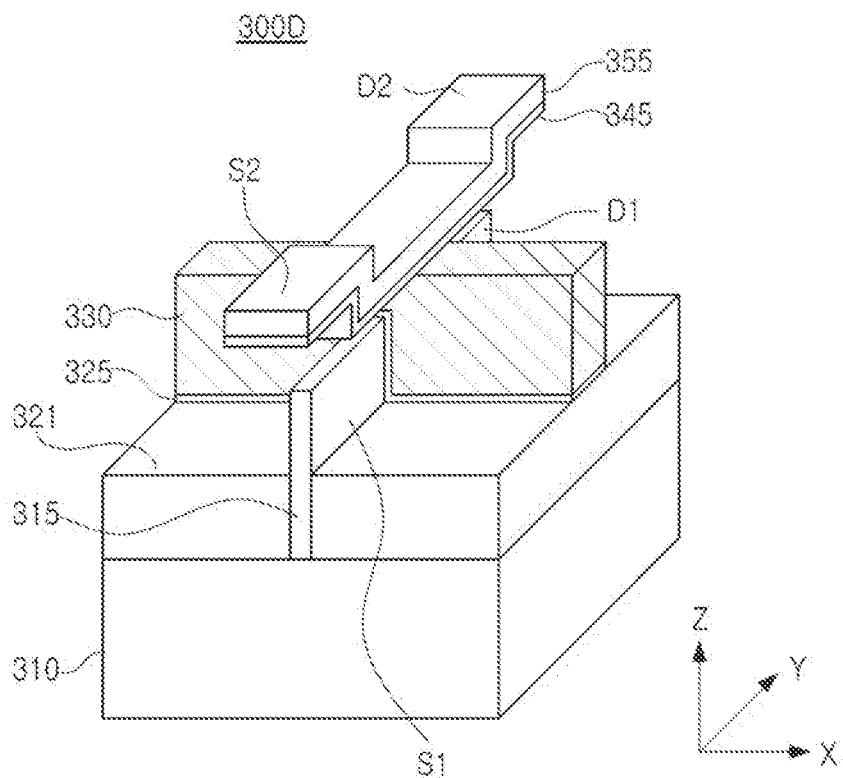

Referring to FIG. 54B, a semiconductor device 300D according to some embodiments can be understood as being similar to the semiconductor device 300C illustrated in FIG. 52C, except that a portion of a cover semiconductor layer 355 and a shared gate electrode 330 may be spaced apart in the vertical direction (e.g., the Z direction). Components described with reference to the semiconductor device 300D illustrated in FIG. 54B can be understood as referring to the same or similar components as those which are similarly numbered and which have been previously described, unless otherwise specified.

In a semiconductor device 300D according to some embodiments, a second source/drain region (S2 and D2) of a cover semiconductor layer 355 and a shared gate electrode 330 may be spaced apart in the vertical or third direction (e.g., the Z direction). The second source/drain region (S2 and D2) may be located on a higher level than a second channel region by a space. The space may be filled by an interlayer insulating portion (not illustrated).

According to some embodiments of the present inventive concepts, a size of a semiconductor device may be reduced by employing a plurality of transistors (e.g., a lower transistor and an upper transistor) stacked in a vertical direction and sharing a gate electrode.

Various advantages and effects of the present inventive concepts are not limited those explicitly described herein, and may be more easily understood in the course of describing specific embodiments of the present inventive concepts.

While some examples of embodiments have been illustrated and described herein, it will be apparent to those skilled in the art that modifications and variations could be made without departing from the scope of the present inventive concepts as defined by the appended claims.

What is claimed is:

1. A semiconductor device comprising:
a substrate having an active region defined by a device isolation film, the active region providing a first channel region;
a first source/drain region in the active region on first and second sides of the first channel region;
a gate structure having a first gate insulating film, a shared gate electrode, and a second gate insulating film sequentially arranged on the active region, the shared gate electrode having an extended portion on the device isolation film;
a cover semiconductor layer on the second gate insulating film and electrically separated from the active region to provide a second channel region;
a second source/drain region in the cover semiconductor layer on first and second sides of the second channel region;
first and second source/drain contacts respectively connected to the first and second source/drain regions; and
a shared gate contact connected to the extended portion of the shared gate electrode.

2. The semiconductor device according to claim 1, wherein the cover semiconductor layer has an opening that overlaps the extended portion of the shared gate electrode in a direction that is perpendicular to an upper surface of the substrate, and wherein the shared gate contact is connected to the extended portion of the shared gate electrode through the opening.

3. The semiconductor device according to claim 1, wherein the extended portion of the shared gate electrode is positioned in a region that is free from overlap by the cover semiconductor layer in a direction that is perpendicular to an upper surface of the substrate.

4. The semiconductor device according to claim 1, wherein the cover semiconductor layer has a neck portion having a width that is narrower than a width of a remaining portion of the cover semiconductor layer.

5. The semiconductor device according to claim 1, wherein the first source/drain region is on the first and second sides of the first channel region in a first direction, and the second source/drain region is in on the first and second sides of the second channel region in a second direction that is perpendicular to the first direction.

6. The semiconductor device according to claim 5, wherein the shared gate electrode has the extended portion in the second direction.

7. The semiconductor device according to claim 6, further comprising an interlayer insulating portion between the cover semiconductor layer and the extended portion of the shared gate electrode.

8. The semiconductor device according to claim 7, wherein the second source/drain region is located farther from an upper surface of the substrate than the second channel region is from the upper surface of the substrate.

9. The semiconductor device according to claim 7, wherein the second gate insulating film extends over the interlayer insulating portion.

10. The semiconductor device according to claim 1, wherein at least a portion of the second channel region overlaps the first channel region in a direction that is perpendicular to an upper surface of the substrate.

11. The semiconductor device according to claim 1, wherein an upper surface of the active region has a recess, and wherein the first gate insulating film and the shared gate electrode are arranged in the recess.

12. The semiconductor device according to claim 11, wherein the second gate insulating film and the cover semiconductor layer are arranged in the recess.

13. The semiconductor device according to claim 1, wherein an upper surface of the active region has a substantially flat upper surface, and wherein the first gate insulating film is on the flat upper surface of the active region.

14. The semiconductor device according to claim 1, wherein at least one of the first and second source/drain contacts and the shared gate contact comprises a plurality of contacts.

15. A semiconductor device comprising:
a first semiconductor layer having a first channel region;
a first source/drain region in the first semiconductor layer on first and second sides of the first channel region;
a gate structure including a first gate insulating film, a shared gate electrode, and a second gate insulating film sequentially arranged on the first channel region, the shared gate electrode having an extended portion in a region that is free from overlap by a cover semiconductor layer in a direction that is perpendicular to an upper surface of the first semiconductor layer;
a second semiconductor layer on the second gate insulating film and electrically separated from the first semiconductor layer to provide a second channel region;
a second source/drain region in the second semiconductor layer on first and second sides of the second channel region;
first and second source/drain contacts respectively connected to the first and second source/drain regions; and
a shared gate contact connected to the extended portion of the shared gate electrode.

16. The semiconductor device according to claim 15, wherein an arrangement direction of the second source/drain region is perpendicular with an arrangement direction of the first source/drain region.

17. The semiconductor device according to claim 15, wherein the first channel region and the second channel region have regions doped with different conductivity-type impurities.

18. The semiconductor device according to claim 15, wherein an area of the first channel region is different from an area of the second channel region.

19. The semiconductor device according to claim 15, wherein a thickness of the first gate insulating film is different from a thickness of the second gate insulating film.

20. A semiconductor device comprising:
a substrate having an active region defined by a device isolation film, the active region providing a first channel region;
a first source/drain region in the active region on first and second sides of the first channel region in a first direction;
a gate structure having a first gate insulating film, a shared gate electrode, and a second gate insulating film sequentially arranged on the active region, the shared gate electrode having an extended portion on the device isolation film;
a cover semiconductor layer on the second gate insulating film and electrically separated from the active region to provide a second channel region, the cover semiconductor layer comprising a neck portion having a width that is narrower than a width of a remaining portion of the cover semiconductor layer;
a second source/drain region in the cover semiconductor layer on first and second sides of the second channel region in a second direction that is perpendicular to the first direction;
first and second source/drain contacts respectively connected to the first and second source/drain regions; and
a shared gate contact connected to the extended portion of the shared gate electrode.

* * * * *